United States Patent
Huang et al.

(10) Patent No.: US 10,748,935 B2
(45) Date of Patent: Aug. 18, 2020

(54) STACKED VERTICALLY ISOLATED MOSFET STRUCTURE AND METHOD OF FORMING THE SAME

(71) Applicants: Taiwan Semiconductor Manufacturing Company, Ltd., Hsinchu (TW); National Taiwan University, Taipei (TW)

(72) Inventors: Yu-Shiang Huang, New Taipei (TW); Hung-Yu Yeh, Taichung (TW); Wen Hung Huang, Tainan (TW); Chee-Wee Liu, Taipei (TW)

(73) Assignees: Taiwan Semiconductor Manufacturing Company, Ltd., Hsinchu (TW); National Taiwan University, Taipei (TW)

( * ) Notice: Subject to any disclaimer, the term of this patent is extended or adjusted under 35 U.S.C. 154(b) by 19 days.

(21) Appl. No.: 16/152,010

(22) Filed: Oct. 4, 2018

(65) Prior Publication Data
US 2020/0006389 A1     Jan. 2, 2020

Related U.S. Application Data

(60) Provisional application No. 62/692,062, filed on Jun. 29, 2018.

(51) Int. Cl.
*H01L 27/12*     (2006.01)
*H01L 27/088*    (2006.01)
(Continued)

(52) U.S. Cl.
CPC .. *H01L 27/1207* (2013.01); *H01L 21/823412* (2013.01); *H01L 21/823418* (2013.01);
(Continued)

(58) Field of Classification Search
None
See application file for complete search history.

(56) References Cited

U.S. PATENT DOCUMENTS 8,350,298 B2    1/2013  Xiao et al.
10,170,484 B1 * 1/2019  Sung ................... H01L 29/1033
(Continued)

*Primary Examiner* — Robert K Carpenter
(74) *Attorney, Agent, or Firm* — Slater Matsil, LLP

(57) ABSTRACT

A MOSFET structure including stacked vertically isolated MOSFETs and a method for forming the same are disclosed. In an embodiment, the method may include depositing a first buffer layer over a substrate; depositing a first channel layer over the first buffer layer; depositing a second buffer layer over the first channel layer; depositing a second channel layer over the second buffer layer; depositing a third buffer layer over the second channel layer; etching the first buffer layer, the first channel layer, the second buffer layer, the second channel layer, and the third buffer layer to form a fin structure; etching the first buffer layer, the second buffer layer, and the third buffer layer to form a first plurality of openings; forming a first gate stack in the first opening disposed in the first buffer layer, a second gate stack in the first opening disposed in the second buffer layer, and a third gate stack in the first opening disposed in the third buffer layer; and replacing the second buffer layer and a portion of the second gate stack with an isolation structure.

20 Claims, 56 Drawing Sheets

(51) Int. Cl.
     *H01L 29/423*     (2006.01)
     *H01L 21/8234*    (2006.01)
     *H01L 29/66*      (2006.01)

(52) U.S. Cl.
     CPC ............ *H01L 21/823437* (2013.01); *H01L 21/823481* (2013.01); *H01L 27/088* (2013.01); *H01L 29/42392* (2013.01); *H01L 29/6656* (2013.01)

(56) References Cited

U.S. PATENT DOCUMENTS

| | | | |
|---|---|---|---|
| 10,510,622 B1 * | 12/2019 | Frougier | H01L 21/823864 |
| 10,553,495 B2 * | 2/2020 | Cheng | H01L 21/823814 |
| 2018/0175167 A1 * | 6/2018 | Reboh | H01L 29/7853 |

* cited by examiner

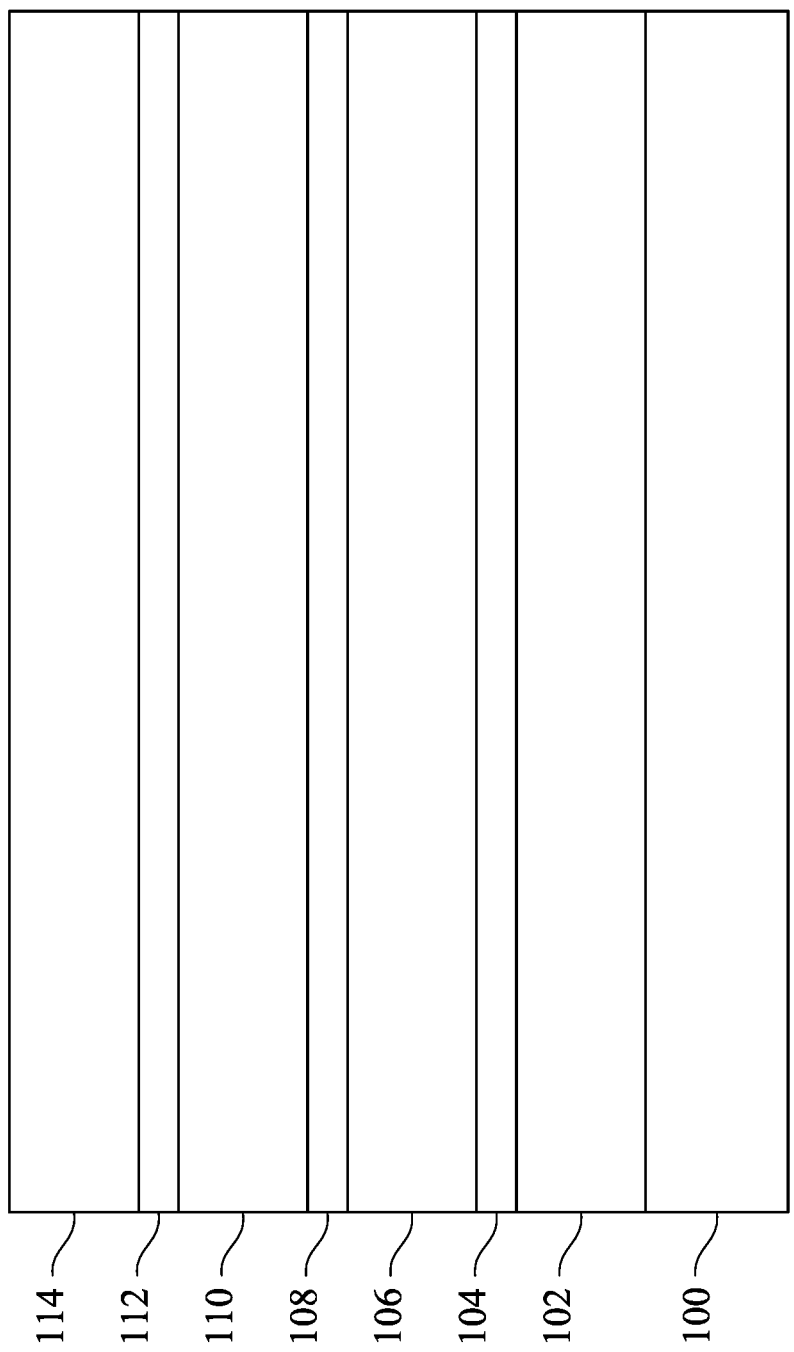

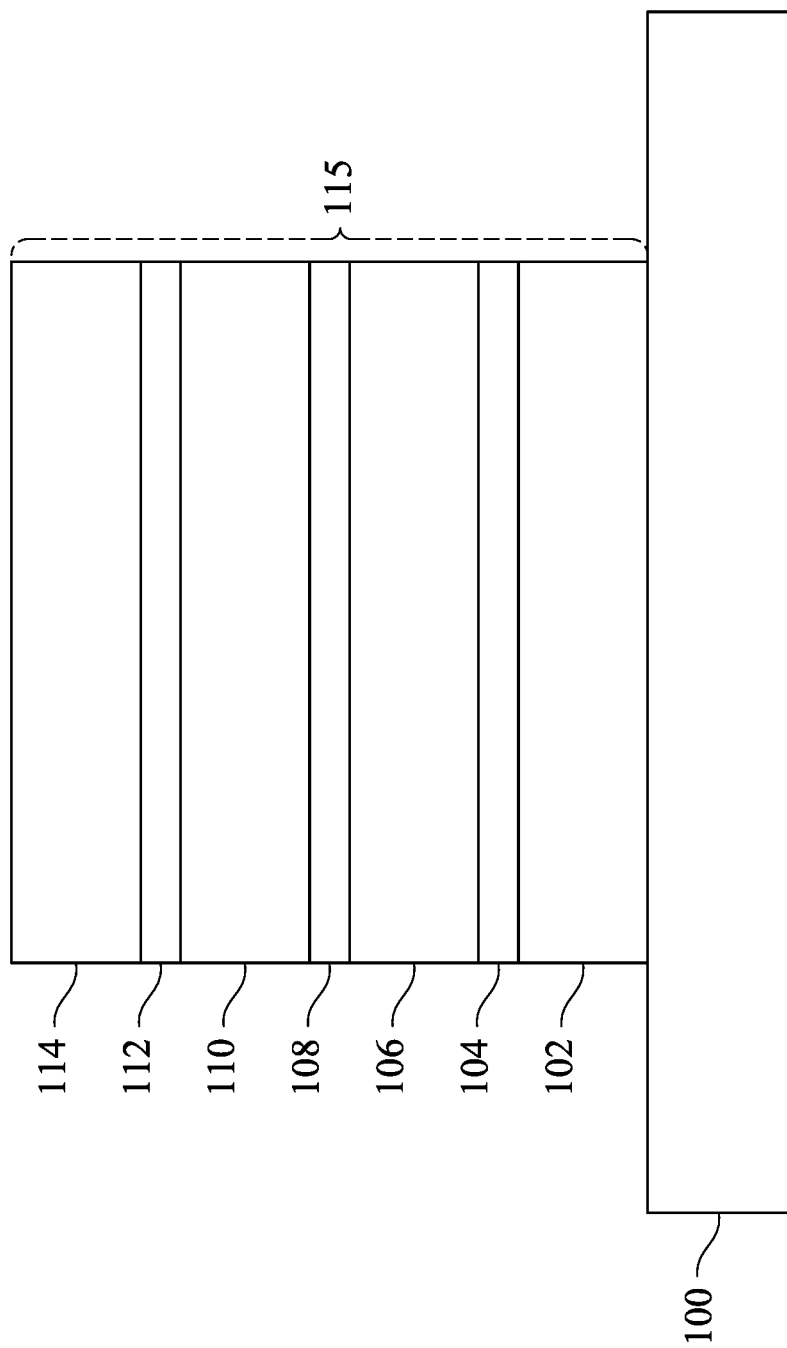

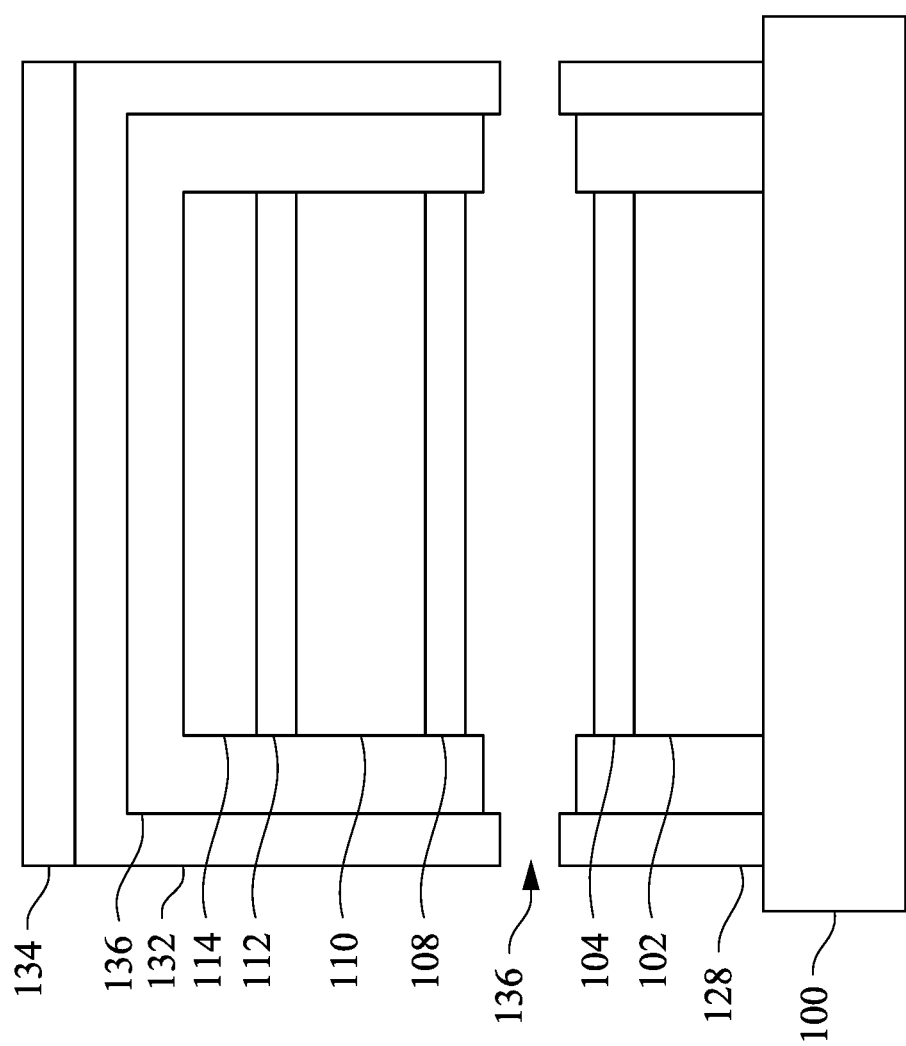

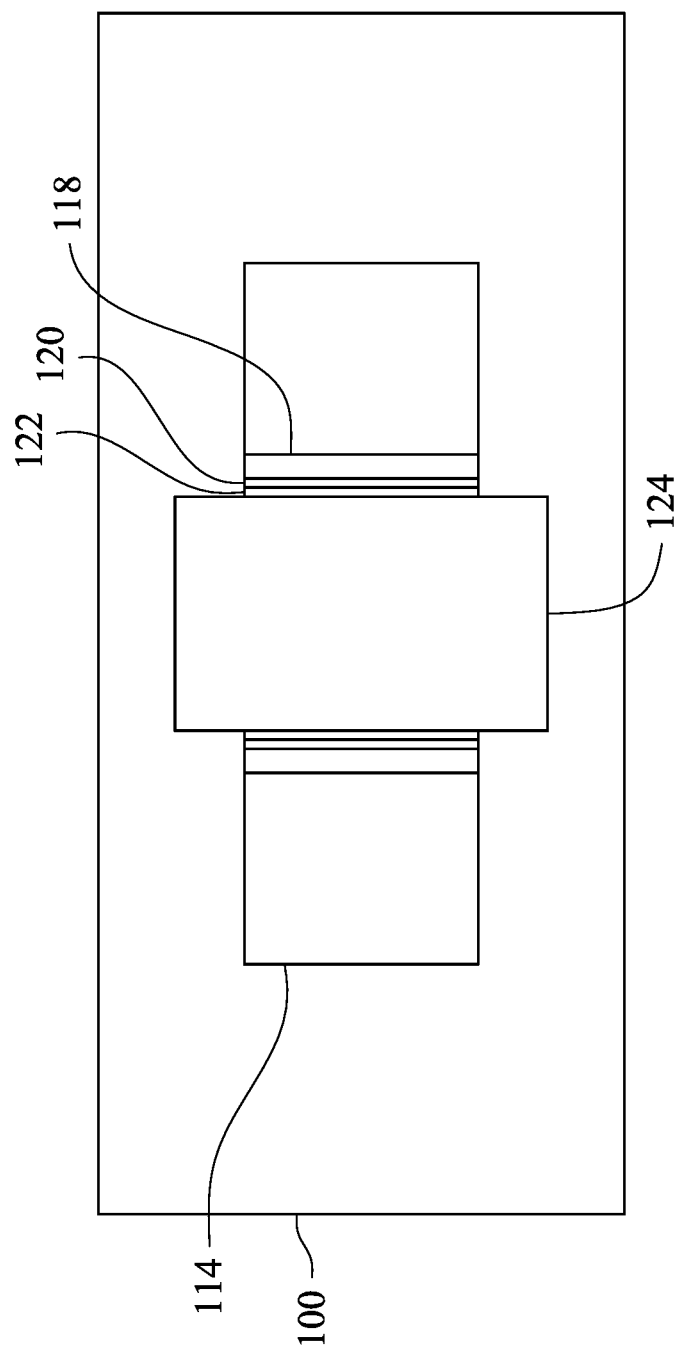

STACKED VERTICALLY ISOLATED MOSFET STRUCTURE AND METHOD OF FORMING THE SAME

CROSS-REFERENCE TO RELATED APPLICATIONS

This application claims the benefit of U.S. Provisional Patent Application No. 62/692,062, filed on Jun. 29, 2018, entitled "Multi-Channel Multi-Gate Stacked MOSFET Device and Methods of Forming the Same," which patent application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates a cross-sectional view of a formation of a second buffer layer, a second channel layer, a third buffer layer, a third channel layer, and a fourth buffer layer, in accordance with some embodiments.

FIG. 5 illustrates a cross-sectional view of a formation of a fin structure, in accordance with some embodiments.

FIGS. 16A-16C illustrate various views of a formation of a first opening, in accordance with some embodiments.

FIGS. 24A-24C illustrate various views of a removal of portions of the first isolation layer and the second isolation layer, in accordance with some embodiments.

DETAILED DESCRIPTION

Figure 1:
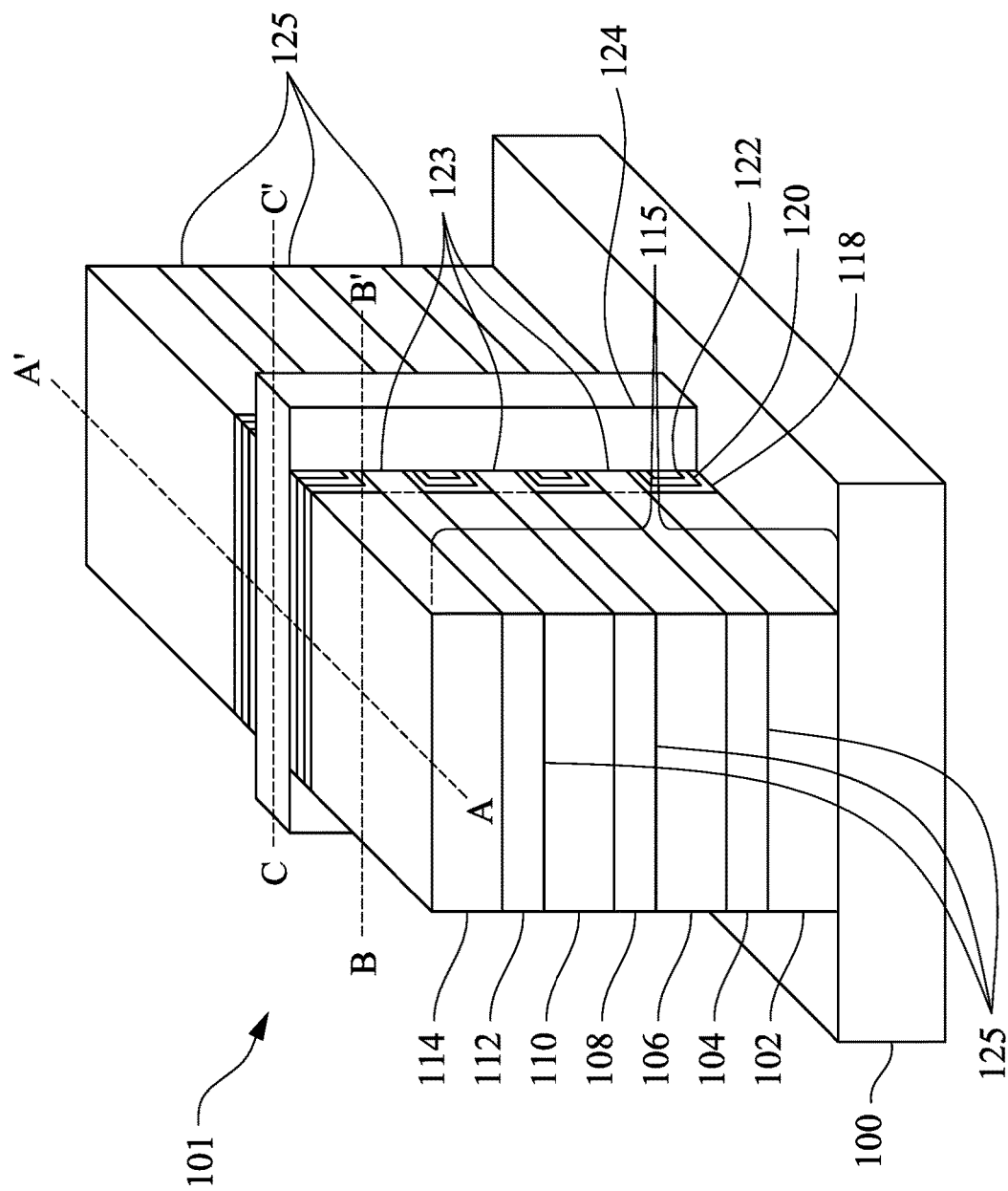
FIG. 1 illustrates an example of a stacked MOSFET structure in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide stacked metal-oxide-semiconductor field-effect transistors (MOSFETs) having vertical isolation, and processes for forming the same. The stacked MOSFETs may include isolation layers vertically separating channel layers, source/drains, and gates of MOSFET devices from one another. Moreover, each MOSFET device may include one or more channel layers. The stacked MOSFET structures may enable multiple independent MOSFET devices to be formed on the same footprint.

FIG. 1 illustrates an example of a stacked metal-oxide-semiconductor field-effect transistor (MOSFET) structure 101 in a three-dimensional view for reference, in accordance with some embodiments. The stacked MOSFET structure 101 comprises a fin structure 115 on a substrate 100 (e.g., a semiconductor substrate). The fin structure 115 comprises alternating buffer layers and channel layers such as a first buffer layer 102, a first channel layer 104, a second buffer layer 106, a second channel layer 108, a third buffer layer 110, a third channel layer 112, and a fourth buffer layer 114.

The stacked MOSFET structure 101 further comprises gate stacks, which may be formed in the first buffer layer 102, the second buffer layer 106, the third buffer layer 110, and the fourth buffer layer 114. The gate stacks may each comprise a gate spacer 118, a gate insulator 120, a gate electrode 122, and a metal pad 124. Although the metal pad 124 illustrated in FIG. 1 is connected between all four of the illustrated gate stacks, as will be discussed below, the metal pad 124 for each of the gate stacks may be isolated from one another. The first channel layer 104, the second channel layer 108, and the third channel layer 112 may include channel regions 123 laterally aligned with the gate stacks. The first channel layer 104, the second channel layer 108, and the third channel layer 112 may further include source/drain regions 125 disposed on opposite sides of the fin structure 115 with respect to the gate stacks and surrounding at least portions of the channel regions 123.

FIG. 1 further illustrates reference cross-sections that are used in later figures. Cross-section A-A' is along a longitudinal axis of the fin structure 115 and in a direction of, for example, a current flow between the source/drain regions of the stacked MOSFET structure 101. Cross-section B-B' is perpendicular to cross-section A-A and is along a longitudinal axis of the fin structure 115 and in a direction, for example perpendicular to the direction of current flow between source/drain regions of the stacked MOSFET structure 101. Cross-section C-C' is perpendicular to cross-section A-A', parallel to cross-section B-B', and extends through the gate stacks of the stacked MOSFET structure 101. Subsequent figures refer to these reference cross-sections for clarity.

FIGS. 2 through 28C illustrate various views of intermediate stages in the manufacturing of stacked MOSFETs, in accordance with some embodiments. FIGS. 2-6A, 7-11A, 12A, 13A, 14A, 15A, 16A, 17A, 18A, 19A, 20A, 21, 22A, 23A, 24A, 25A, 26A, 27, and 28A illustrate reference cross-section A-A', illustrated in FIG. 1. FIG. 16B illustrates reference cross-section B-B', illustrated in FIG. 1. FIGS. 11C, 12C, 13C, 14C, 15C, 16C, 17B, 18C, 19B, 20C, 22B, 23C, 24C, and 28C illustrate reference cross-section C-C', illustrated in FIG. 1. FIGS. 6B, 11B, 12B, 13B, 14B, 15B, 18B, 20B, 23B, 24B, 25B, 26B, and 28B illustrate top-down views.

FIGS. 2-5 illustrate a formation of a fin structure 115 including a first buffer layer 102, a first channel layer 104, a second buffer layer 106, a second channel layer 108, a third buffer layer 110, a third channel layer 112, and a fourth buffer layer 114 over a substrate 100.

Figure 2:
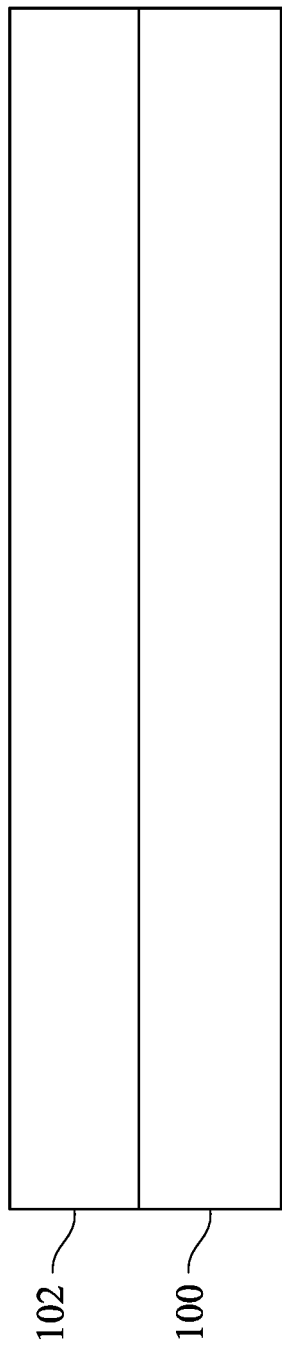
FIG. 2 illustrates a cross-sectional view of a formation of a first buffer layer over a substrate, in accordance with some embodiments.

In FIG. 2, a substrate 100 is provided. The substrate 100 may be a semiconductor substrate, such as a bulk semiconductor substrate, a semiconductor-on-insulator (SOI) substrate, a multi-layered or gradient substrate, or the like. The substrate 100 may include a semiconductor material, such as an elemental semiconductor including Si and Ge; a compound or alloy semiconductor including SiC, SiGe, GaAs, GaP, GaAsP, AnnAs, AlGaAs, GaInAs, InAs, GaInP, InP, InSb, GaInAsP; a combination thereof, or the like. The substrate 100 may be doped or un-doped. In a specific example, the substrate 100 is a bulk silicon substrate, which may be a wafer.

FIG. 2 further illustrates a first buffer layer 102 formed over the substrate 100. The first buffer layer 102 may be a group IV material, such as Si, Ge, SiGe, SiGeSn, Sn or the like; a group III-group V compound material, such as GaAs, GaP, GaAsP, AnnAs, AlGaAs, GaInAs, InAs, GaInP, InP, InSb, GaInAsP or the like; Si:P, combinations thereof, or the like. In specific embodiments, the first buffer layer 102 may be formed of silicon germanium represented by the formula $Si_xGe_y$, wherein x is about 0.8 and y is about 0.2. The first buffer layer 102 may be grown over the substrate 100 by any suitable process, such as chemical vapor deposition (CVD), atomic layer deposition (ALD), epitaxial growth, combinations thereof, or the like. The first buffer layer 102 may have a minimum thickness sufficient to isolate the substrate 100 from portions of subsequently formed transistors. For example, the first buffer layer 102 may have a thickness of between about 0.1 nm and about 1 µm.

Figure 3:
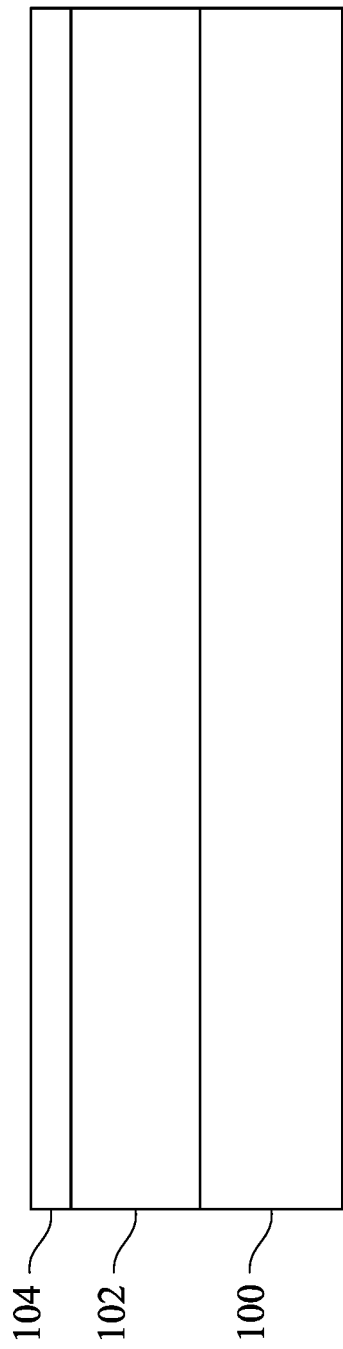
FIG. 3 illustrates a cross-sectional view of a formation of a first channel layer, in accordance with some embodiments.

In FIG. 3, a first channel layer 104 is formed over the first buffer layer 102. The first channel layer 104 may be a group IV material, such as Si, Ge, SiGe, SiGeSn, Sn or the like; a group III-group V compound material, such as GaAs, GaP, GaAsP, AlInAs, AlGaAs, GaInAs, InAs, GaInP, InP, InSb, GaInAsP or the like; Si:P, combinations thereof, or the like. In specific embodiments, the first channel layer 104 may be formed of silicon (Si). The first channel layer 104 may be formed of a different material than the first buffer layer 102 such that the first channel layer 104 and the first buffer layer 102 may be selectively etched in subsequent process steps. The first channel layer 104 may be grown over the first buffer layer 102 by any suitable process, such as CVD, ALD, epitaxial growth, combinations thereof, or the like. The first channel layer 104 may have a minimum thickness sufficient to provide adequate electrical properties in a subsequently formed transistor. For example, the first channel layer 104 may have a thickness of between about 0.1 nm and about 1 µm.

In FIG. 4, a second buffer layer 106, a second channel layer 108, a third buffer layer 110, a third channel layer 112, and a fourth buffer layer 114 are formed over the first channel layer 104. Each of the second buffer layer 106, the second channel layer 108, the third buffer layer 110, the third channel layer 112, and the fourth buffer layer 114 may be a group IV material, such as Si, Ge, SiGe, SiGeSn, Sn or the like; a group III-group V compound material, such as GaAs, GaP, GaAsP, AlInAs, AlGaAs, GaInAs, InAs, GaInP, InP, InSb, GaInAsP or the like; Si:P, combinations thereof, or the like. In specific embodiments, the second buffer layer 106, the third buffer layer 110, and the fourth buffer layer 114 may be formed of silicon germanium represented by the formula $Si_xGe_y$, wherein x is about 0.8 and y is about 0.2. The second buffer layer 106, the third buffer layer 110, and the fourth buffer layer 114 may be formed of the same materials. The second channel layer 108 and the third channel layer 112 may be formed of silicon (Si). The second channel layer 108 and the third channel layer 112 may be formed of the same materials. The second channel layer 108 and the third channel layer 112 may be formed of different materials than the second buffer layer 106, the third buffer layer 110, and the fourth buffer layer 114 such that adjacent layers of the second buffer layer 106, the second channel layer 108, the third buffer layer 110, the third channel layer 112, and the fourth buffer layer 114 may be selectively etched in subsequent processing steps.

The second buffer layer 106, the second channel layer 108, the third buffer layer 110, the third channel layer 112, and the fourth buffer layer 114 may be grown by any suitable process, such as CVD, ALD, epitaxial growth, combinations thereof, or the like. The second buffer layer 106, the third buffer layer 110, and the fourth buffer layer 114 may have minimum thicknesses sufficient to isolate portions of subsequently formed transistors from one another. For example, the second buffer layer 106, the third buffer layer 110, and the fourth buffer layer 114 may have each have a thickness of between about 0.1 nm and about 1 µm. The second channel layer 108 and the third channel layer 112 may have minimum thicknesses sufficient to provide adequate electrical properties in subsequently formed transistors. For example, each of the second channel layer 108 and the third channel layer 112 may have a thickness of between about 0.1 nm and about 1 µm.

In FIG. 5, the first buffer layer 102, the first channel layer 104, the second buffer layer 106, the second channel layer 108, the third buffer layer 110, the third channel layer 112, and the fourth buffer layer 114 are etched to form a fin structure 115. The fin structure 115 may be formed by depositing a photoresist over the fourth buffer layer 114, exposing the photoresist to a patterned energy source (e.g. a patterned light source, an electron beam (e-beam) source, or the like), and developing the photoresist. The first buffer layer 102, the first channel layer 104, the second buffer layer 106, the second channel layer 108, the third buffer layer 110, the third channel layer 112, and the fourth buffer layer 114 may then be etched by an acceptable etch process, such as a dry etch process. The etch process may include a reactive ion etch (RIE), a neutral beam etch (NBE), physical dry etching, combinations thereof, or the like. As illustrated in FIG. 5, the etch process may be anisotropic. Please note, although the fin structure of FIG. 5 is illustrated as having linear edges, the edges of the fin structure 115 may be rounded or have any other suitable shape. After the etch process is complete, the photoresist may be removed, such as by an acceptable ashing process.

FIGS. 6A-11C illustrate a formation of gate stacks in the fin structure 115. Each of the gate stacks may include a gate spacer 118, a gate insulator 120 on the gate spacer 118, a gate electrode 122 on the gate insulator 120, and a portion of a metal pad 124 (see FIGS. 11A-11C).

Figure 6A:
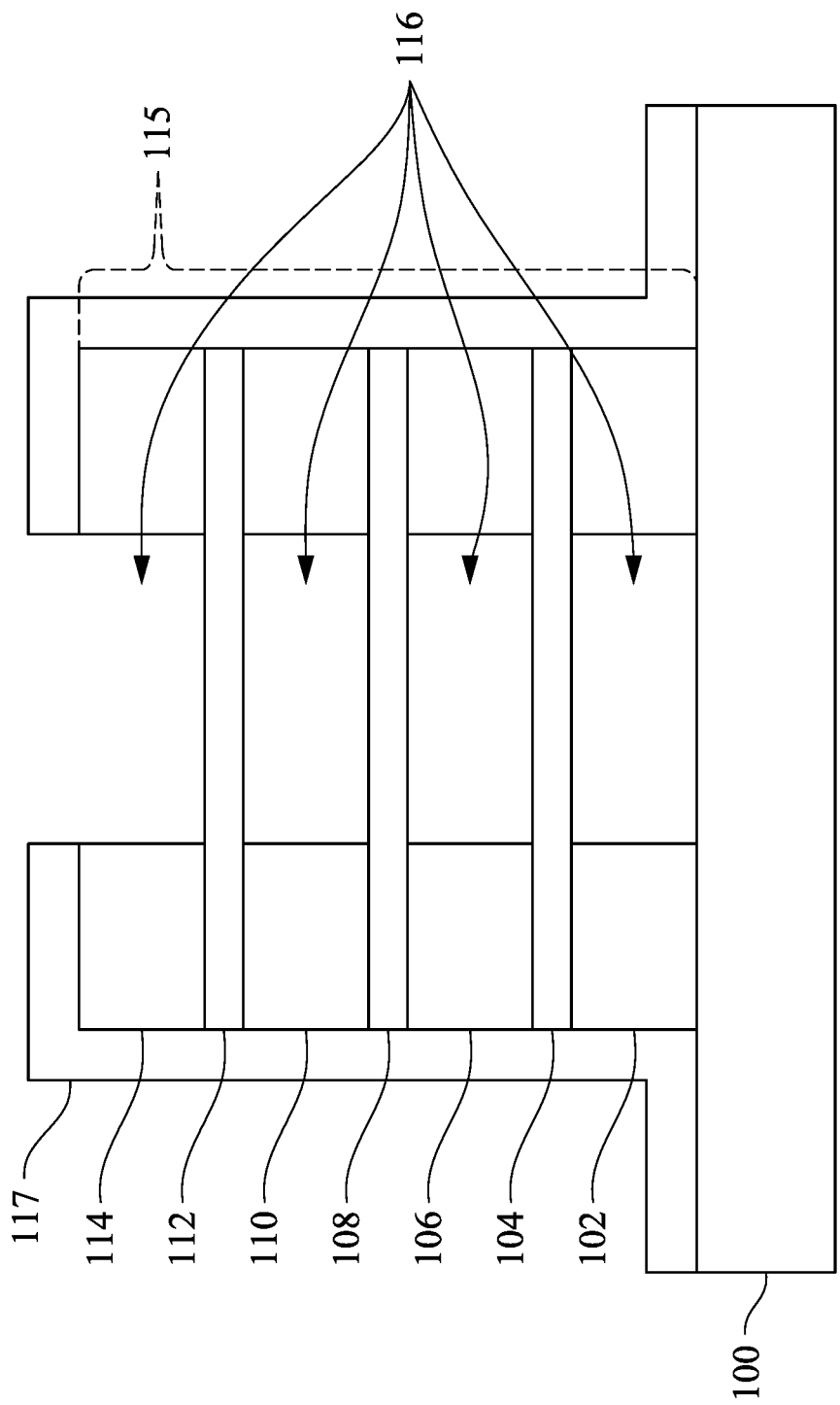
FIGS. 6A and 6B illustrate various views of a formation of a patterned photoresist over the fin structure and a formation of openings in the fin structure, in accordance with some embodiments.
Figure 6B:
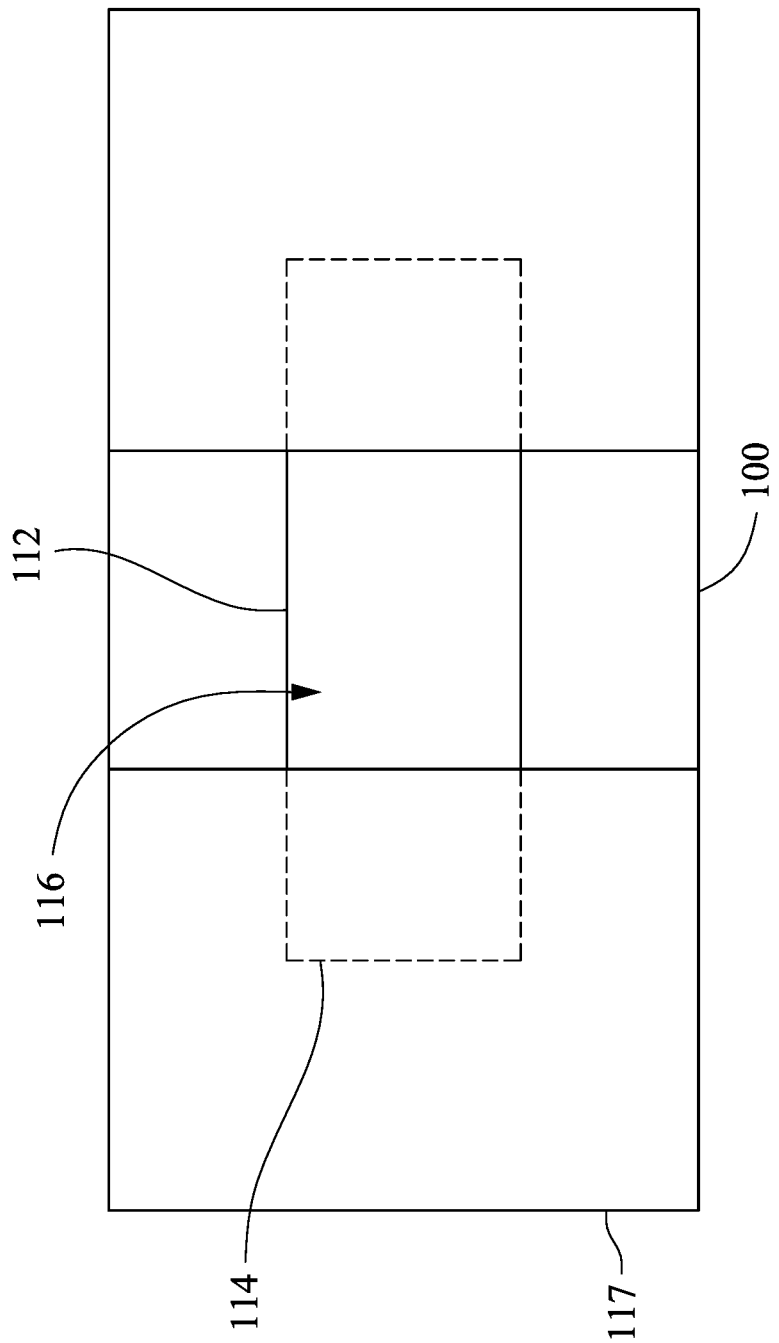

In FIGS. 6A and 6B, a patterned photoresist 117 is formed over the structure of FIG. 5 and first openings 116 are formed in the first buffer layer 102, the second buffer layer 106, the third buffer layer 110, and the fourth buffer layer 114. The first openings 116 may be formed by an acceptable etch process, such as an isotropic etch process. Portions of the first buffer layer 102, the second buffer layer 106, the third buffer layer 110, and the fourth buffer layer 114 may be protected from the isotropic etch process used to form the first openings 116 by forming the patterned photoresist 117 over the structure of FIG. 5. For example, a photoresist may be deposited over the structure of FIG. 5, the photoresist may be exposed to a patterned energy source (e.g. a patterned light source, an electron beam (e-beam) source, or the like), and the photoresist may be developed to form the patterned photoresist 117. As illustrated in FIGS. 6A and 6B, the patterned photoresist 117 may cover portions of the sidewalls of the first buffer layer 102, the second buffer layer 106, the third buffer layer 110, and the fourth buffer layer 114, while leaving other portions of the sidewalls of the first buffer layer 102, the second buffer layer 106, the third buffer layer 110, and the fourth buffer layer 114. The patterned photoresist 117 may further cover portions of the top surface of the fourth buffer layer 114, while leaving other portions of the top surface of the fourth buffer layer 114 exposed.

Portions of the first buffer layer 102, the second buffer layer 106, the third buffer layer 110, and the fourth buffer layer 114 are then etched using the patterned photoresist 117. The first buffer layer 102, the second buffer layer 106, and the third buffer layer 110 may be etched laterally from the exposed sidewalls and the fourth buffer layer 114 may be etched laterally from the exposed sidewalls and vertically from the top surface. The openings 116 formed by removing the portions of the first buffer layer 102, the second buffer layer 106, the third buffer layer 110, and the fourth buffer layer 114 may extend laterally across the fin structure in a direction parallel with the reference cross-section C-C'.

The isotropic etch process used to form the first openings 116 may be selective to the material of the first buffer layer 102, the second buffer layer 106, the third buffer layer 110, and the fourth buffer layer 114 and may remove the material of the first buffer layer 102, the second buffer layer 106, the third buffer layer 110, and the fourth buffer layer 114 at a greater rate than or without removing the material of the first channel layer 104, the second channel layer 108, and the third channel layer 112. The etch process may include a wet etch process using an etchant such as hydrogen peroxide ($H_2O_2$), ammonium hydroxide ($NH_4OH$), tetramethyalammonium hydroxide (TMAH), or another etchant. In some embodiments, the etch process may include a chemical vapor etch process using high-temperature HCl gas. In still further embodiments, the etch process may include an RIE process using a plasma produced from $CF_4$ gas. After the etch process is complete and the first openings 116 are formed, the patterned photoresist 117 may be removed, such as by an acceptable ashing process.

Figure 7:
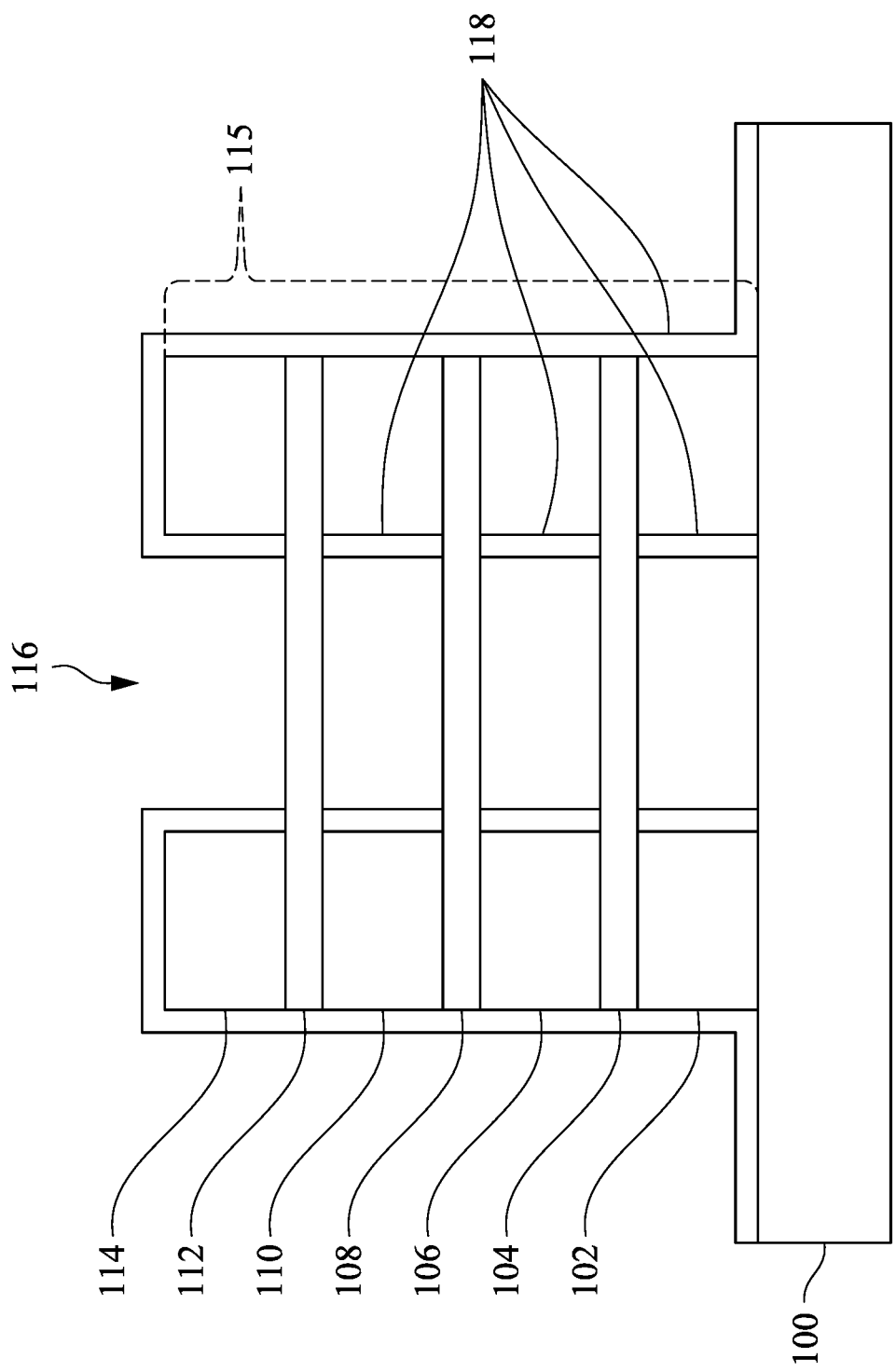
FIG. 7 illustrates a cross-sectional view of a formation of gate spacers, in accordance with some embodiments.

In FIG. 7, gate spacers 118 are formed in the first openings 116, over side surfaces and top surfaces of the fin structure 115, and over top surfaces of the substrate 100. The gate spacers 118 may be formed by conformally depositing one or more layers. In an embodiment, the gate spacers 118 may be deposited by a conformal deposition process such as CVD, ALD, or the like. The gate spacers 118 may be formed of a material such as silicon nitride, porous silicon nitride ($Si_3N_4$), silicon oxynitride, silicon carbon nitride, multiple layers or combinations thereof, or the like. As illustrated in FIG. 7, portions of the gate spacers 118 disposed on the substrate 100, the first channel layer 104, the second channel layer 108, and the third channel layer 112 (e.g., horizontal portions of the gate spacers 118) may then be removed. The portions of the gate spacers 118 may be removed by any suitable etch process, such as a wet etch process (e.g., a wet etch process using hydrofluoric acid (HF) or the like) or a dry etch process (e.g., a dry etch process using hexafluoroethane ($C_2F_6$) plasma, oxygen ($O_2$) plasma, combinations thereof, or the like). In some embodiments, a patterned photoresist (not separately illustrated) may be formed over the gate spacers 118 prior to the etch process to protect portions of the gate spacers 118 during the etch process.

Figure 8:
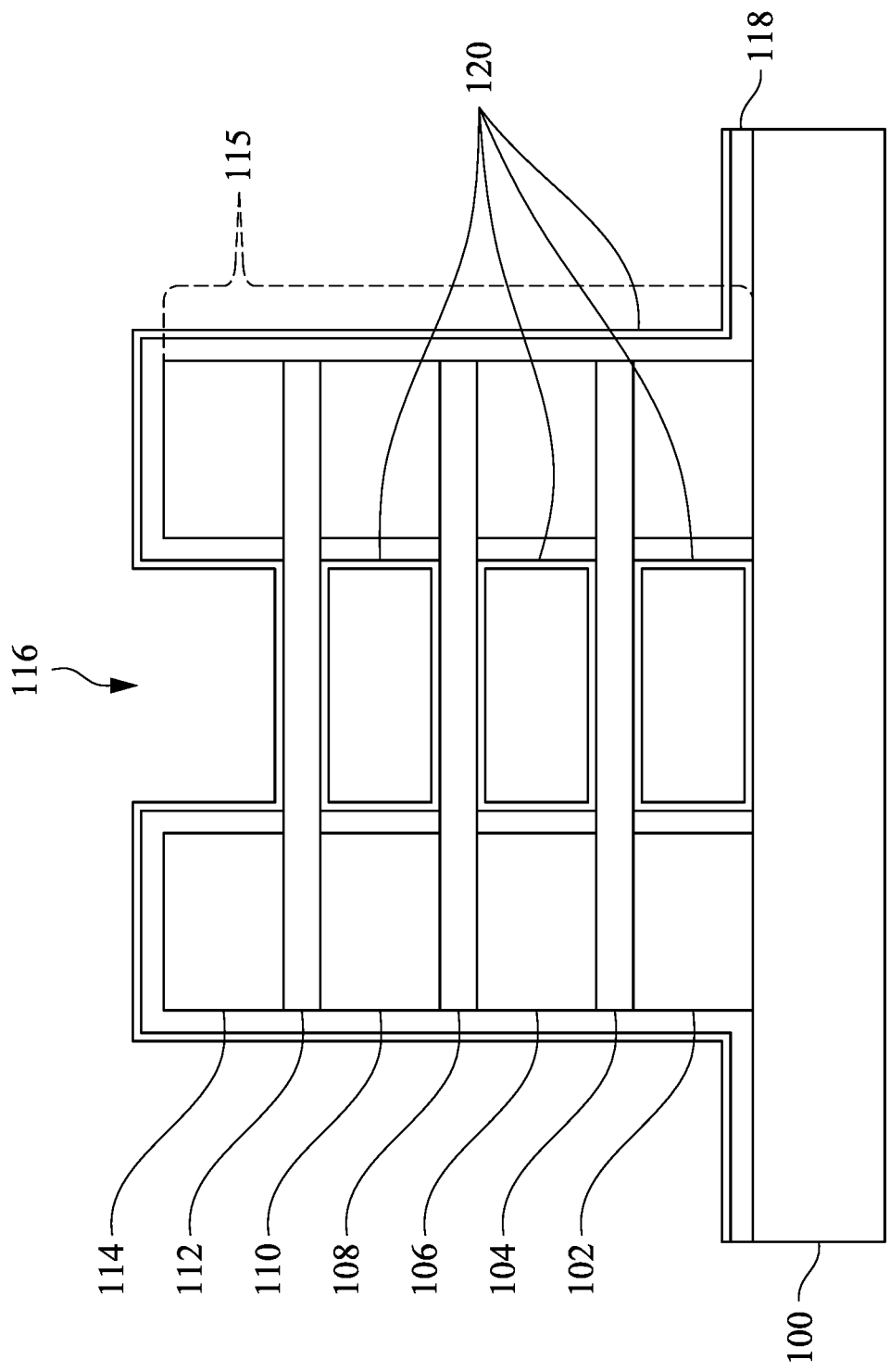
FIG. 8 illustrates a cross-sectional view of a formation of gate insulators, in accordance with some embodiments.

In FIG. 8, gate insulators 120 are formed on the gate spacers 118. The gate insulators 120 may be formed by conformally depositing one or more layers. In an embodiment, the gate insulators 120 may be deposited by a conformal deposition process such as CVD, ALD, or the like. The gate insulators 120 may be formed of silicon oxide, silicon nitride, a high-k dielectric material, multiple layers thereof, or another dielectric material. In some examples, a high-k dielectric material has a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multiple layers or combinations thereof, or the like.

Figure 9:
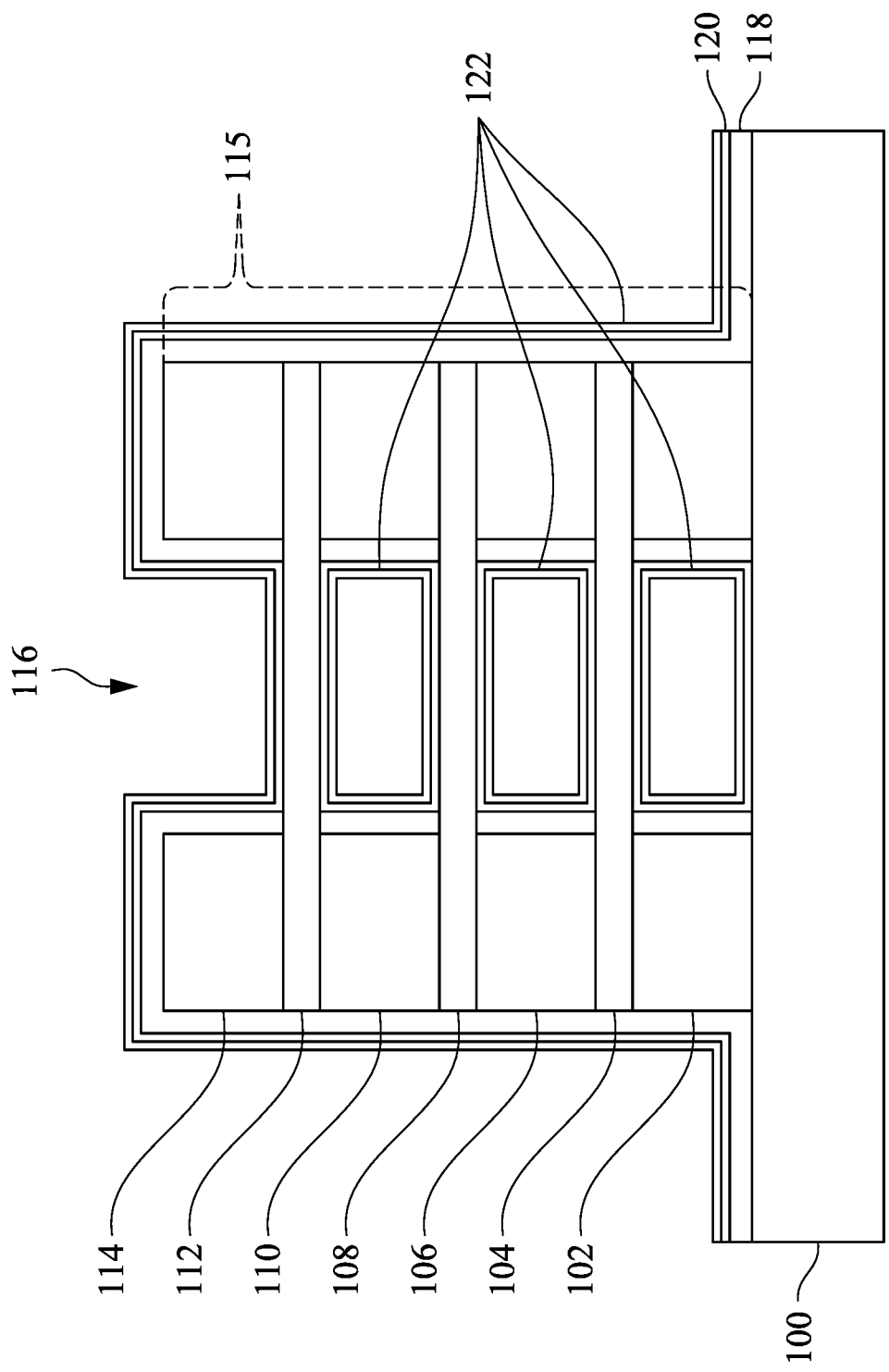
FIG. 9 illustrates a cross-sectional view of a formation of gate electrodes, in accordance with some embodiments.

In FIG. 9, gate electrodes 122 are formed on the gate insulators 120. The gate electrodes 122 may be formed by conformally depositing one or more layers and anisotropically etching the one or more layers. In an embodiment, the gate electrodes 122 may be deposited by a conformal deposition process such as physical vapor deposition (PVD), sputtering, CVD, ALD, or the like. The gate electrodes 122 may be formed of titanium nitride (TiN), titanium aluminide (TiAl), titanium aluminum nitride (TiAlN), or the like.

Figure 10:
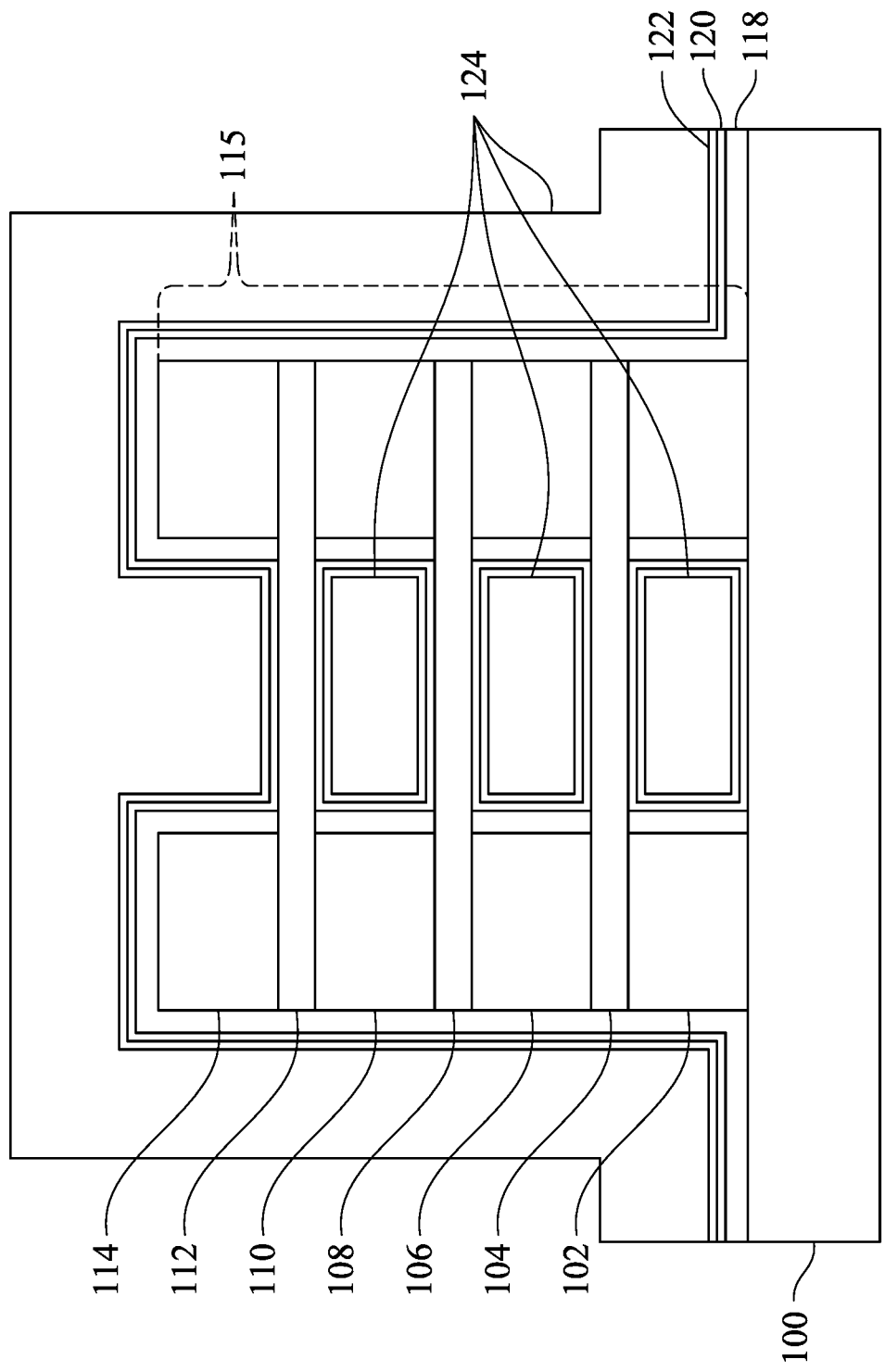
FIG. 10 illustrates a cross-sectional views of a formation of a gate metal pad, in accordance with some embodiments.

In FIG. 10, a metal pad 124 is formed on the gate electrodes 122 in the first openings 116. The metal pad 124 may be formed by conformally depositing one or more layers. In an embodiment, the metal pad 124 may be deposited by a conformal deposition process such as CVD, ALD, or the like. As illustrated in FIG. 10, the metal pad 124 may be deposited such that the material of the metal pad 124 fills the openings 116. Seams or voids may be formed in the metal pad 124 as the material of the metal pad 124 deposited on opposite sides of the openings 116 coalesces. The metal pad 124 may be formed of aluminum (Al), tungsten (W), tantalum nitride (TaN), cobalt (Co), platinum (Pt), copper (Cu), or the like.

Figure 11A:
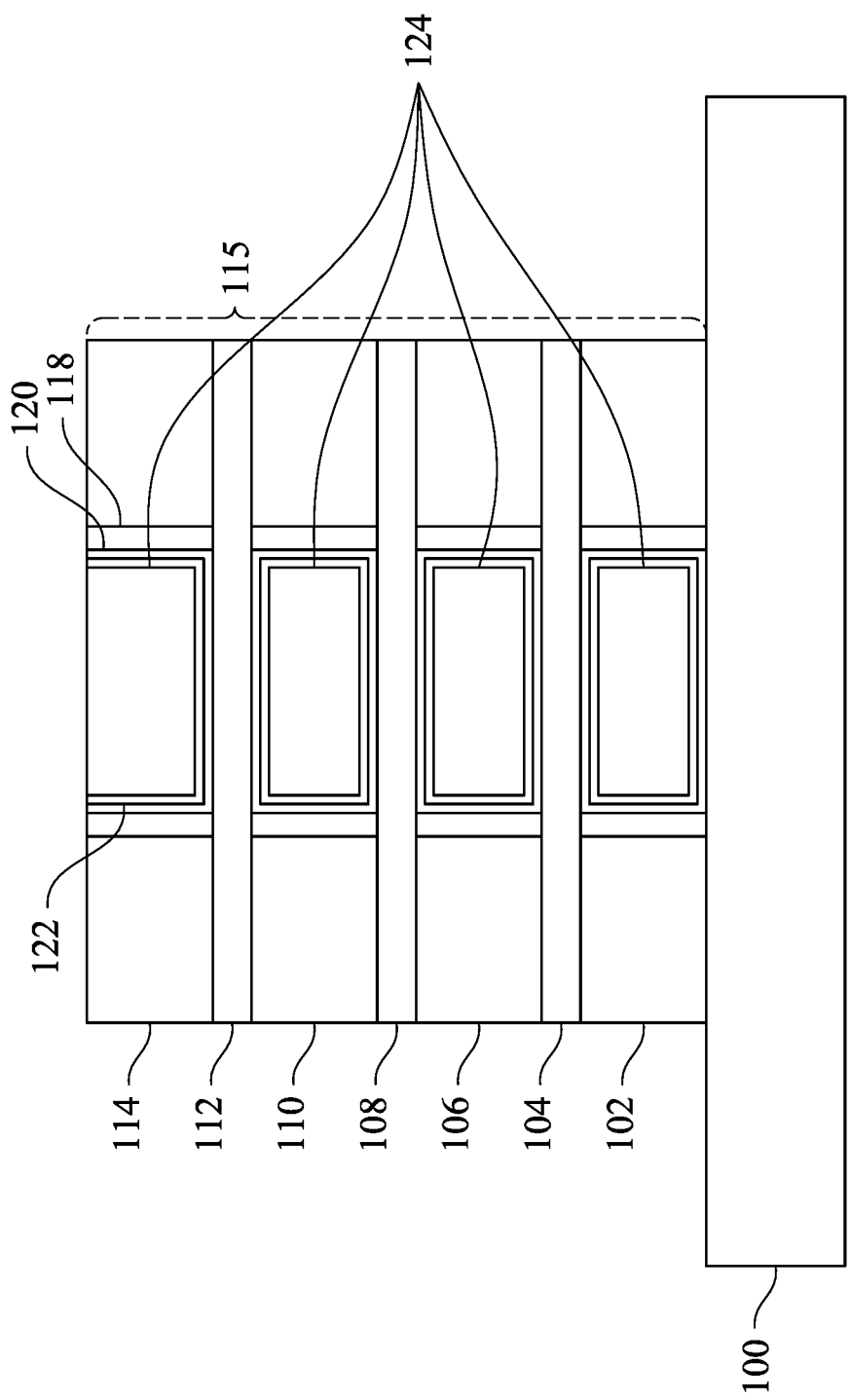
FIGS. 11A-11C illustrate various views of an etching of the gate metal pad, the gate electrodes, the gate insulators, and the gate spacers, in accordance with some embodiments.
Figure 11B:
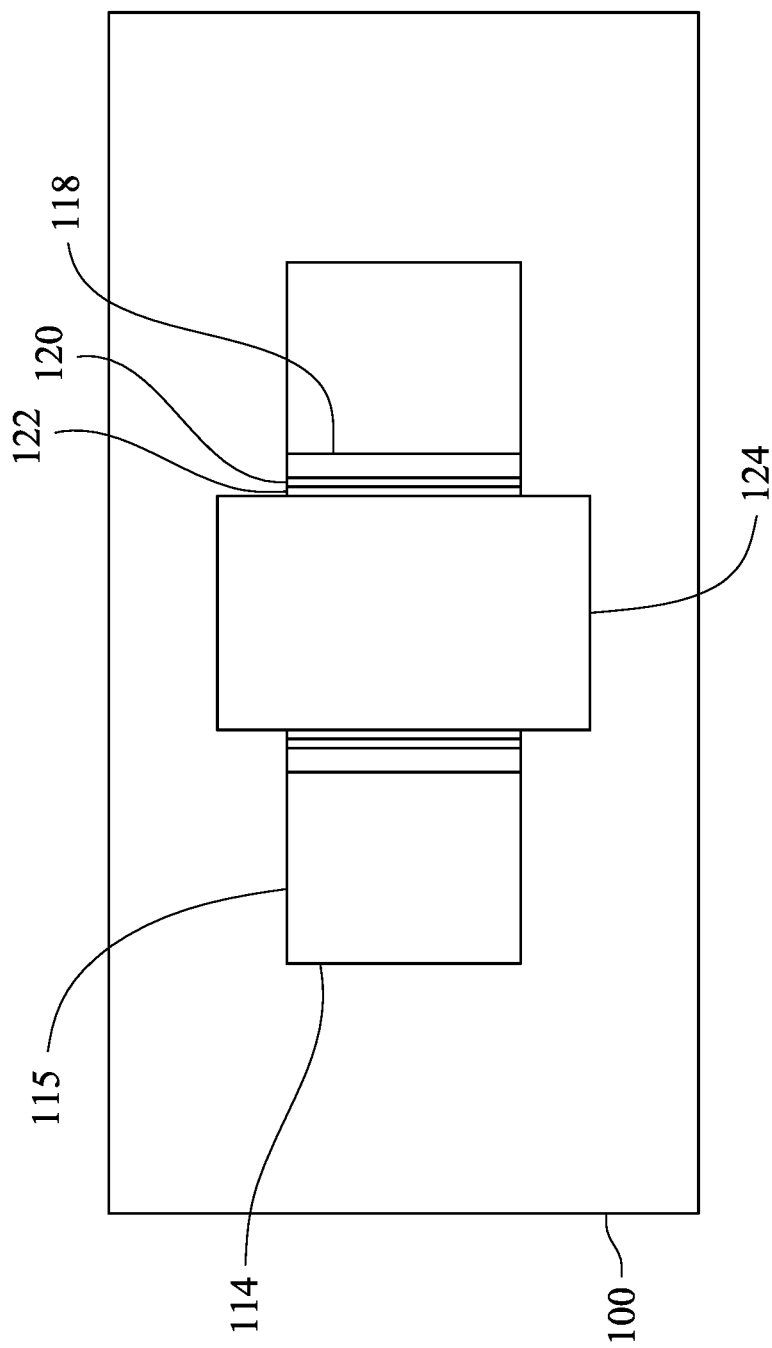
Figure 11C:
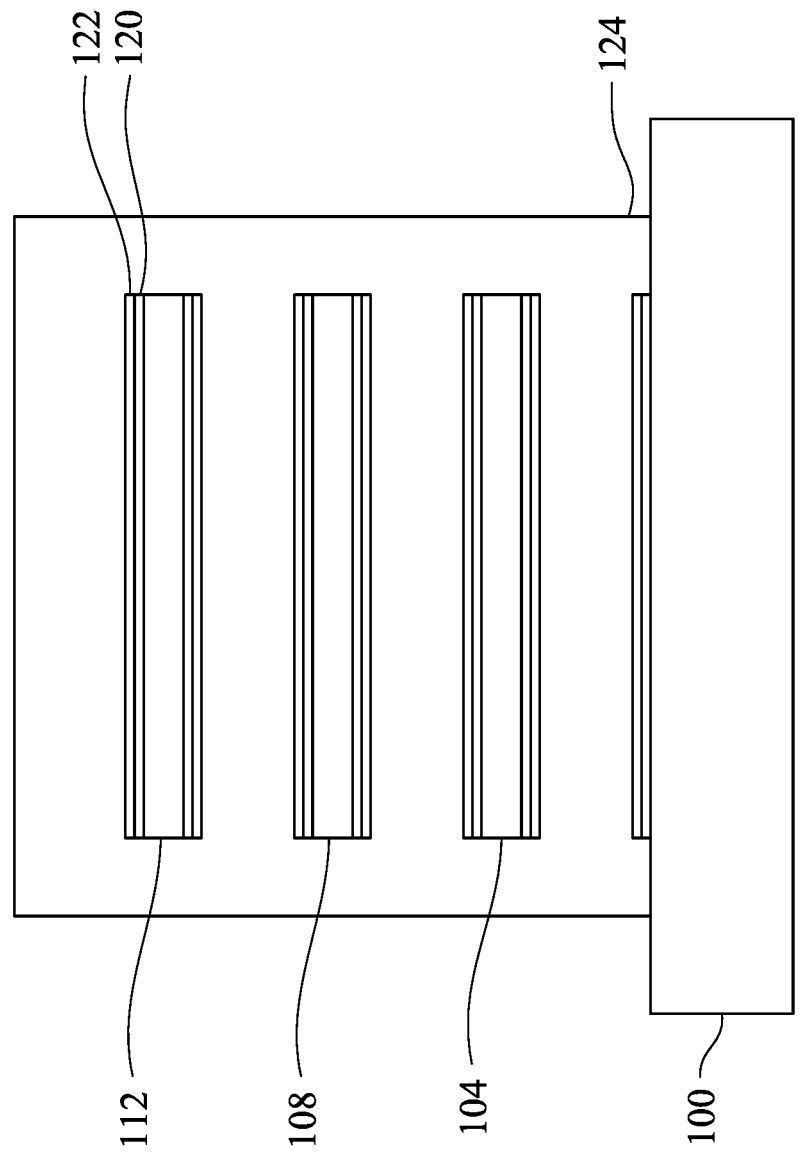

In FIGS. 11A-11C, the metal pad 124, the gate electrodes 122, the gate insulators 120, and the gate spacers 118 are etched to form a plurality of gate stacks. The metal pad 124, the gate electrodes 122, the gate insulators 120, and the gate spacers 118 may be etched by one or more etch processes, which may be isotropic or anisotropic. The metal pad 124 may be etched using a wet etch process including etchants such as phosphoric acid ($H_3PO_4$), nitric acid ($HNO_3$), acetic acid ($CH_3COOH$), hydrogen peroxide ($H_2O_2$), ammonium hydroxide ($NH_4OH$), or the like; an RIE process including a plasma formed from tetrafluoromethane ($CF_4$) gas or the like; or any other suitable etch processes. In some embodiments, a gate protection layer (not separately illustrated) comprising a photoresist, silicon dioxide ($SiO_2$), silicon nitride (SiN), or the like, may be formed over portions of the metal pad 124 to protect the portions of the metal pad 124 from the etch processes. The gate electrodes 122 may be etched using a wet etch process including etchants such as hydrogen peroxide, ammonium hydroxide, or the like; an RIE process including a plasma formed from tetrafluoromethane gas or the like; or any other suitable etch processes. The gate insulators 120 may be etched using a wet etch process including etchants such as hydrofluoric acid (HF) or the like; an RIE process including a plasma formed from fluoroform ($CHF_3$) gas or the like; or any other suitable etch processes. The gate spacers 118 may be etched using a wet etch process including etchants such as hydrofluoric acid or the like; an RIE process including a plasma formed from fluoroform gas or the like; or any other suitable etch processes. As illustrated in FIG. 11A, the gate spacers 118, the gate insulators 120, the gate electrodes 122, and the metal pad 124 may be concentric in a cross-sectional view.

FIG. 11B illustrates a top-down view of the structure of FIG. 11A. As illustrated in FIG. 11B, the metal pad 124 may extend beyond side surfaces of the fin structure 115. Moreover, FIG. 11C illustrates a cross-sectional view of the structure of FIG. 10A along the cross-section C-C'. As illustrated in FIG. 11C, the metal pad 124 may be formed on sidewalls of the first channel layer 104, the second channel layer 108, and the third channel layer 112 and the gate metal pad may extend from the substrate 100 to above the third channel layer 112 and between the third channel layer 112 and the second channel layer 108, between the second channel layer 108 and the first channel layer 104, and between the first channel layer 104 and the substrate 100.

FIGS. 12A-24C illustrate a formation of an isolation structure between gate stacks in the fin structure 115. The isolation structure may include a first isolation material 138 and a second isolation material 144. The first isolation material 138 may replace a portion of the second buffer layer 106 and portions of the gate electrode 122 and the metal pad 124 disposed adjacent to the second buffer layer 106. The second isolation material 144 may replace a remaining portion of the second buffer layer 106.

Figure 12A:
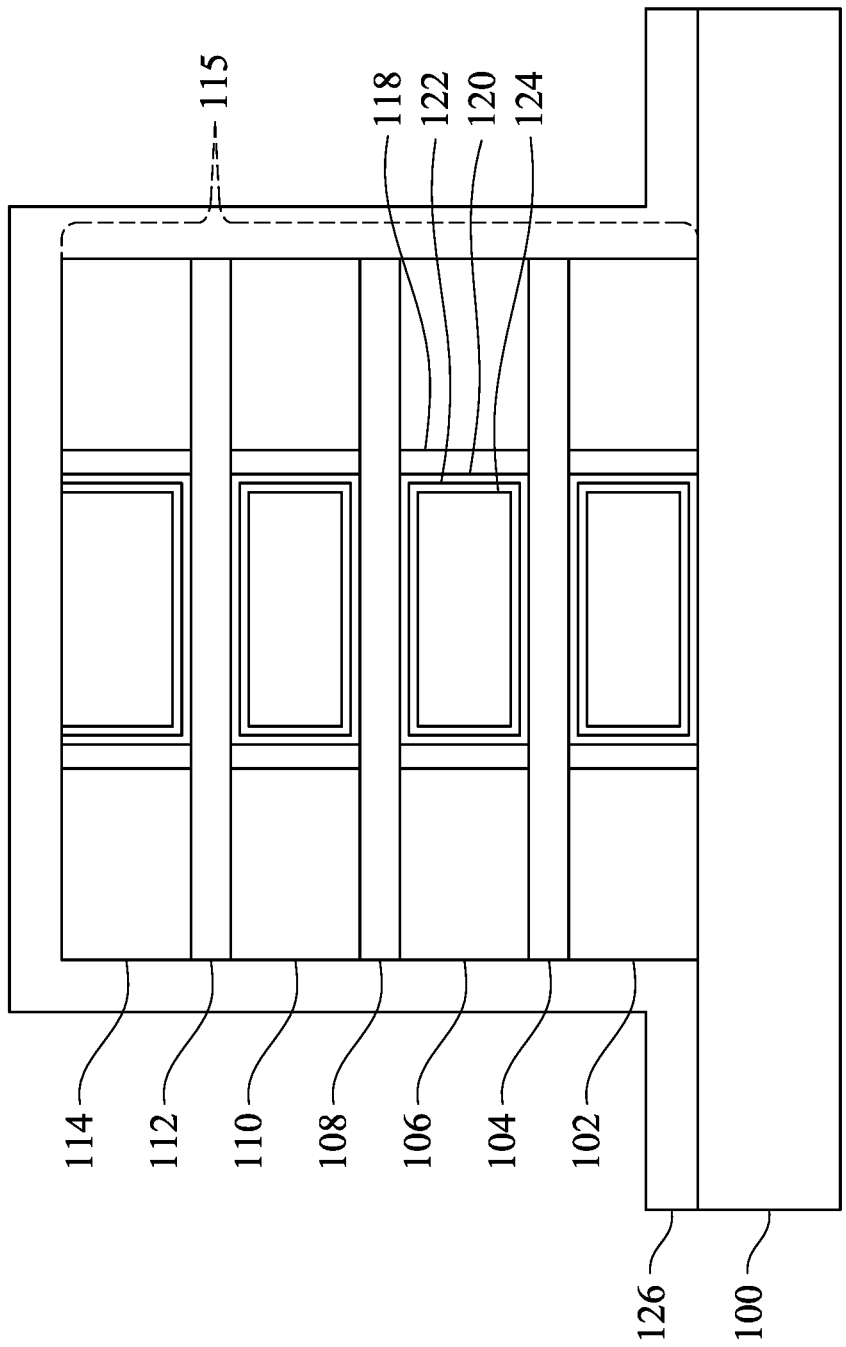
FIGS. 12A-12C illustrate various views of a formation of a protection layer, in accordance with some embodiments.
Figure 12B:
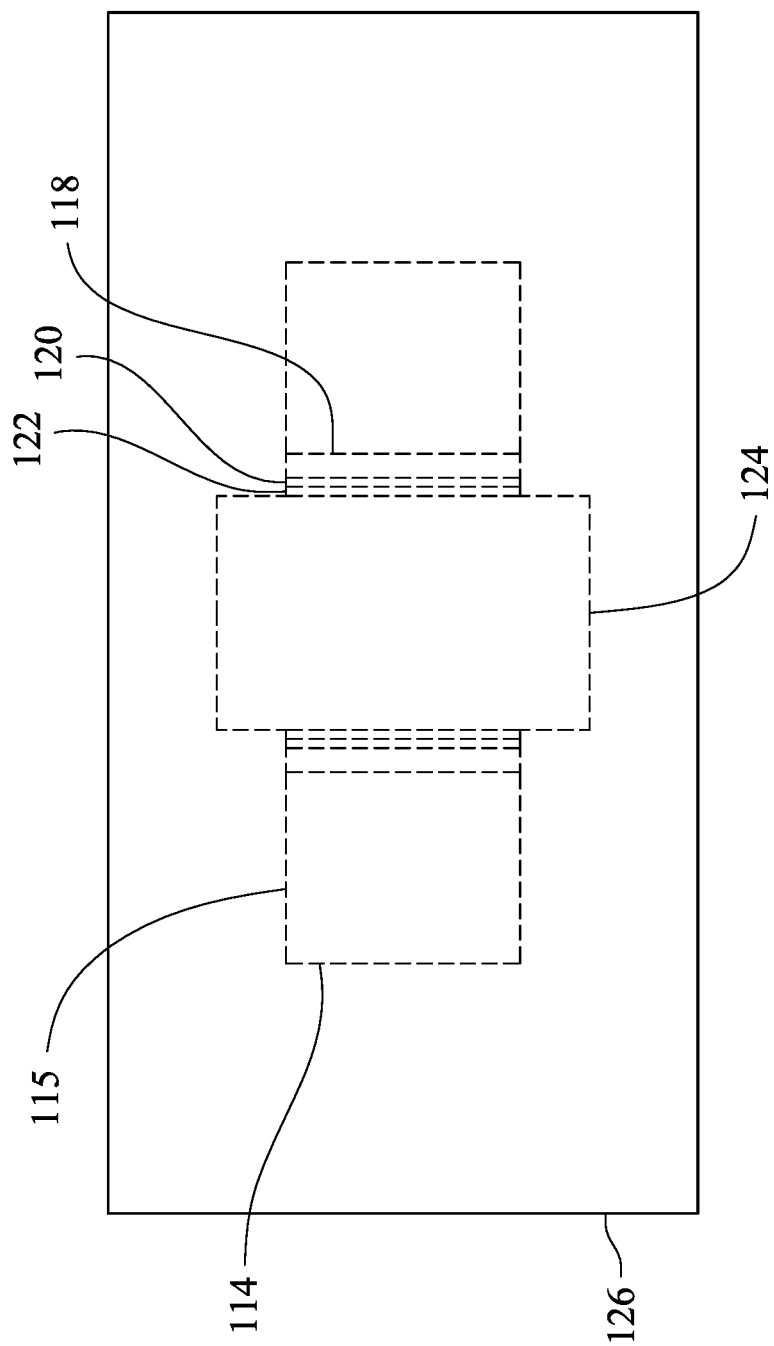
Figure 12C:
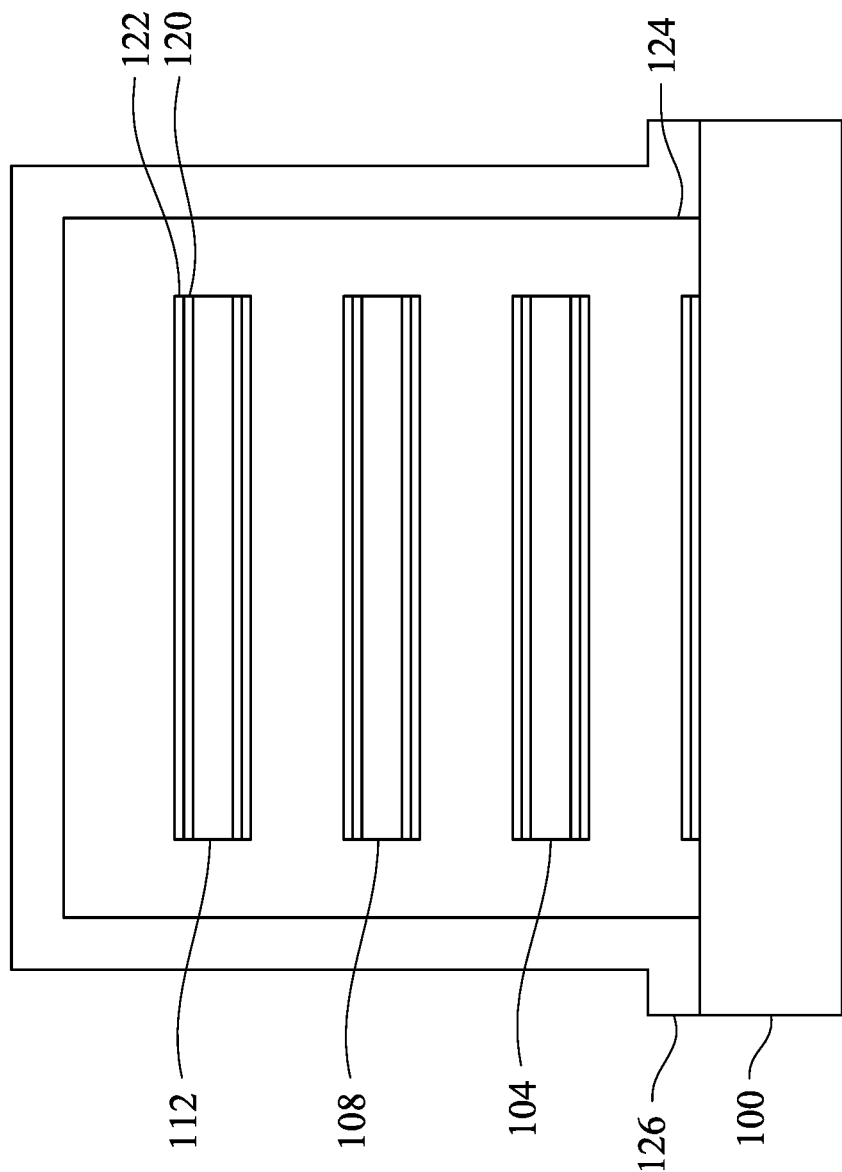

In FIGS. 12A-12C, a protection layer 126 is formed over the gate stack and the fin structure 115. The protection layer 126 may be formed by conformally depositing one or more layers. In an embodiment, the protection layer 126 may be deposited by a conformal deposition process such as CVD, ALD, or the like. The protection layer 126 may be formed of a material such as silicon dioxide ($SiO_2$), silicon nitride, porous silicon nitride ($Si_3N_4$), silicon oxynitride, silicon carbon nitride, multiple layers or combinations thereof, or the like. As illustrated in FIGS. 12A-12C, the protection layer 126 may cover top surfaces of the gate stack, the fin structure 115, and the substrate 100 and the protection layer 126 may cover side surfaces of the gate stack and the fin structure 115.

Figure 13A:
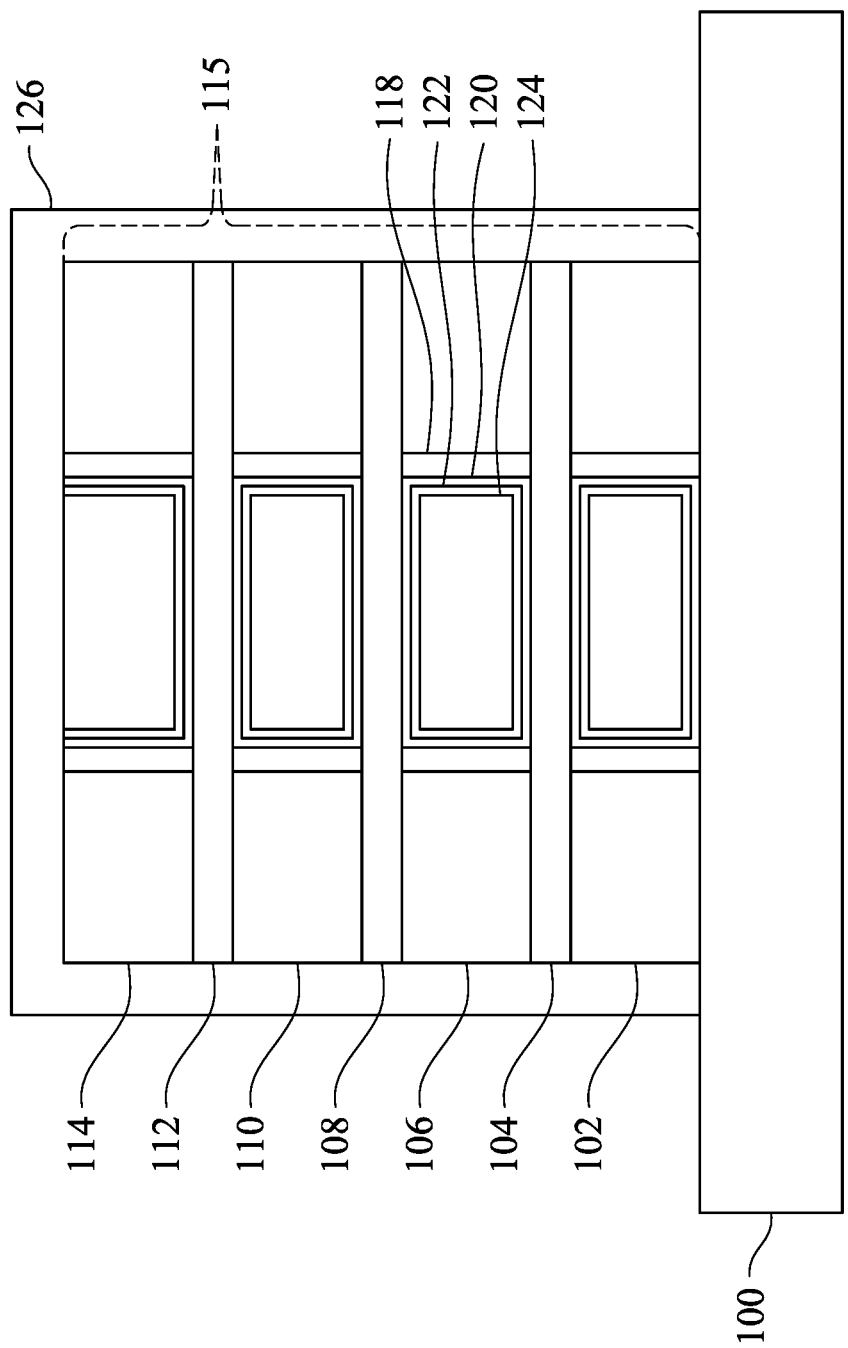
FIGS. 13A-13C illustrate various views of a removal of a portion of the protection layer, in accordance with some embodiments.
Figure 13B:
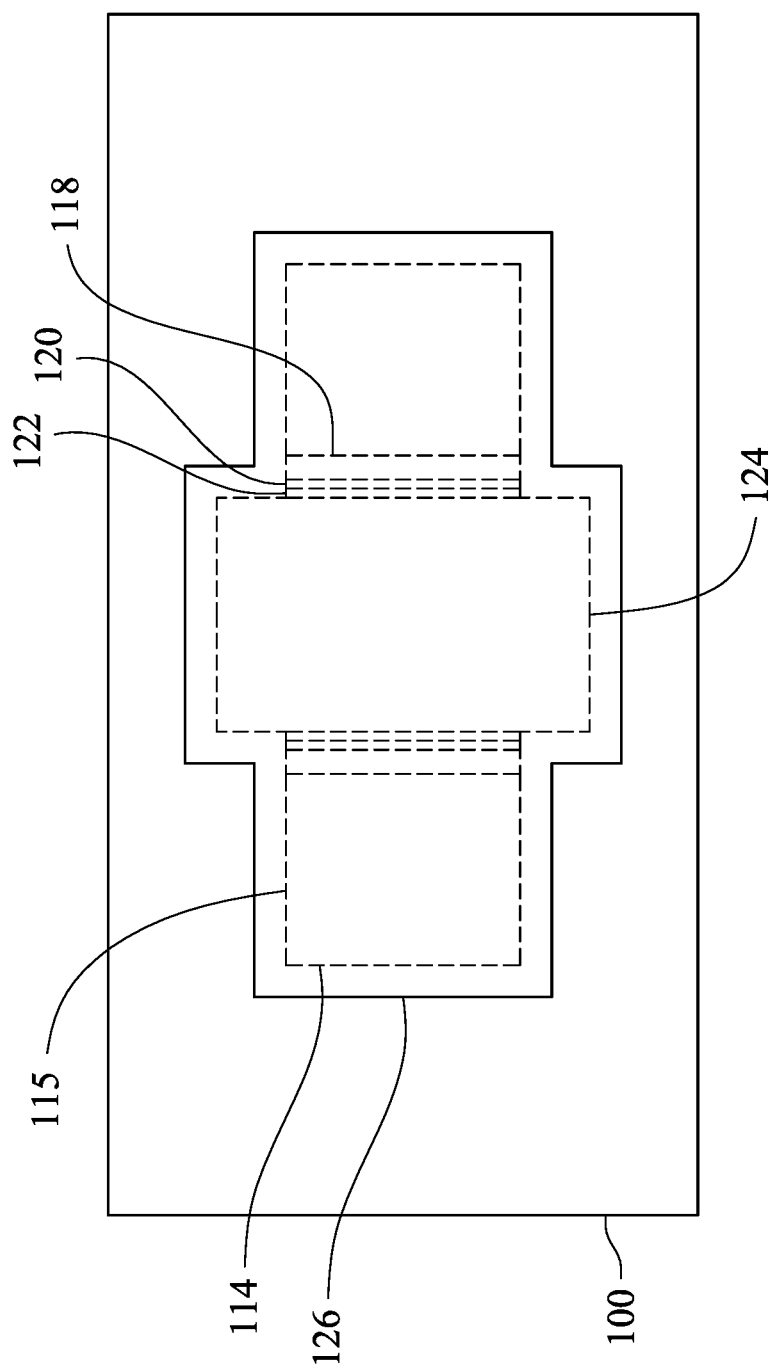
Figure 13C:
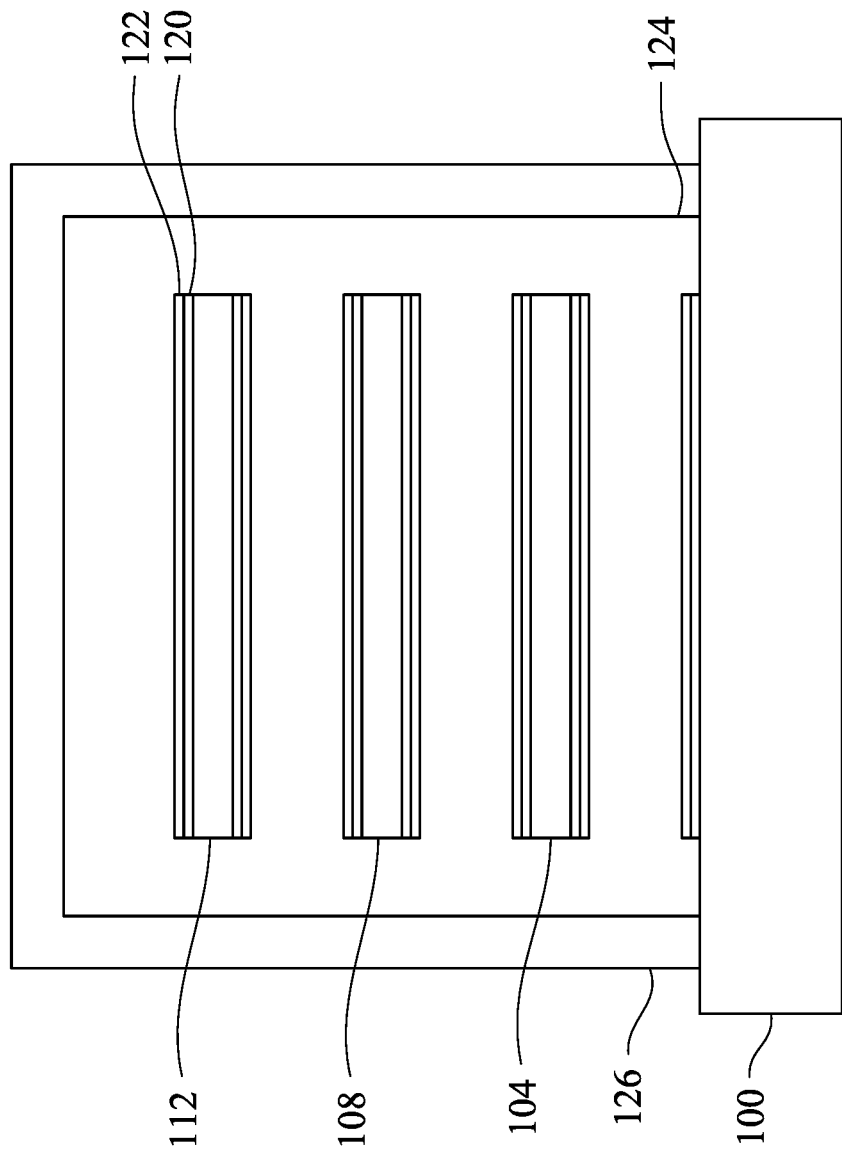

In FIGS. 13A-13B, the protection layer 126 is patterned. The protection layer 126 may be etched by depositing a photoresist (not separately illustrated) over the protection layer 126, exposing the photoresist to a patterned energy source (e.g. a patterned light source), and developing the photoresist. The protection layer 126 may then be etched by an acceptable anisotropic etch process, such as a wet etch process or a dry etch process. The etching may be one or more of any acceptable etch process, such as a reactive ion etch (RIE), a neutral beam etch (NBE), combinations thereof, or the like. After the etch process is complete, the photoresist may be removed, such as by an acceptable ashing process. As illustrated in FIGS. 13A and 13B, the protection layer 126 may be patterned such that the protection layer 126 covers top surfaces and side surfaces of the gate stack and the fin structure 115 and the protection layer 126 is removed from a portion of the top surface of the substrate 100.

Figure 14A:
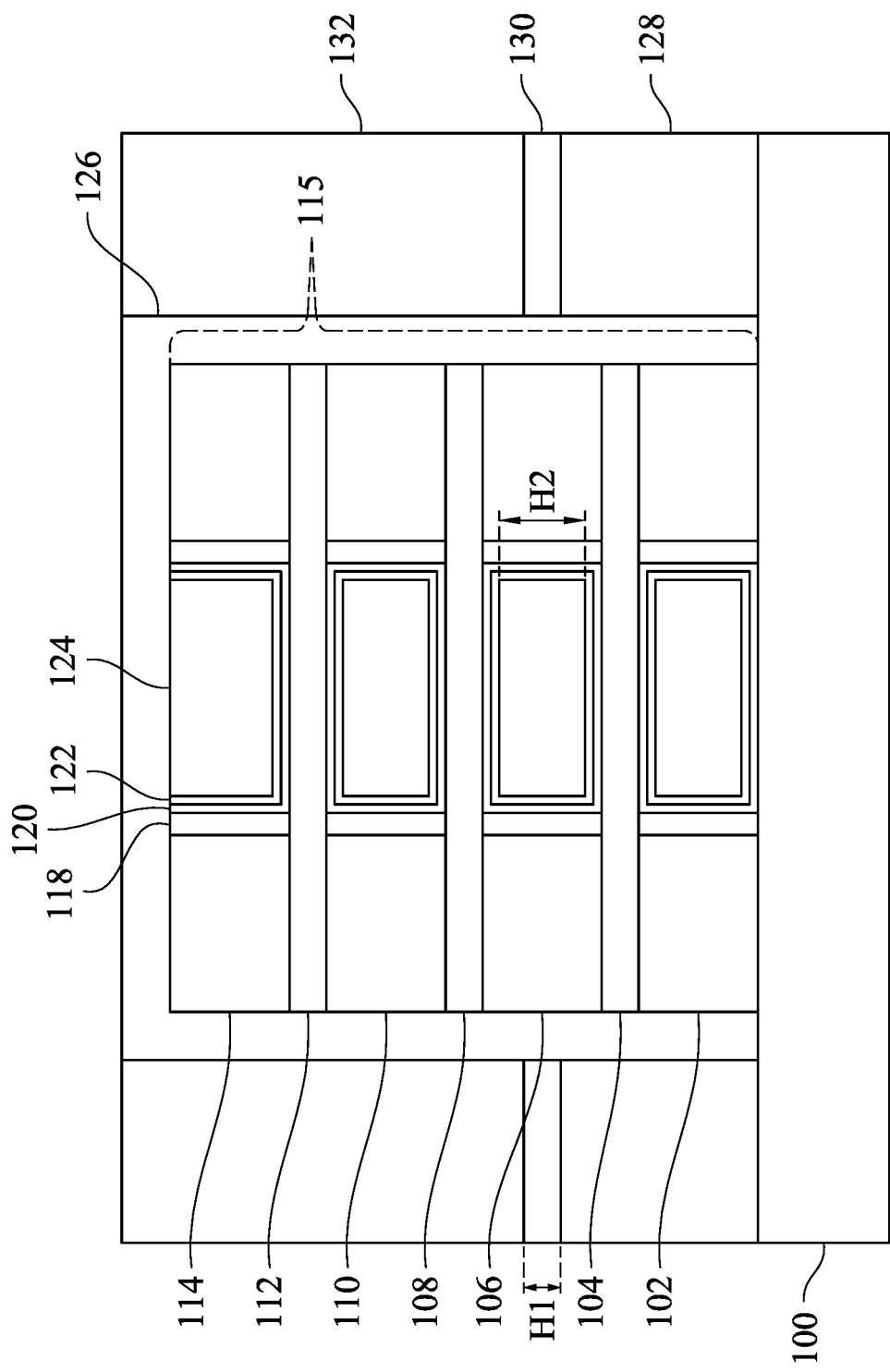
FIGS. 14A-14C illustrate various views of a formation of a first mask, a second mask, and a third mask, in accordance with some embodiments.
Figure 14B:
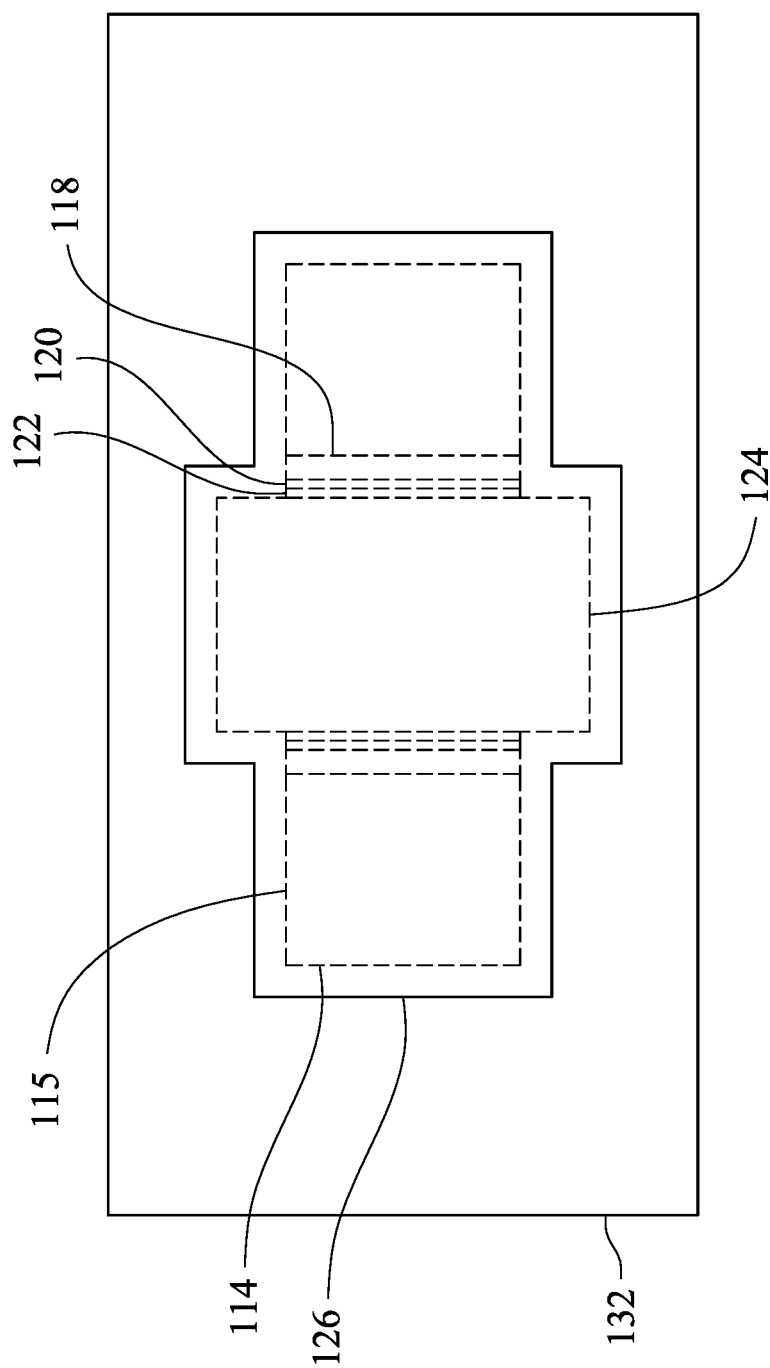
Figure 14C:
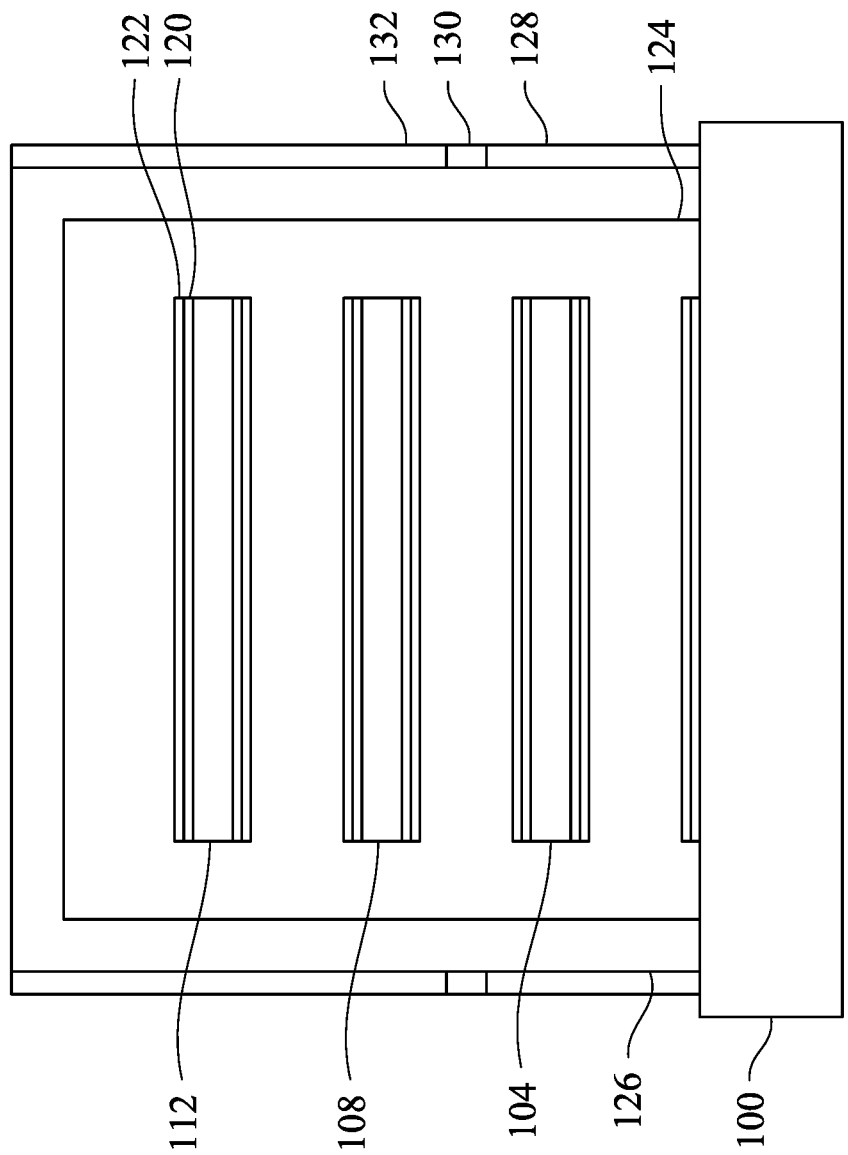

In FIGS. 14A-14C, a first mask 128, a second mask 130, and a third mask 132 (collectively referred to as a mask structure) are formed over the substrate 100. The first mask 128, the second mask 130, and the third mask 132 may be formed by a selective deposition process. For example, in an embodiment, the first mask 128, the second mask 130, and the third mask 132 may be deposited by a selective epitaxial growth (SEG) process, a selective CVD process, a selective ALD process, or the like. In representative embodiments an etching gas (e.g., $SiH_2Cl_2$, HCl, or the like) may be used to control selective growth between silicon areas of the substrate 100 and dielectric surfaces of the protection layer 126. In other embodiments, deposition and etching processes may be separately performed or otherwise separately controlled. For example, an epitaxial deposition process may be performed for non-selective growth of the first mask 128, the second mask 130, and the third mask 132, followed by etching steps to remove deposited material from dielectric surfaces of the protection layer 126 to maintain selectivity.

As illustrated in FIGS. 14A-14C, the first mask 128 may be selectively deposited on the substrate 100 without being deposited on the protection layer 126; the second mask 130 may be selectively deposited on the first mask 128 without being deposited on the protection layer 126; and the third mask 132 may be selectively deposited on the second mask 130 without being deposited on the protection layer 126. As illustrated in FIGS. 14A and 14C, a top surface of the third mask 132 may be level with a top surface of the protection layer 126. As further illustrated in FIGS. 14A and 14C, the first mask 128 may be formed adjacent to the first buffer layer 102, the first channel layer 104, and a portion of the second buffer layer 106; the second mask 130 may be formed adjacent to the second buffer layer 106; and the third mask 132 may be formed adjacent to a portion of the second buffer layer 106, the second channel layer 108, the third buffer layer 110, the third channel layer 112, and the fourth channel layer 114. As will be discussed in detail below in reference to FIGS. 15A-22B, the resulting structure allows for the second buffer layer 106 and portions of the metal pad 124 and the gate electrode disposed in the second buffer layer to be selectively removed and replaced. In other embodiments, the first mask 128, the second mask 130, and the third mask 132 may have different configuration, or may include additional mask layers such that different portions of the fin structure 115 may be selectively removed and replaced.

As illustrated in FIG. 14A, the second mask 130 may have a height H1 that is less than a height H2 of a portion of the metal pad 124 disposed in the second buffer layer 106. As will be discussed in detail below in reference to FIGS. 17A and 17B, this configuration may allow side portions of the gate electrode 122 disposed in the second buffer layer 106 to be removed without removing top and bottom portions of the gate electrode 122 disposed in the second buffer layer 106.

In some embodiments, the first mask 128 may comprise the same material as the third mask 132 and the second mask 130 may comprise a different material than the first mask 128 and the third mask 132. For example, the first mask 128 and the third mask 132 may comprise silicon (Si). The second mask 130 may comprise silicon germanium represented by the formula $Si_xGe_y$, wherein x is about 0.8 and y is about 0.2.

Figure 15A:
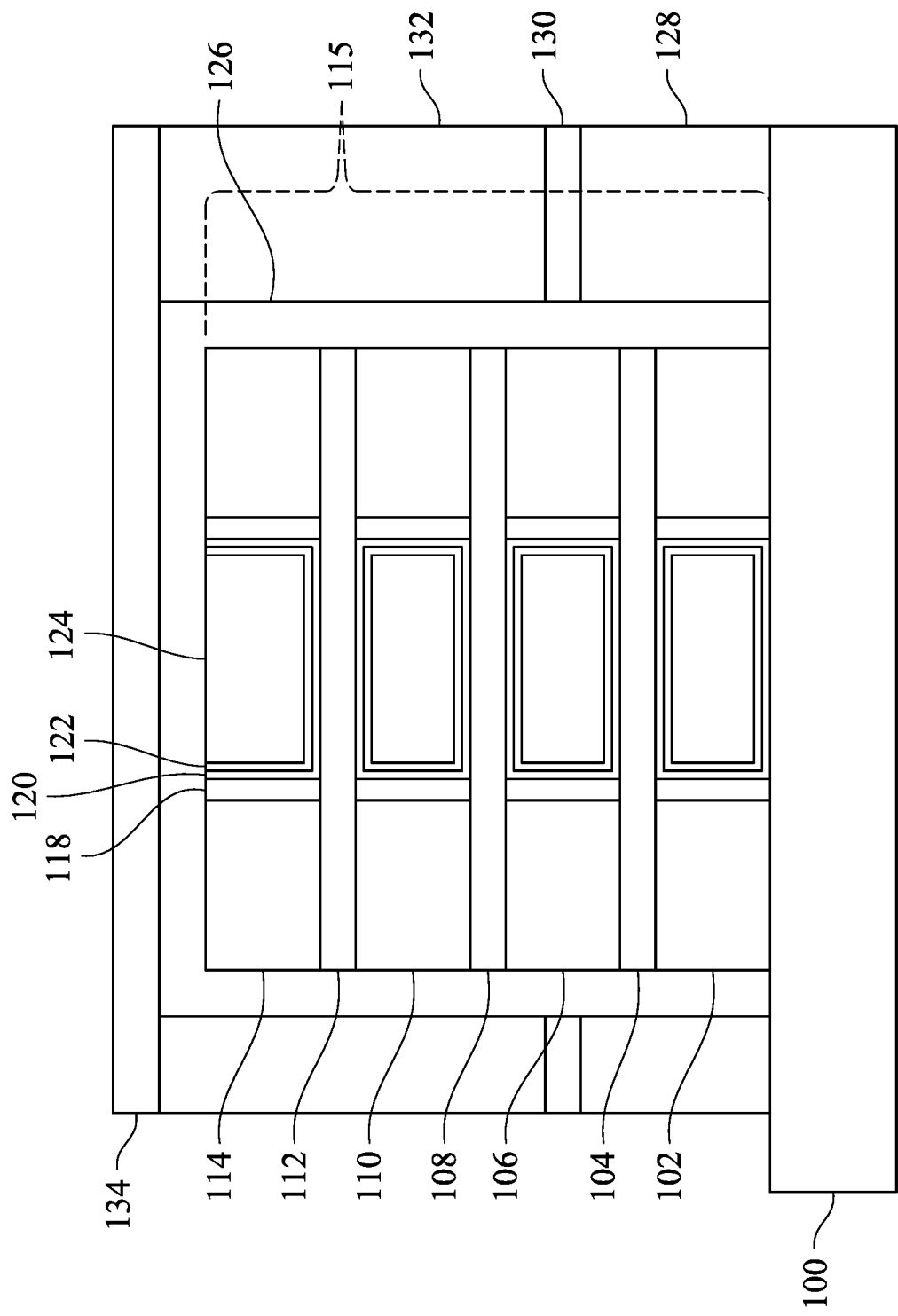
FIGS. 15A-15C illustrate various views of a formation of a first photoresist and a removal of portions of the first mask, the second mask, and the third mask, in accordance with some embodiments.
Figure 15B:
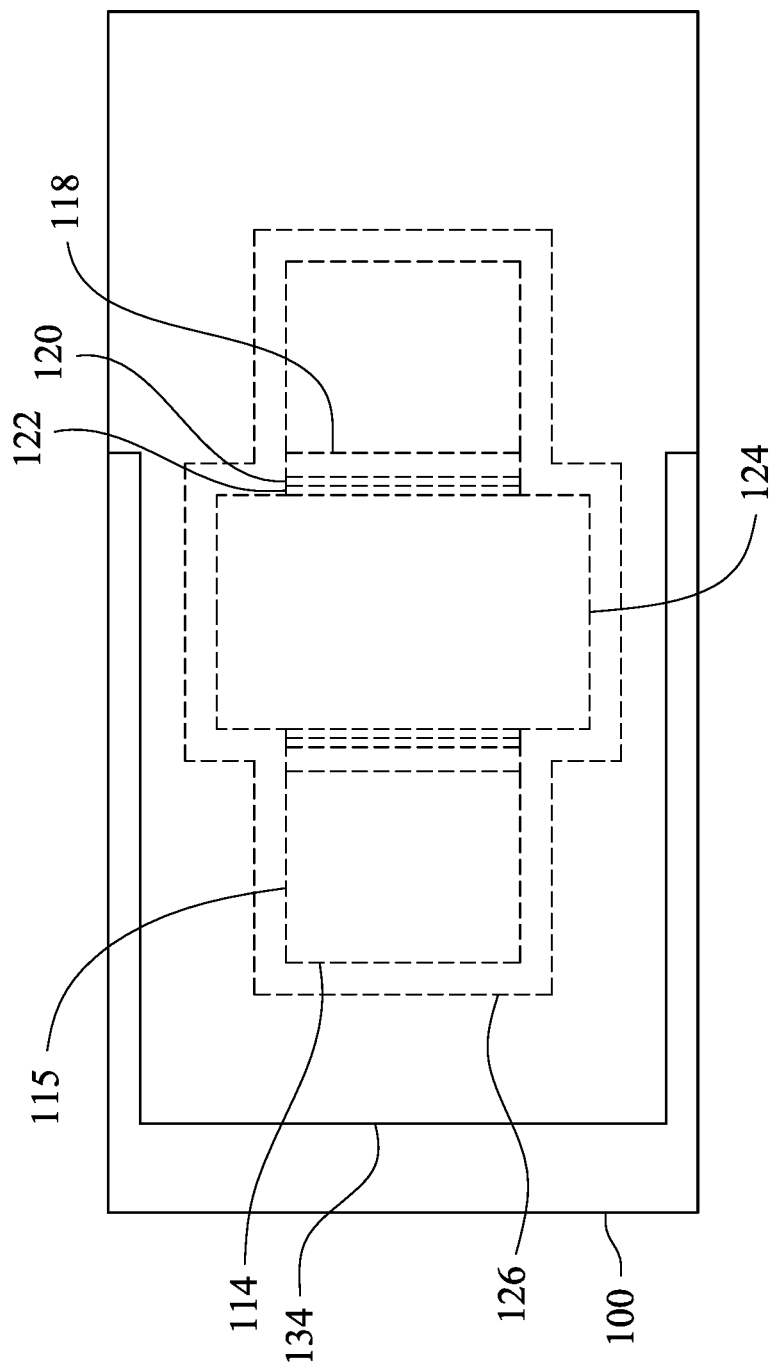
Figure 15C:
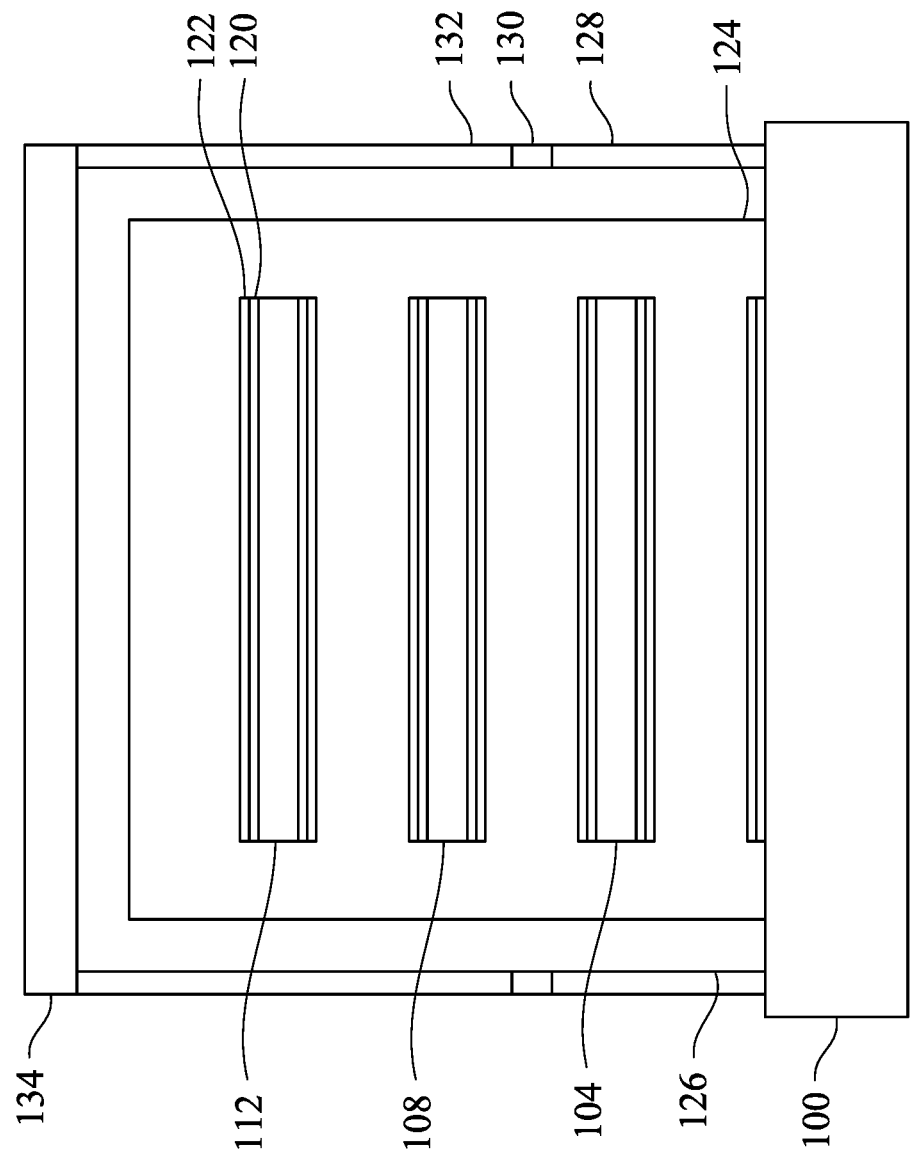
Figure 16A:
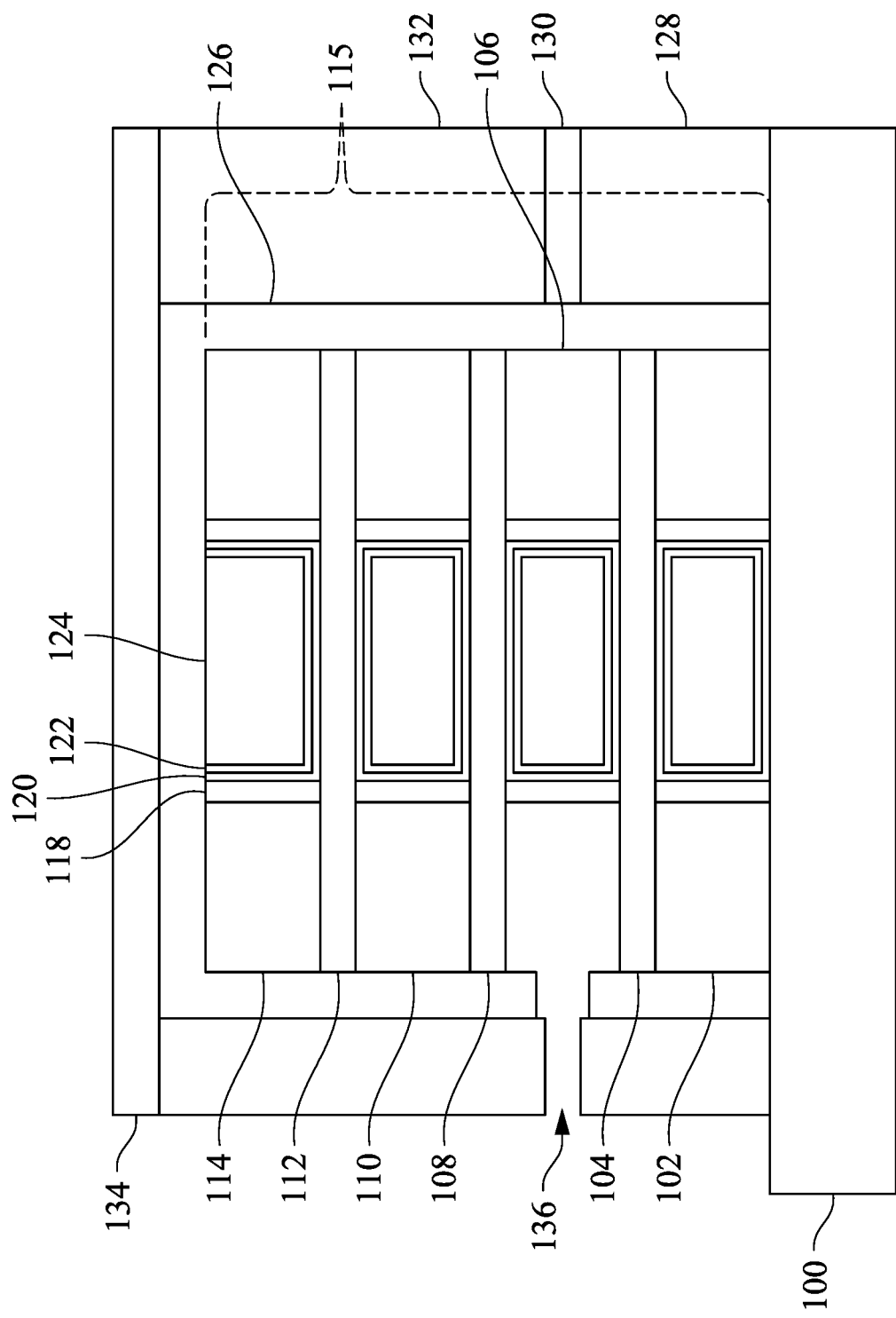

In FIGS. 15A-15C, a first photoresist 134 is formed over the third mask 132 and the protection layer 126 and the third mask 132, the second mask 130, and the first mask 128 are etched using the first photoresist 134. The first photoresist 134 may be deposited using a spin-on technique or the like. The first photoresist 134 may be patterned by exposing the first photoresist 134 to a patterned energy source (e.g., a patterned light source, an electron beam (e-beam) source, or the like) and exposing the patterned first photoresist 134 to a developer solution. The developer solution may remove a portion of the first photoresist 134 such that at least a portion of the third mask 132 is exposed.

The third mask 132, the second mask 130, and the first mask 128 may then be etched by an anisotropic etch process to expose the substrate 100. In some embodiments, the third mask 132, the second mask 130, and the first mask 128 may be etched by a dry etch process such as reactive-ion etching (RIE), neutral-beam etching (NBE), combinations thereof, or the like. The third mask 132, the second mask 130, and the first mask 128 may be etched by separate etch processes. As illustrated in FIGS. 15A and 15B, the first photoresist 134 is provided such that the third mask 132, the second mask 130, and the first mask 128 may be anisotropically etched on a first side of the gate stack, without etching the third mask 132, the second mask 130, and the first mask 128 on a second side of the gate stack opposite the first side of the gate stack. The first mask 128, the second mask 130, and the third mask 132 on the second side of the gate stack may extend to other fin structures (not separately illustrated), or may be protected by an additional photoresist (not separately illustrated), such that the structure of FIGS. 15A-15C allows for an etchant (discussed below in reference to FIGS. 16A-16C) to etch through sidewalls of the second mask 130 on the first side of the gate stack, without etching the second mask 130 on the second side of the gate stack.

Figure 16C:
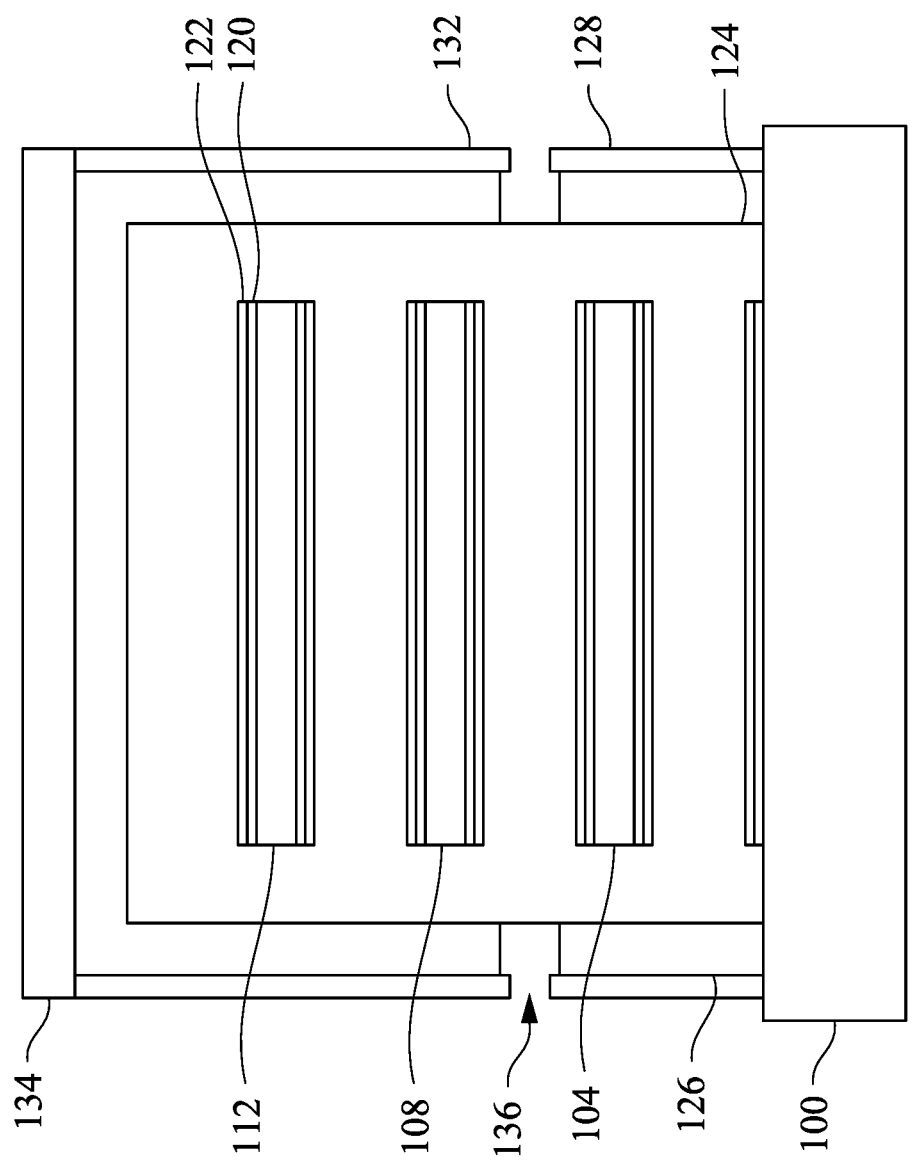

In FIGS. 16A-16C, the second mask 130, a portion of the protection layer 126, and the second buffer layer 106 on the first side of the gate stack are removed to form a second opening 136. The second mask 130, the portion of the protection layer 126, and the second buffer layer 106 may be removed by a suitable etching process, such as an isotropic etching process. In some embodiments, the second mask 130, the portion of the protection layer 126, and the second buffer layer 106 may be removed by a wet etch process. For example, the second mask 130 may be removed by a wet etch process using a solution including tetrafluoromethane ($CF_4$) or the like. The portion of the protection layer 126 may be removed by a wet etch process using a solution including hydrofluoric acid (HF), trifluoromethane ($CHF_3$), combinations thereof, or the like. The second buffer layer 106 may be removed by a wet etch process using a solution including tetrafluoromethane ($CF_4$) or the like.

As illustrated in FIGS. 16A-16C, the second mask 130, the portion of the protection layer 126, and the second buffer layer 106 may be removed in areas adjacent to exposed regions of the substrate 100, without being removed from areas covered by the first photoresist 134. In some embodiments, such as the embodiments illustrated in FIGS. 16A and 16B, the second buffer layer 106 may be completely removed from the first side of the gate stack. As further illustrated in FIGS. 16A and 16B, the first mask 128 and the third mask 132 protect the first buffer layer 102, the third buffer layer 110, and the fourth buffer layer 114 from the etching process used to remove the second buffer layer 106. In other embodiments, the first mask 128, the second mask 130, and the third mask 132 may have different configurations such that any of the first buffer layer 102, the second buffer layer 106, the third buffer layer 110, the fourth buffer layer 114, or a combination thereof may selectively be removed.

Figure 17A:
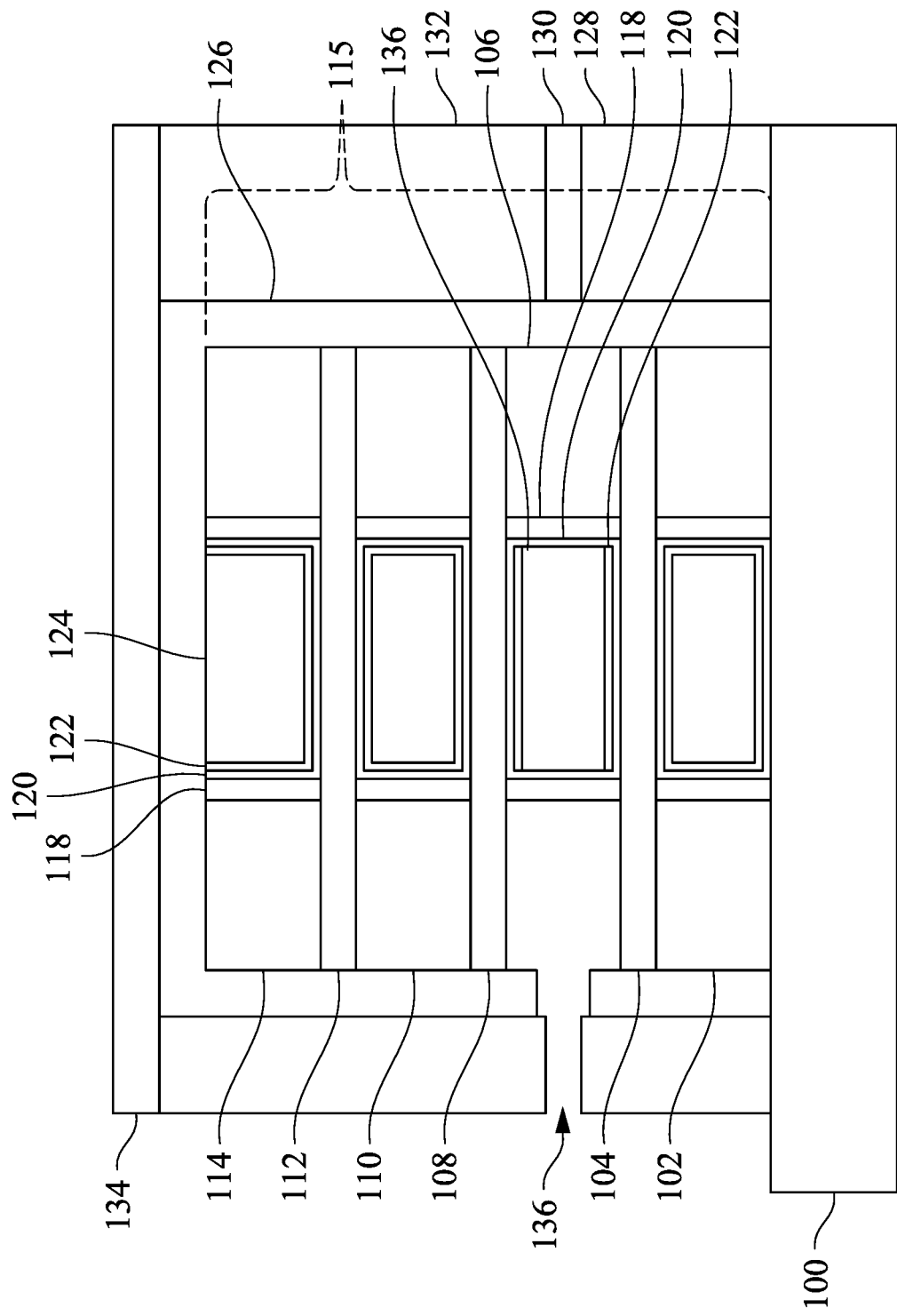
FIGS. 17A and 17B illustrate various views of an expansion of the first opening, in accordance with some embodiments.
Figure 17B:
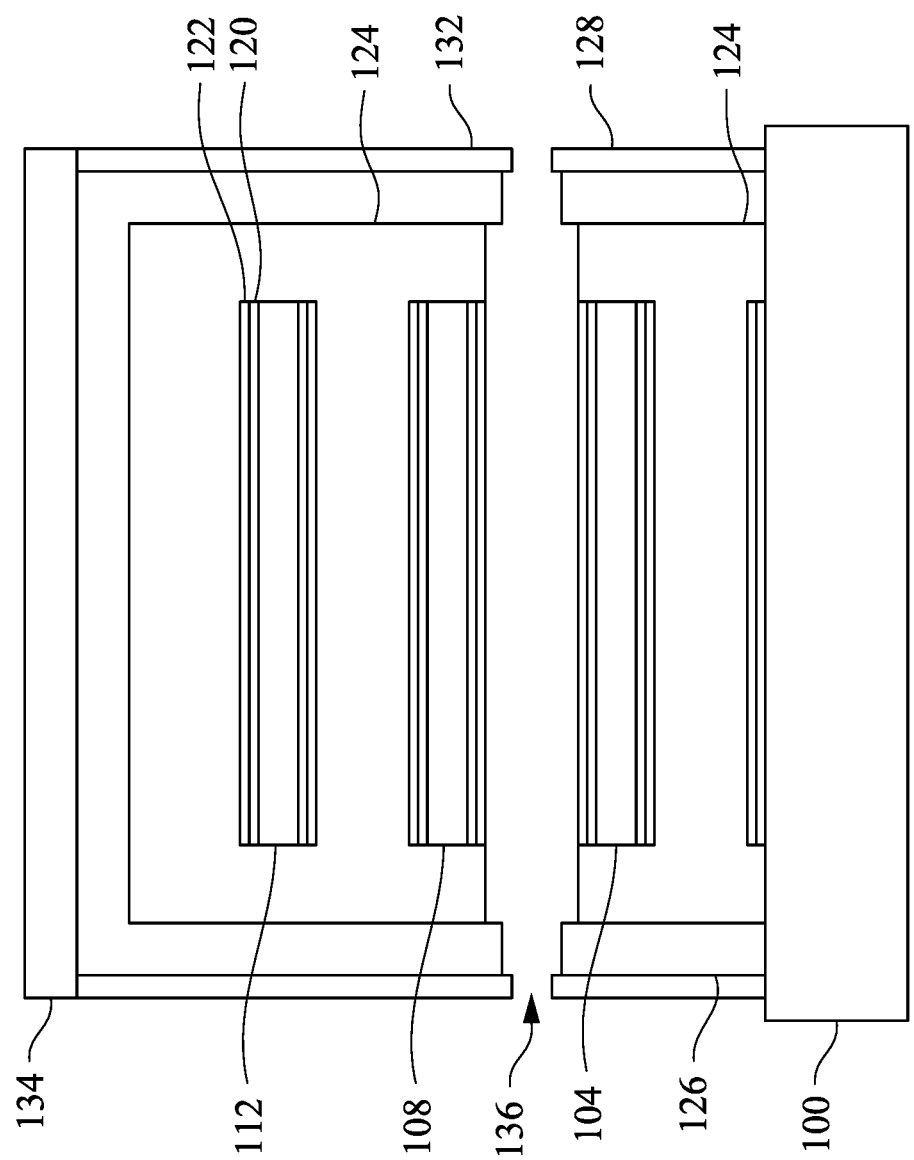

In FIGS. 17A and 17B, portions of the gate electrode 122 disposed in the second buffer layer 106 and a portion of the metal pad 124 are removed to extend the second opening 136. The portion of the gate electrode 122 and the portion of the metal pad 124 may be removed by a suitable etching process, such as an isotropic etching process. The portions of the gate electrode 122 remaining after the gate electrode 122 is etched, the gate insulator 120 disposed between the first channel layer 104 and the second channel layer 108, and the gate spacers 118 disposed between the first channel layer 104 and the second channel layer 108 may be collectively referred to as a residual gate stack.

As illustrated in FIGS. 17A and 17B, side portions of the gate electrode 122 disposed in the second buffer layer 106 may be removed without removing top and bottom portions of the gate electrode 122 disposed in the second buffer layer 106. Because the second mask 130 has a smaller height H1 than the height H2 of the metal pad 124 disposed in the second buffer layer 106 (see FIG. 14A), the side portions of the gate electrode 122 may be etched first, without etching the top and bottom portions of the gate electrode 122. This process allows for independent gate control of a subsequently formed first MOSFET 164 and second MOSFET 166 (discussed below in reference to FIGS. 28A-28C), without affecting the work function of the first MOSFET 164 and the second MOSFET 166. In some embodiments, the portion of the gate electrode 122 may be removed by a wet etch process. For example, the portion of the gate electrode 122 may be removed by a wet etch process using a solution including ammonium hydroxide ($NH_4OH$), hydrogen peroxide ($H_2O_2$), and water ($H_2O$), or the like.

After the side portions of the gate electrode 122 are selectively removed, the metal pad 124 may be etched by a subsequent etch process. As illustrated in FIG. 17B, the portion of the metal pad 124 may be removed by etching the metal pad 124 laterally through the second opening 136 formed in the protection layer 126. In some embodiments, the portion of the metal pad 124 may be removed by a wet etch process. For example, the portion of the metal pad 124 may be removed by a wet etch process using a solution including phosphoric acid ($H_3PO_4$), nitric acid ($HNO_3$), and water ($H_2O$), or the like.

As illustrated in FIG. 17A, the gate spacer 118, the gate insulator 120, and top and bottom portions of the gate electrode 122 remain in the second buffer layer 106 after the gate electrode 122 and the metal pad 124 are etched. Moreover, as illustrated in FIG. 17B, the second opening 136 may separate a first portion of the metal pad 124 disposed below the second opening 136 from a second portion of the metal pad 124 disposed above the second opening 136 and the second opening 136 may separate the top and bottom portions of the gate electrode disposed in the second buffer layer 106. As further illustrated in FIGS. 17A and 17B, the first mask 128 and the third mask 132 protect portions of the metal pad 124 and the gate electrodes disposed in the first buffer layer 102, the third buffer layer 110, and the fourth buffer layer 114 from the etching process used to remove the portion of the metal pad 124 and the gate electrode disposed in the second buffer layer 106.

Figure 18A:
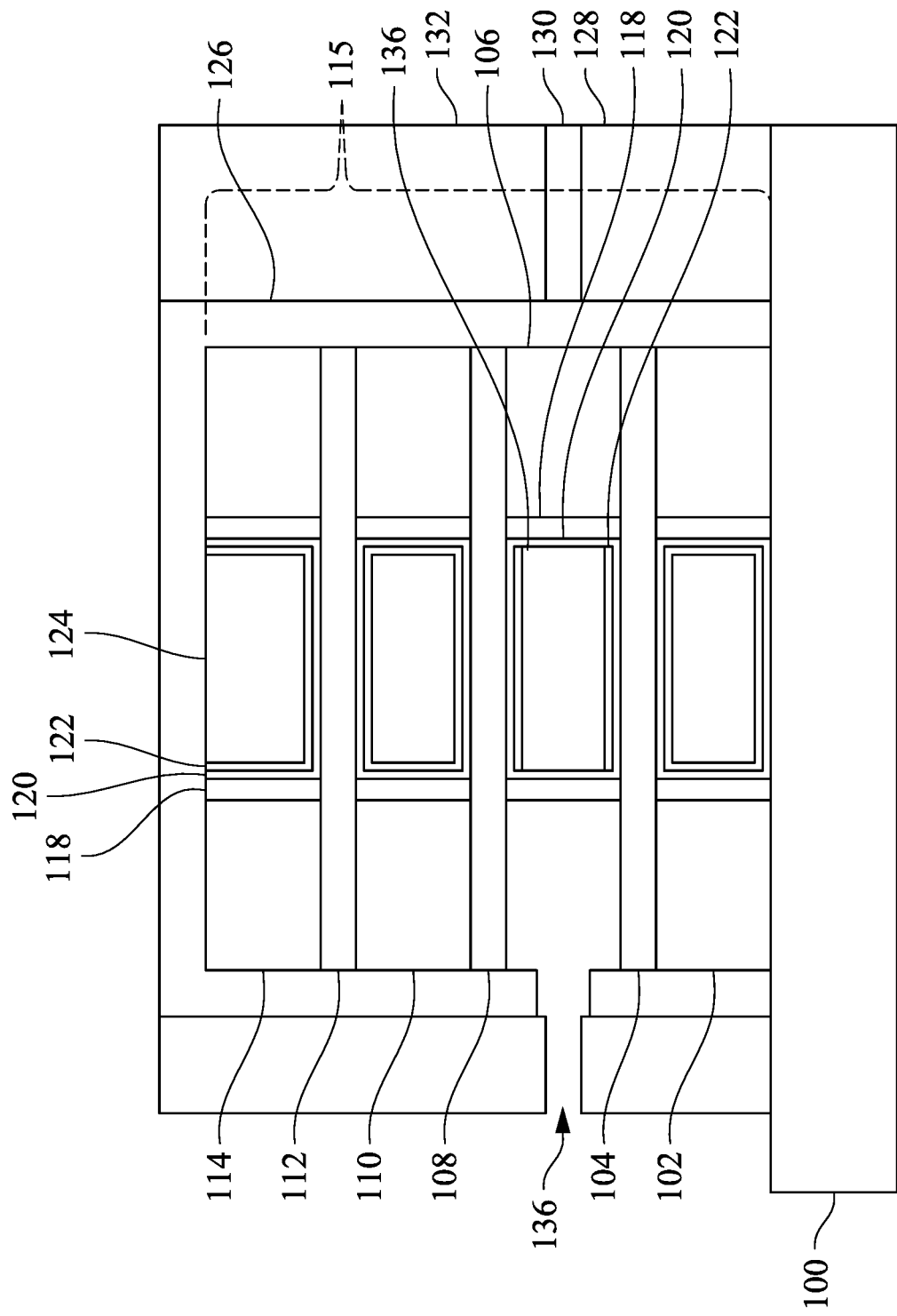
FIGS. 18A-18C illustrate various views of a removal of the first photoresist, in accordance with some embodiments.
Figure 18B:
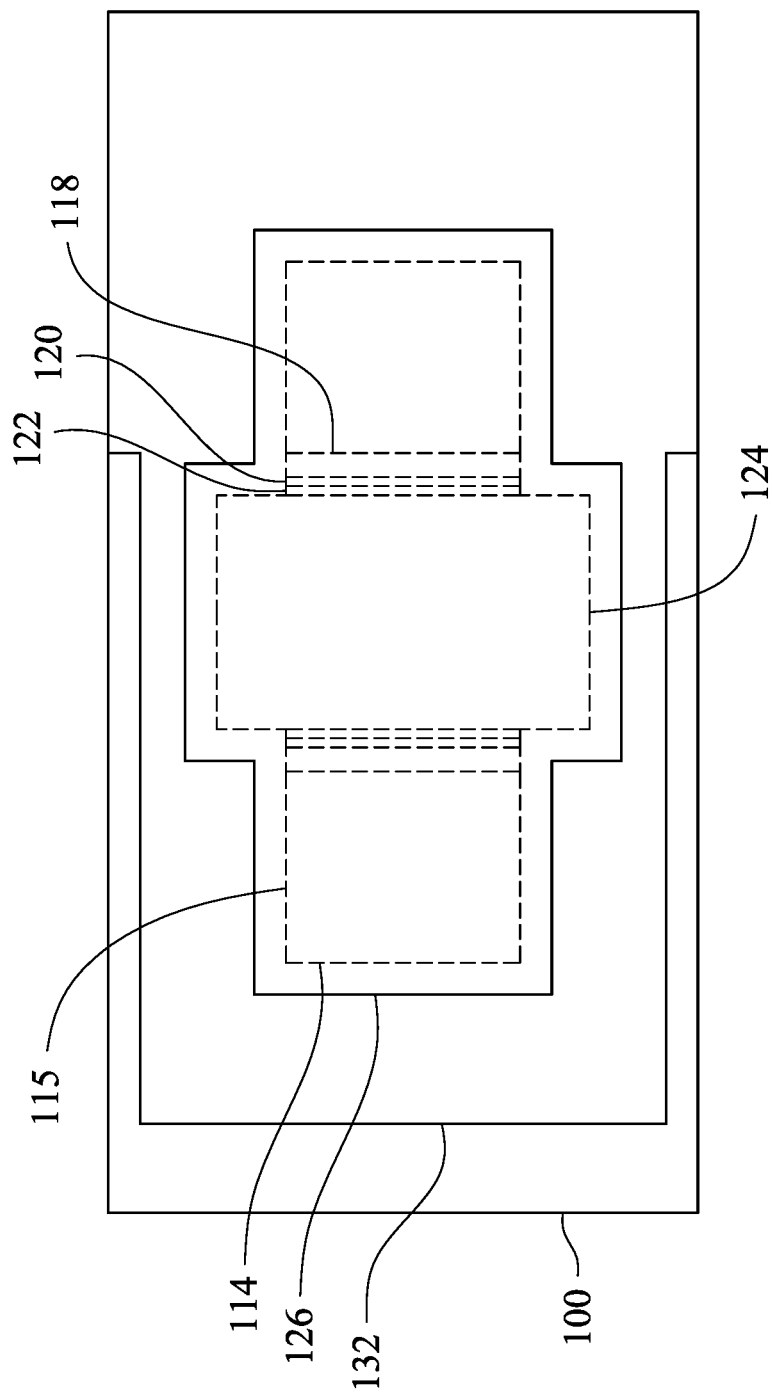
Figure 18C:
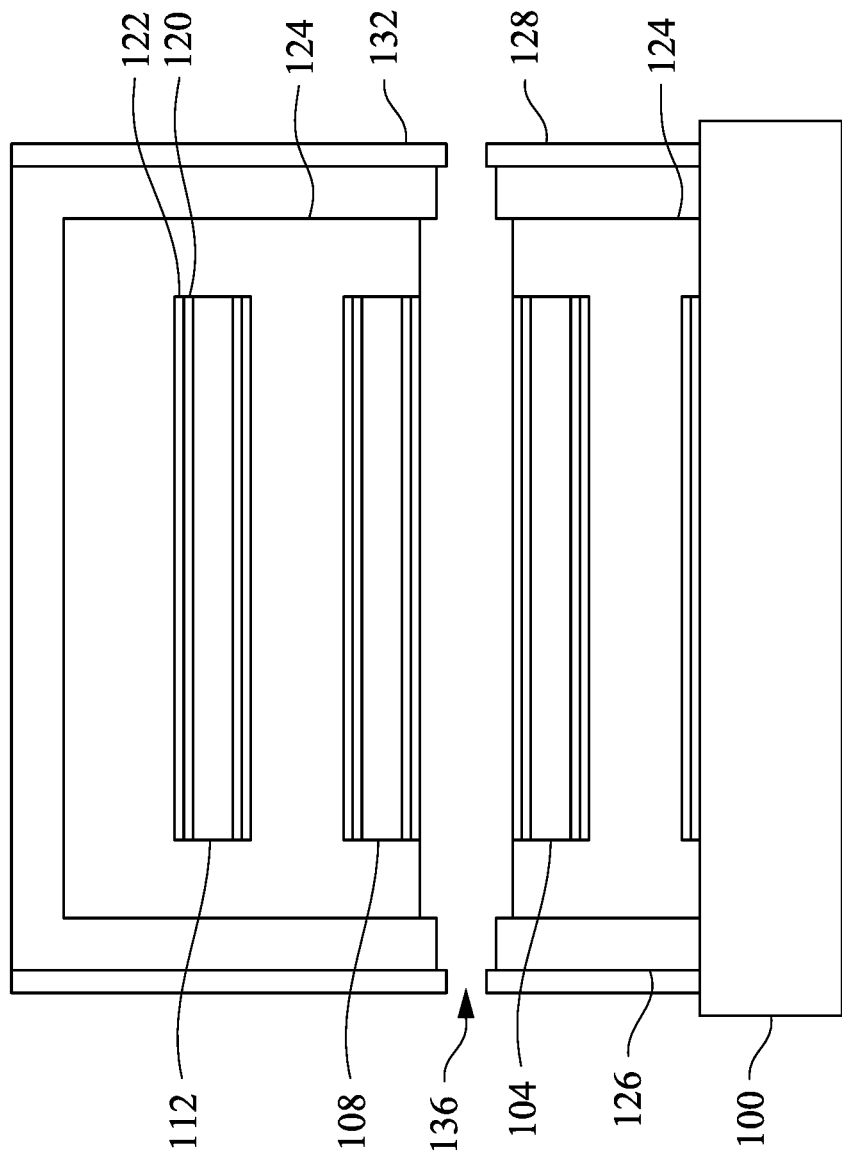

In FIGS. 18A-18C, the first photoresist 134 is removed. The first photoresist 134 may be removed by using suitable photoresist stripping techniques such as chemical solvent cleaning, plasma ashing, dry stripping and/or the like.

Figure 19A:
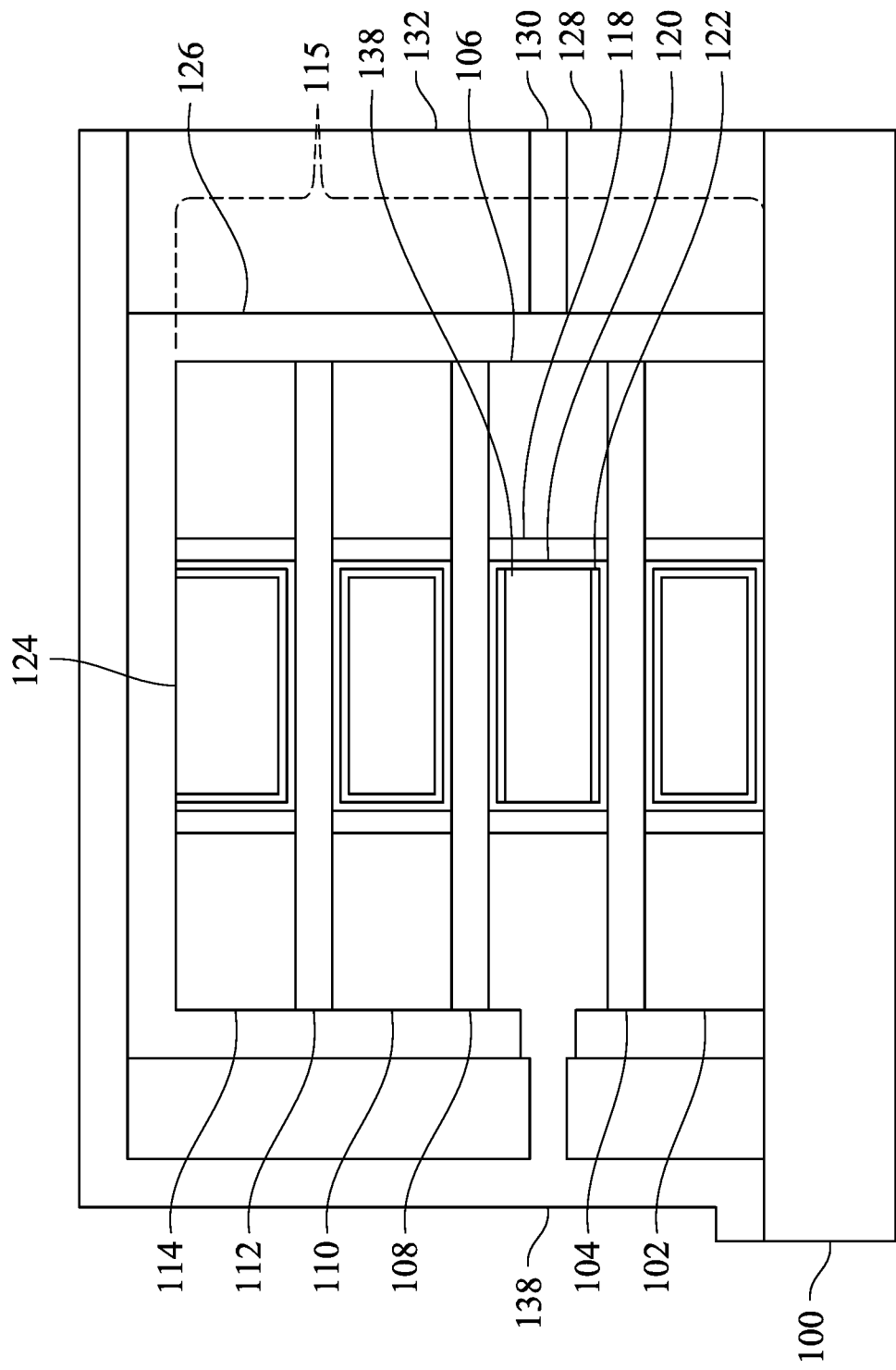
FIGS. 19A and 19B illustrate various views of a formation of a first isolation layer, in accordance with some embodiments.
Figure 19B:
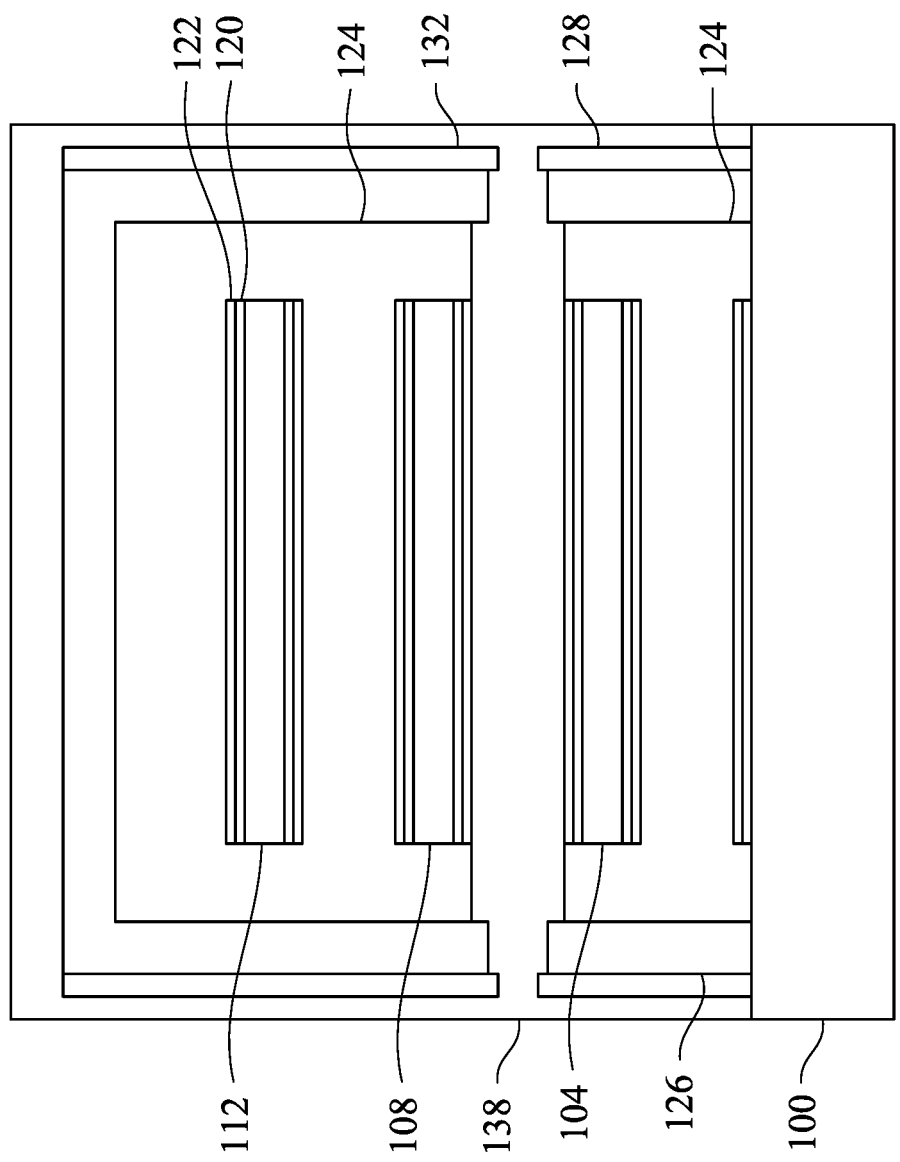

In FIGS. 19A and 19B, a first isolation layer 138 is formed in the second opening 136, over the substrate 100, over the first mask 128, over the third mask 132, and over the protection layer 126. The first isolation layer 138 may be formed by conformally depositing one or more layers. In an embodiment, the first isolation layer 138 may be deposited by a conformal deposition process such as CVD, ALD, or the like. The first isolation layer 138 may be formed of a material such as silicon dioxide ($SiO_2$), silicon nitride, porous silicon nitride ($Si_3N_4$), silicon oxynitride, silicon carbon nitride, multiple layers or combinations thereof, or the like. As illustrated in FIGS. 19A and 19B, the first isolation layer 138 may fill the second opening 136 and may extend along top surfaces of the substrate 100, the third mask 132, and the protection layer 126 and along side surfaces of the first mask 128 and the third mask 132.

Figure 20A:
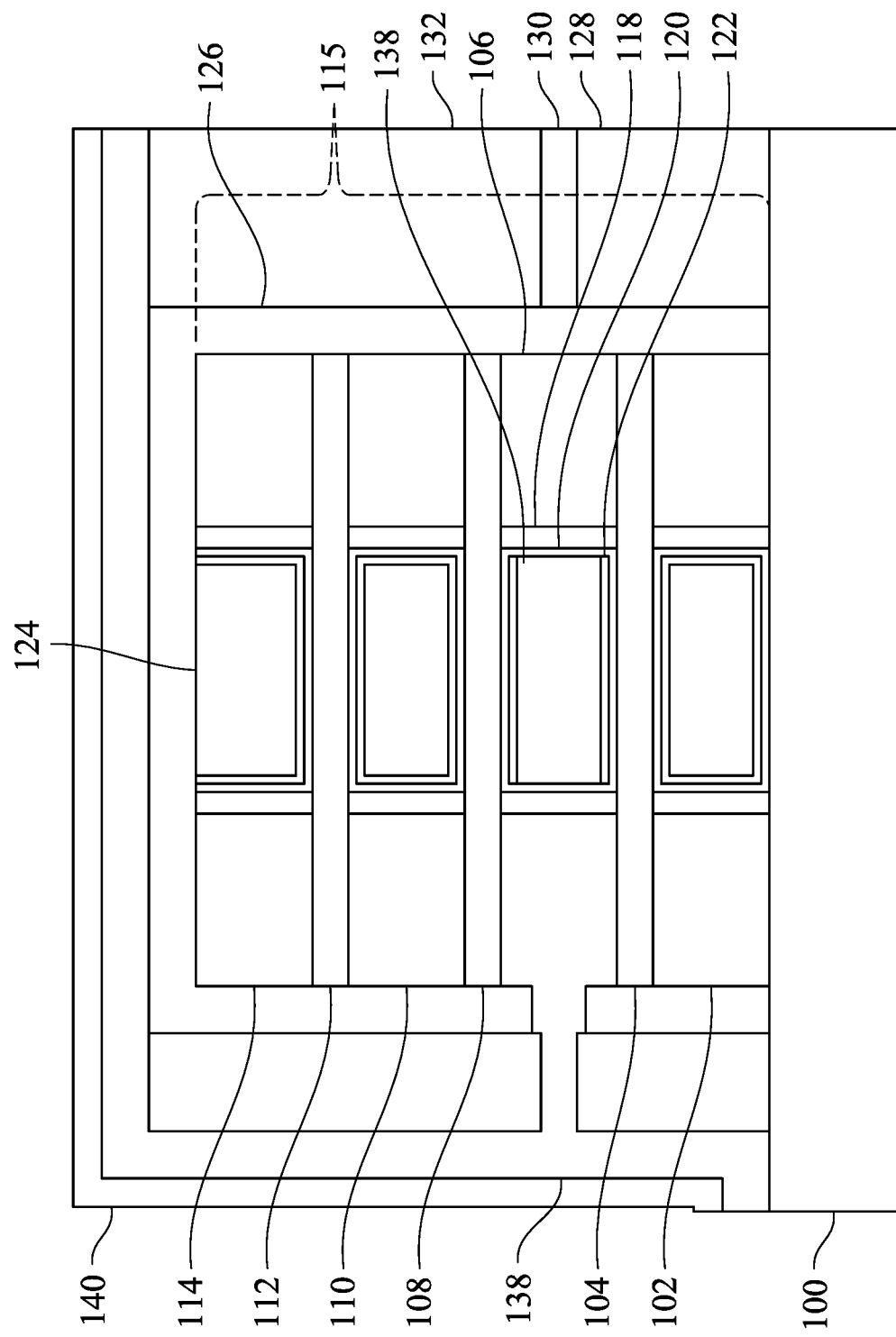
FIGS. 20A-20C illustrate various views of a formation of a second photoresist, in accordance with some embodiments.
Figure 20B:
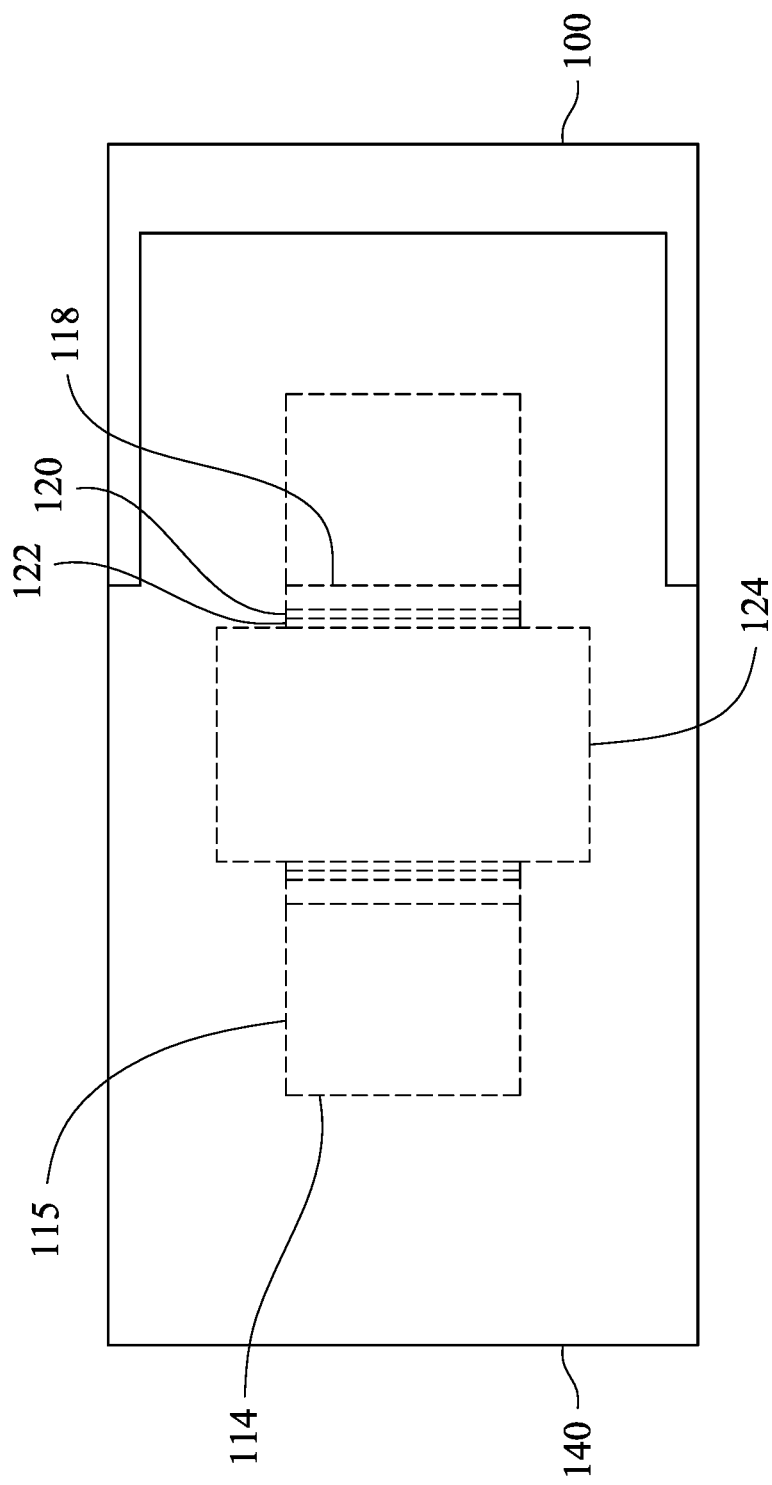
Figure 20C:
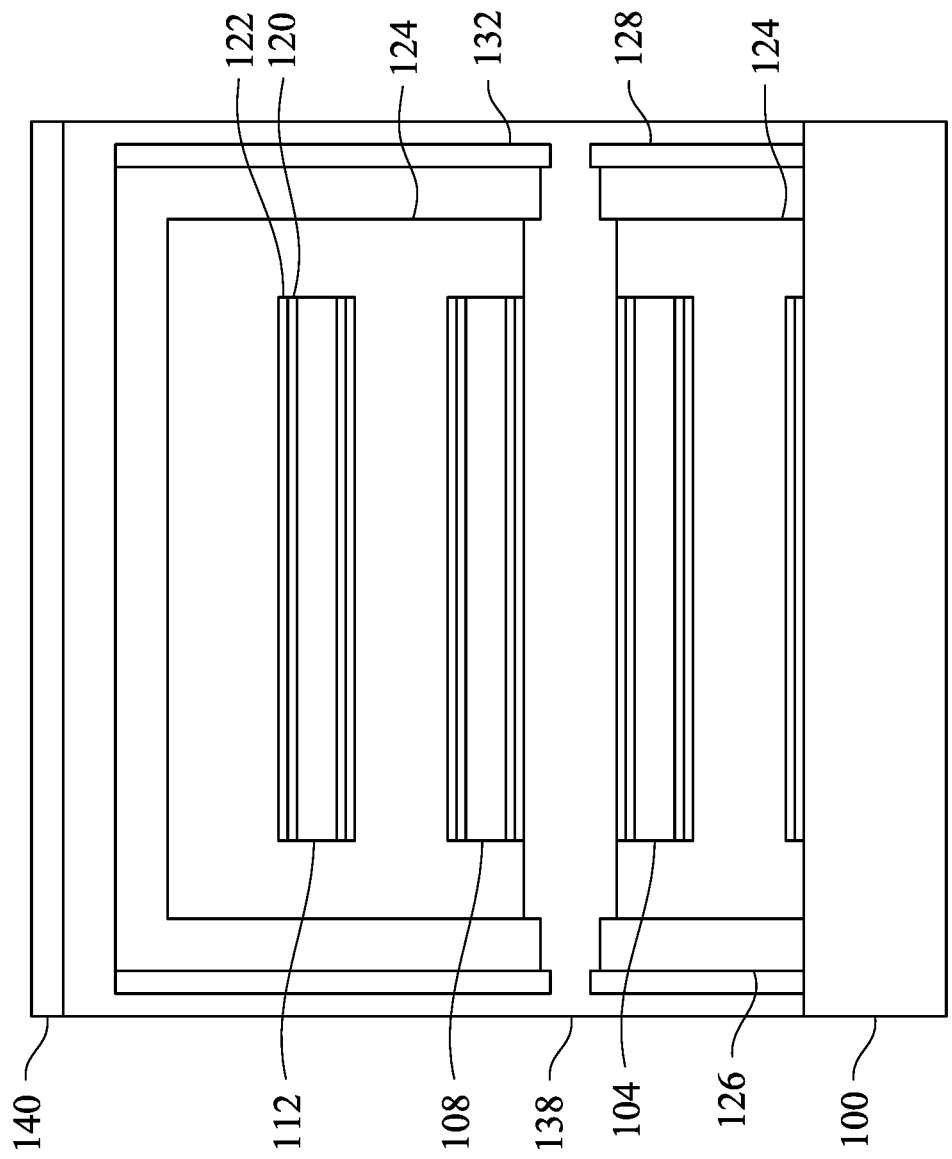

In FIGS. 20A-20C, a second photoresist 140 is formed over the first isolation layer 138 and the first isolation layer 138, the third mask 132, the second mask 130, and the first mask 128 are etched using the second photoresist 140. The second photoresist 140 may be deposited using a spin-on technique or the like. The second photoresist 140 may be patterned by exposing the second photoresist 140 to a patterned energy source (e.g., a patterned light source, an electron beam (e-beam) source, or the like) and exposing the patterned second photoresist 140 to a developer solution. The developer solution may remove a portion of the second photoresist 140 such that at least a portion of the first isolation layer 138 is exposed.

The first isolation layer 138, the third mask 132, the second mask 130, and the first mask 128 may then be etched by an anisotropic etch process to expose the substrate 100. In some embodiments, the first isolation layer 138, the third mask 132, the second mask 130, and the first mask 128 may be etched by a dry etch process such as reactive-ion etching (RIE), neutral-beam etching (NBE), combinations thereof, or the like. The first isolation layer 138, the third mask 132, the second mask 130, and the first mask 128 may be etched by separate etch processes. As illustrated in FIGS. 19A and 19B, the first isolation layer 138, the third mask 132, the second mask 130, and the first mask 128 may be etched on the second side of the gate stack (discussed above in reference to FIGS. 15A-15C). The resulting structure allows for an etchant (discussed below in reference to FIG. 21) to etch through sidewalls of the second mask 130 on the second side of the gate stack.

Figure 21:
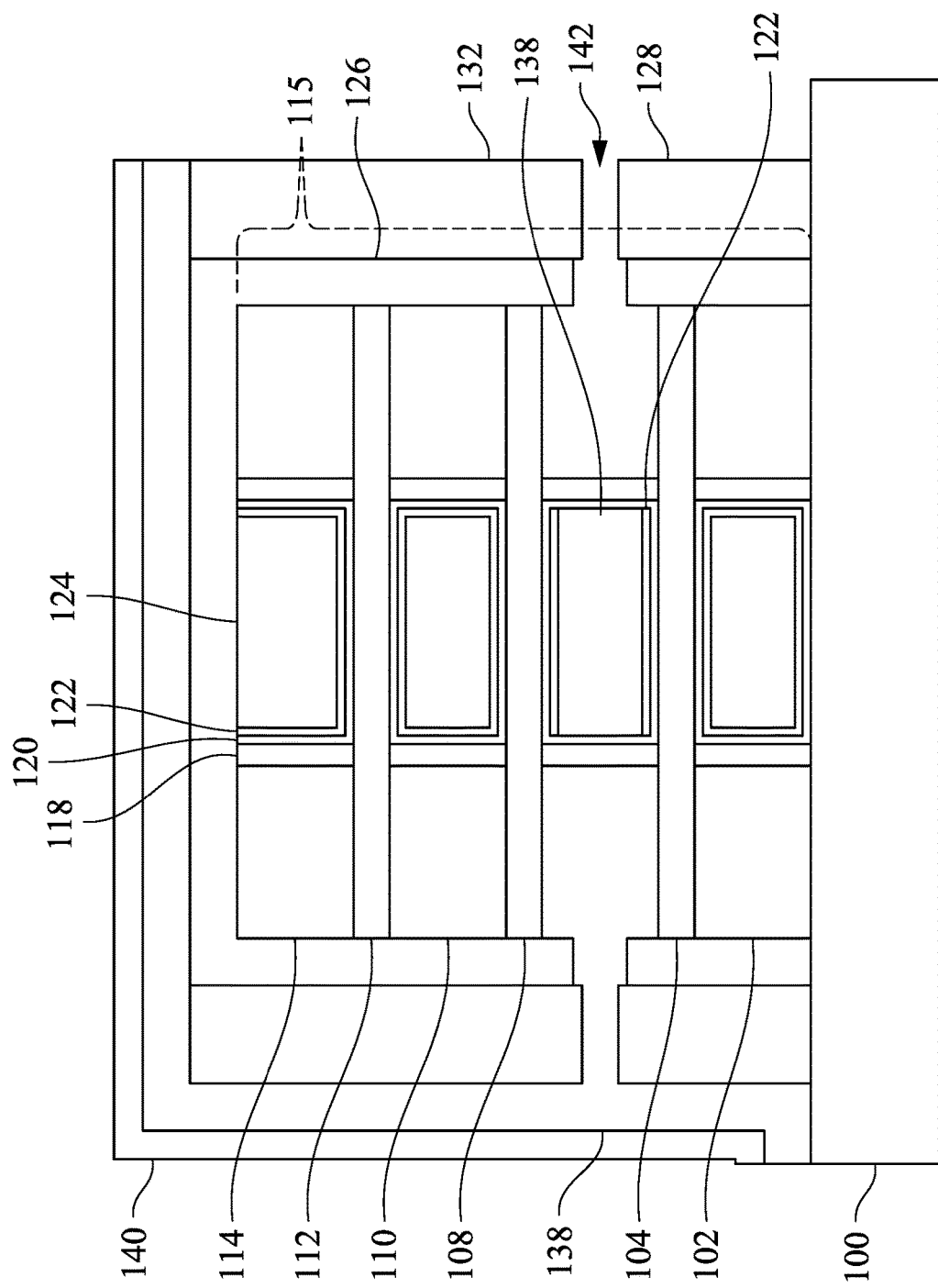
FIG. 21 illustrates a cross-sectional view of a formation of a second opening, in accordance with some embodiments.

In FIG. 21, the second mask 130, a portion of the protection layer 126 on the second side of the gate stack, and the remaining portion of the second buffer layer 106 are removed to form a third opening 142. The second mask 130, the portion of the protection layer 126, and the second buffer layer 106 may be removed by a suitable etching process, such as an isotropic etching process. In some embodiments, the second mask 130, the portion of the protection layer 126, and the second buffer layer 106 may be removed by a wet etch process. For example, the second mask 130 may be removed by a wet etch process using a solution including tetrafluoromethane ($CF_4$) or the like. The portion of protection layer 126 may be removed by a wet etch process using a solution including hydrofluoric acid (HF), trifluoromethane ($CHF_3$), combinations thereof, or the like. The second buffer layer 106 may be removed by a wet etch process using a solution including tetrafluoromethane ($CF_4$) or the like.

As illustrated in FIG. 21, the second mask 130, the portion of the protection layer 126, and the second buffer layer may be removed in areas adjacent to exposed regions of the substrate 100. In some embodiments, such as the embodiment illustrated in FIG. 21, the second buffer layer 106 may be completely removed from the second side of the gate stack. As further illustrated in FIG. 21, the first mask 128 and the third mask 132 protect the first buffer layer 102, the third buffer layer 110, and the fourth buffer layer 114 from the etching process used to remove the second buffer layer 106.

Figure 22A:
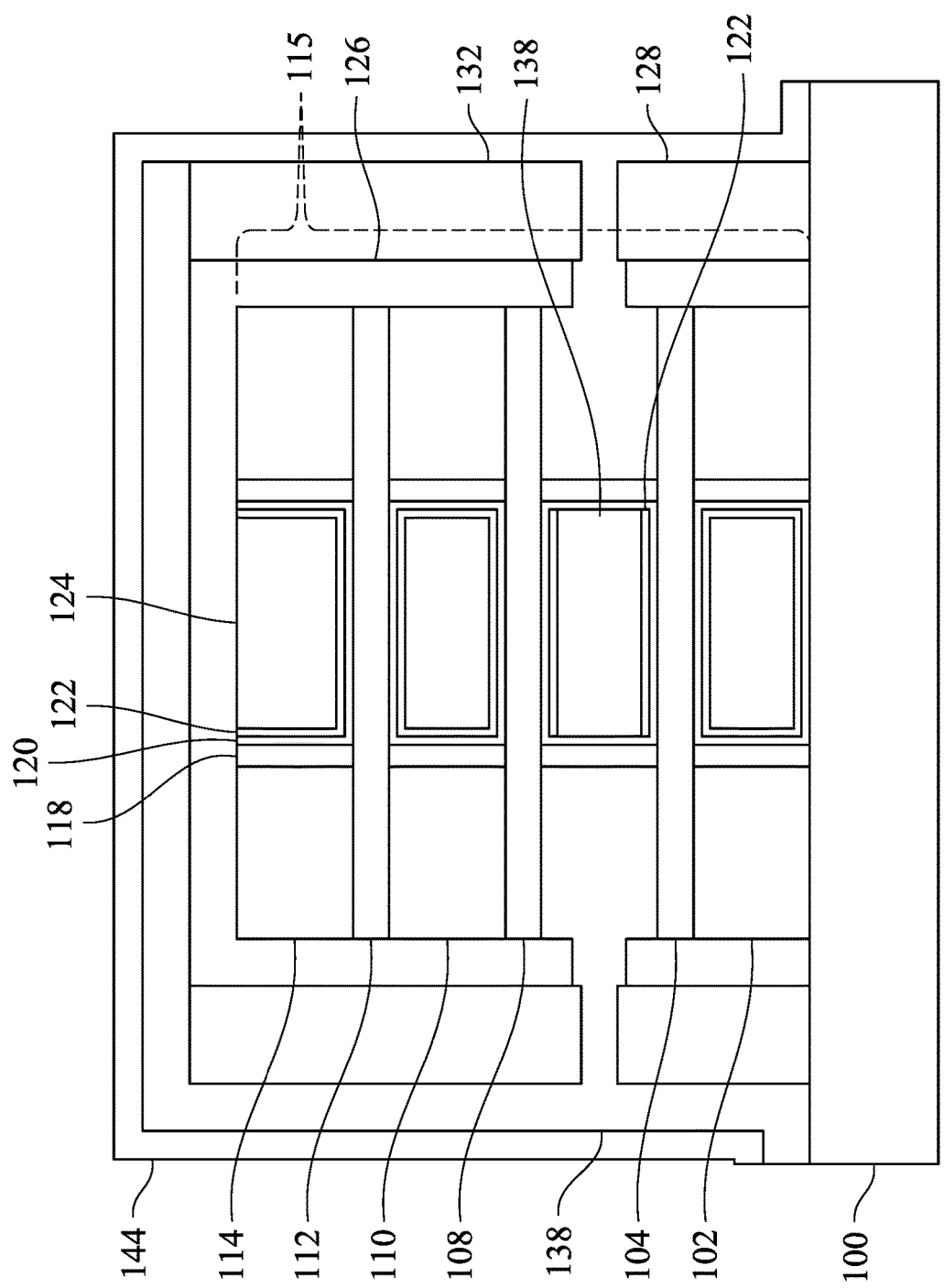
FIGS. 22A and 22B illustrate various views of a formation of a second isolation layer, in accordance with some embodiments.
Figure 22B:
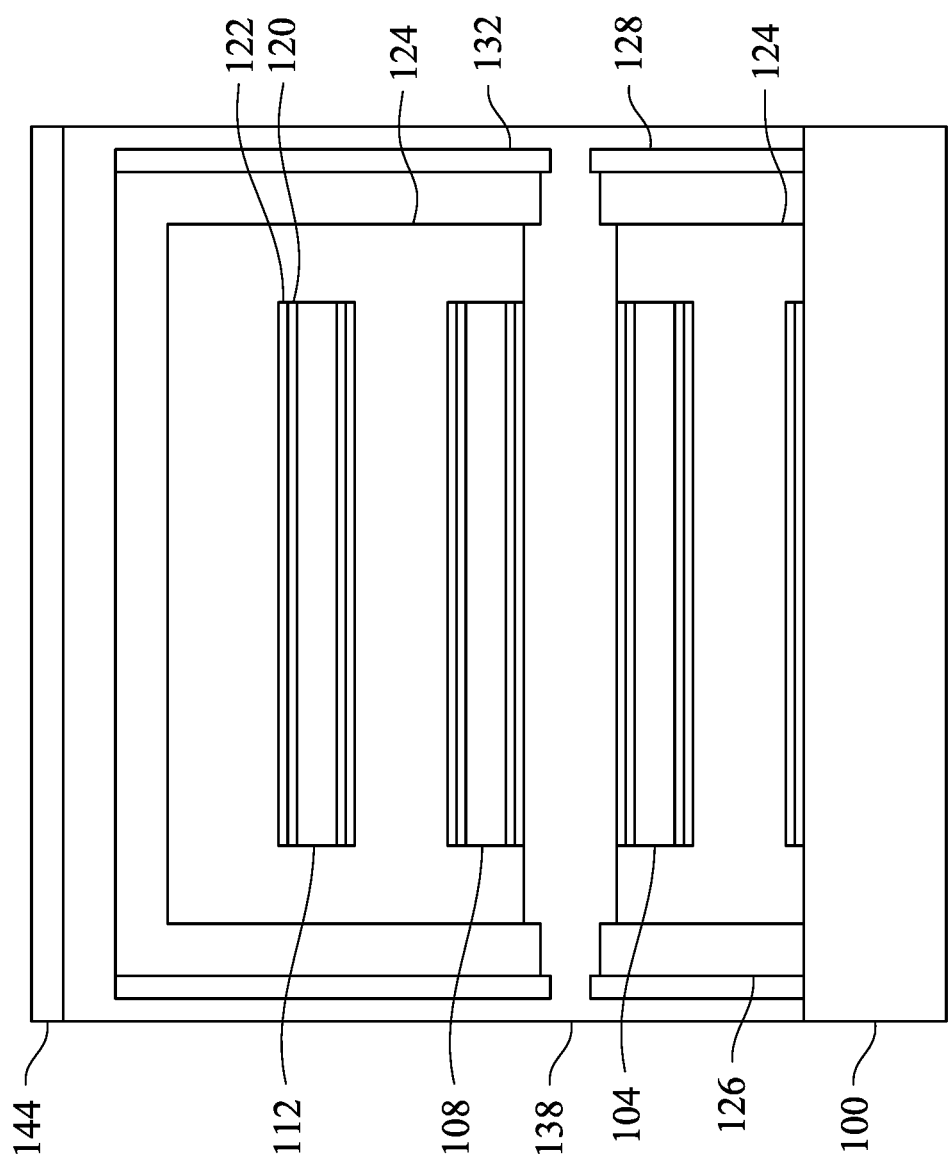

In FIGS. 22A and 22B, the second photoresist 140 is removed and a second isolation layer 144 is formed in the third opening 142, over the substrate 100, over the first mask 128, over the third mask 132, and over the first isolation layer 138. The first isolation material 138 and the second isolation material 144 may collectively be referred to as an isolation structure. The second photoresist 140 may be removed by using suitable photoresist stripping techniques such as chemical solvent cleaning, plasma ashing, dry stripping and/or the like.

The second isolation layer 144 may be formed by conformally depositing one or more layers. In an embodiment, the second isolation layer 144 may be deposited by a conformal deposition process such as CVD, ALD, or the like. The second isolation layer 144 may be formed of a material such as silicon dioxide ($SiO_2$), silicon nitride, porous silicon nitride ($Si_3N_4$), silicon oxynitride, silicon carbon nitride, multiple layers or combinations thereof, or the like. As illustrated in FIGS. 22A and 22B, the second isolation layer 144 may fill the third opening 142 and may extend along top surfaces of the substrate 100 and the first isolation layer 138 and along side surfaces of the first isolation layer 138, the first mask 128, and the third mask 132.

Figure 23A:
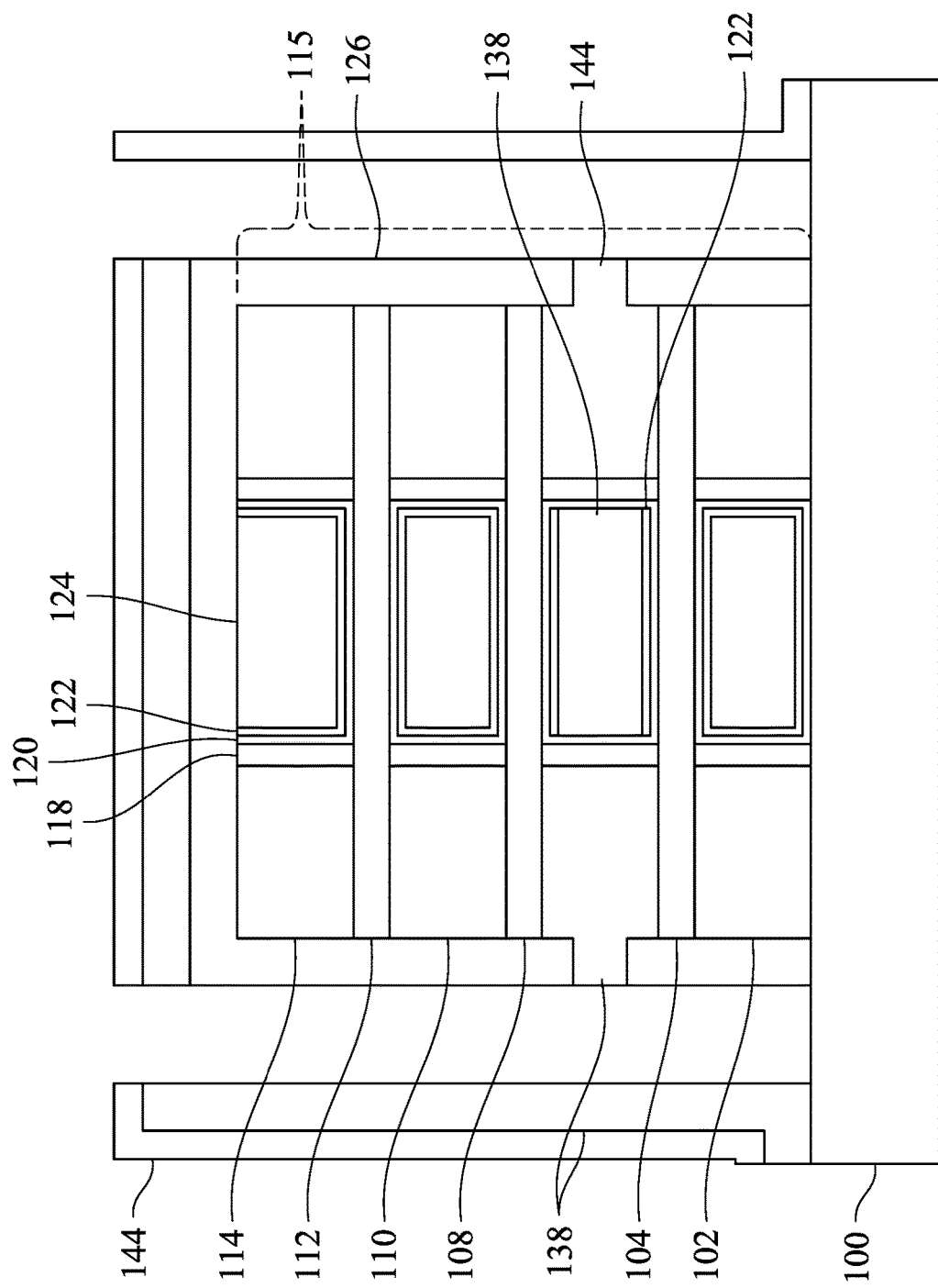
FIGS. 23A-23C illustrate various views of a removal of the first mask, the second mask, the third mask, and portions of the first isolation layer and the second isolation layer, in accordance with some embodiments.
Figure 23B:
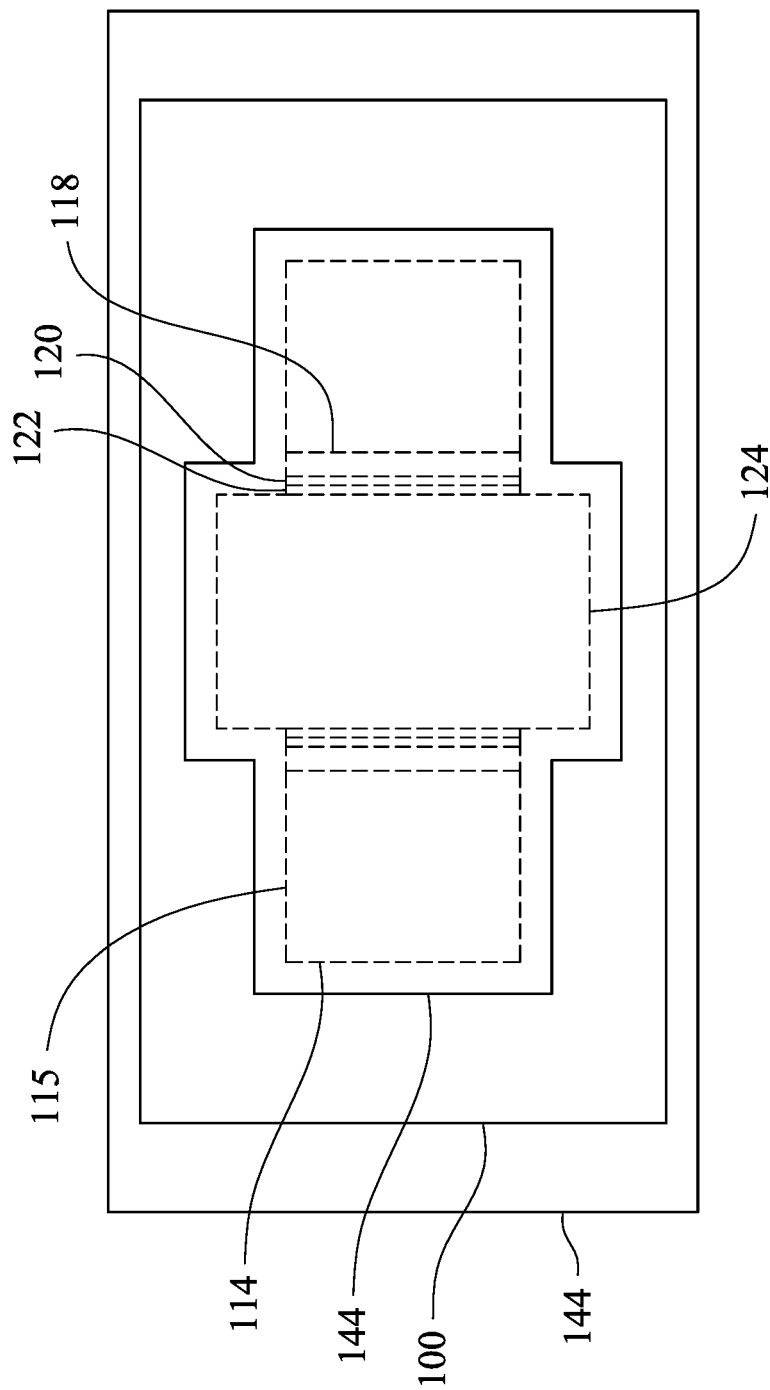
Figure 23C:
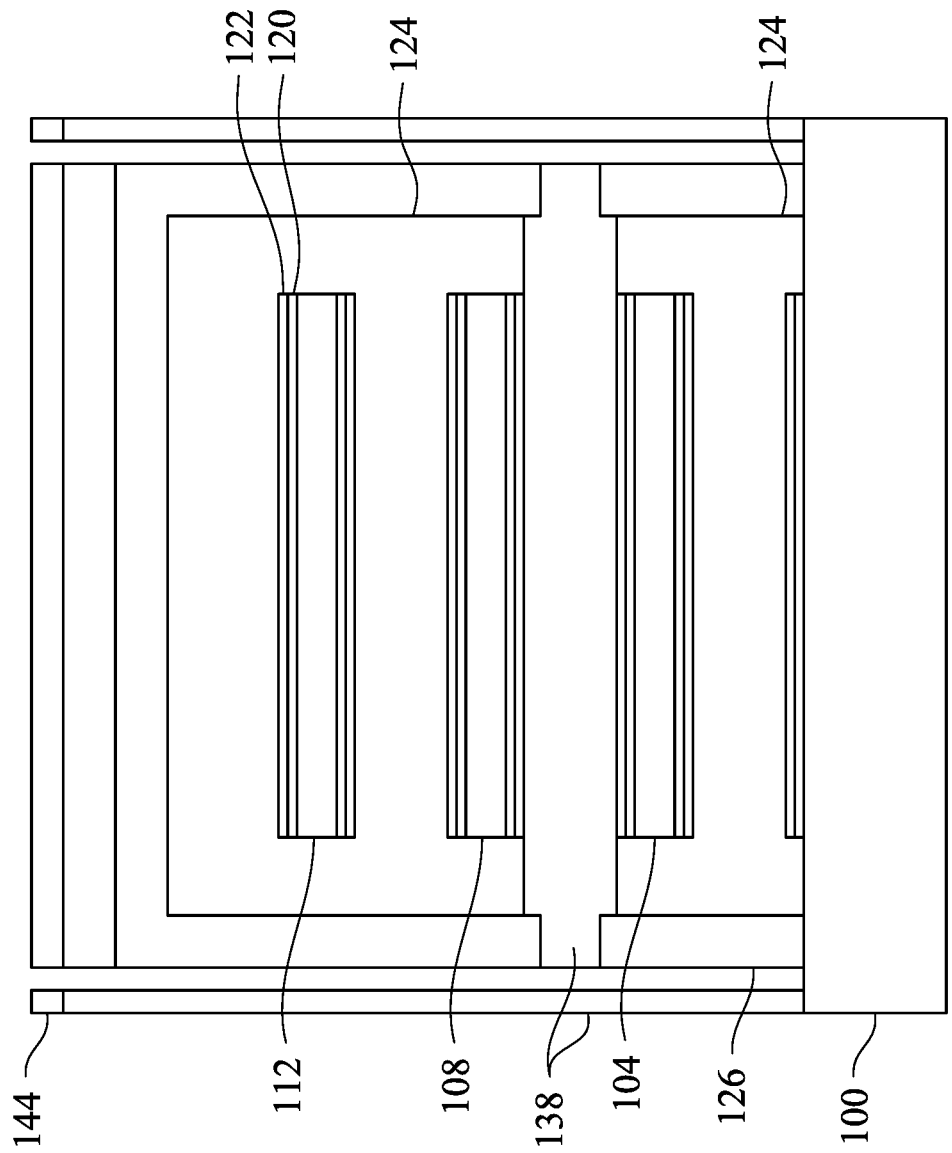

In FIGS. 23A-23C, the first mask 128, the third mask 132, and portions of the first isolation layer 138 and the second isolation layer 144 are removed. The first mask 128, the third mask 132, and the portions of the first isolation layer 138 and the second isolation layer 144 may be removed by depositing a photoresist (not separately illustrated) over the second isolation layer 144, exposing the photoresist to a patterned energy source (e.g. a patterned light source), and developing the photoresist to expose portions of the second isolation layer 144. The portions of the second isolation layer 144, the portions of the first isolation layer 138, the third mask 132, and the first mask 128 may then be etched using the photoresist by an acceptable etch process, such as a wet etch process or a dry etch process. The etch process may be an anisotropic etch process or an isotropic etch process. In some embodiments, the etch process may be a reactive ion etch (RIE), a neutral beam etch (NBE), combinations thereof, or the like. After the etch process is complete, the photoresist may be removed, such as by an acceptable ashing process. As illustrated in FIGS. 23A-23C, in some embodiments, the first mask 128 and the third mask 132 may be completely removed and etching the portions of the second isolation layer 144, the portions of the first isolation layer 138, the third mask 132, and the first mask 128 may expose portions of the substrate 100.

Figure 24A:
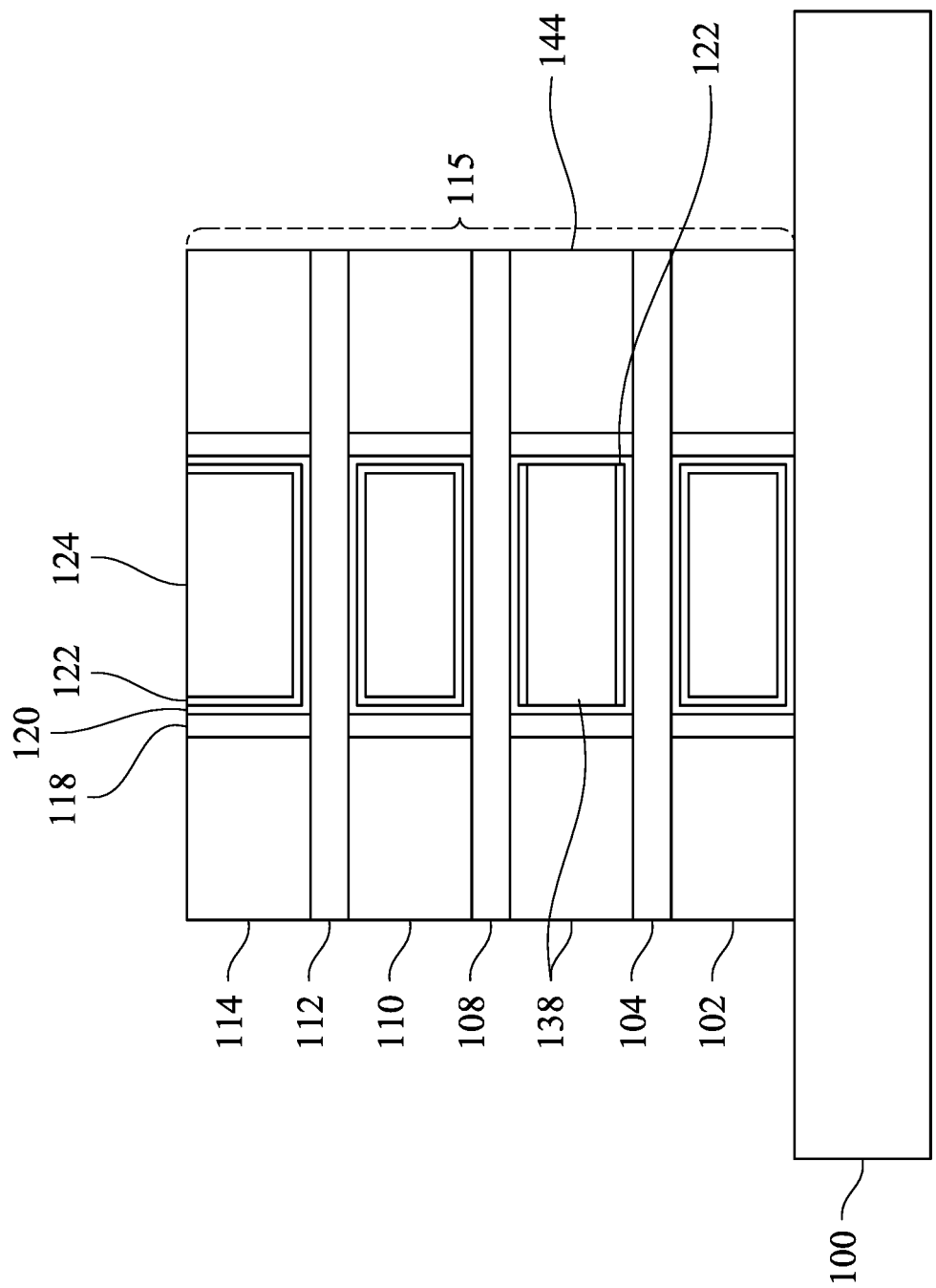
Figure 24C:
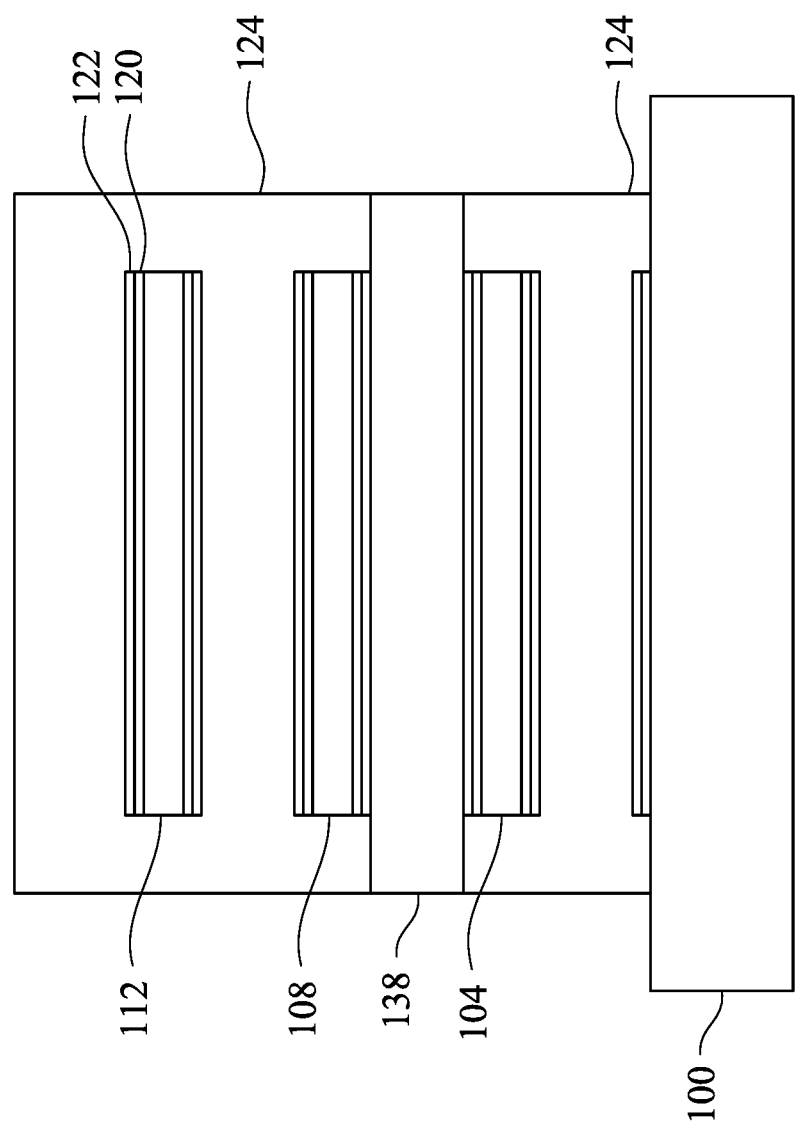

In FIGS. 24A-24C, the protection layer 126 and portions of the first isolation layer 138 and the second isolation layer 144 disposed outside of the fin structure 115 are removed. The protection layer 126 and the portions of the first isolation layer 138 and the second isolation layer 144 disposed outside of the fin structure 115 may be removed by any suitable etch processes, such as isotropic etch processes. In some embodiments, the protection layer 126 and the portions of the first isolation layer 138 and the second isolation layer 144 may be removed by one or more wet etch processes using a solution including hydrofluoric acid (HF), trifluoromethane ($CHF_3$), combinations thereof, or the like.

In FIGS. 25A-28C, first source/drains 146, second source/drains 150, third source/drains 154, a gate contact (comprising a gate isolation layer 160 and a gate contact metal 162), and source/drain contacts (comprising source/drain isolation layers 156 and source/drain contacts 158) are formed. The third buffer layer 110 and the fourth buffer layer 114 may be replaced with a first regrown buffer layer 148 and a second regrown buffer layer 152. A first MOSFET may include the third source/drains 154, the first channel layer 104, and a first gate stack adjacent the first buffer layer 102. A second MOSFET may include the first source/drains 146, a second gate stack adjacent the first regrown buffer layer 148, the second source/drains 150, and a third gate stack adjacent the second regrown buffer layer 152. As such, the second MOSFET may include 2 channels. The first MOSFET may be isolated from the second MOSFET by the isolation structure (comprising the first isolation material 138 and the second isolation material 144).

Figure 25A:
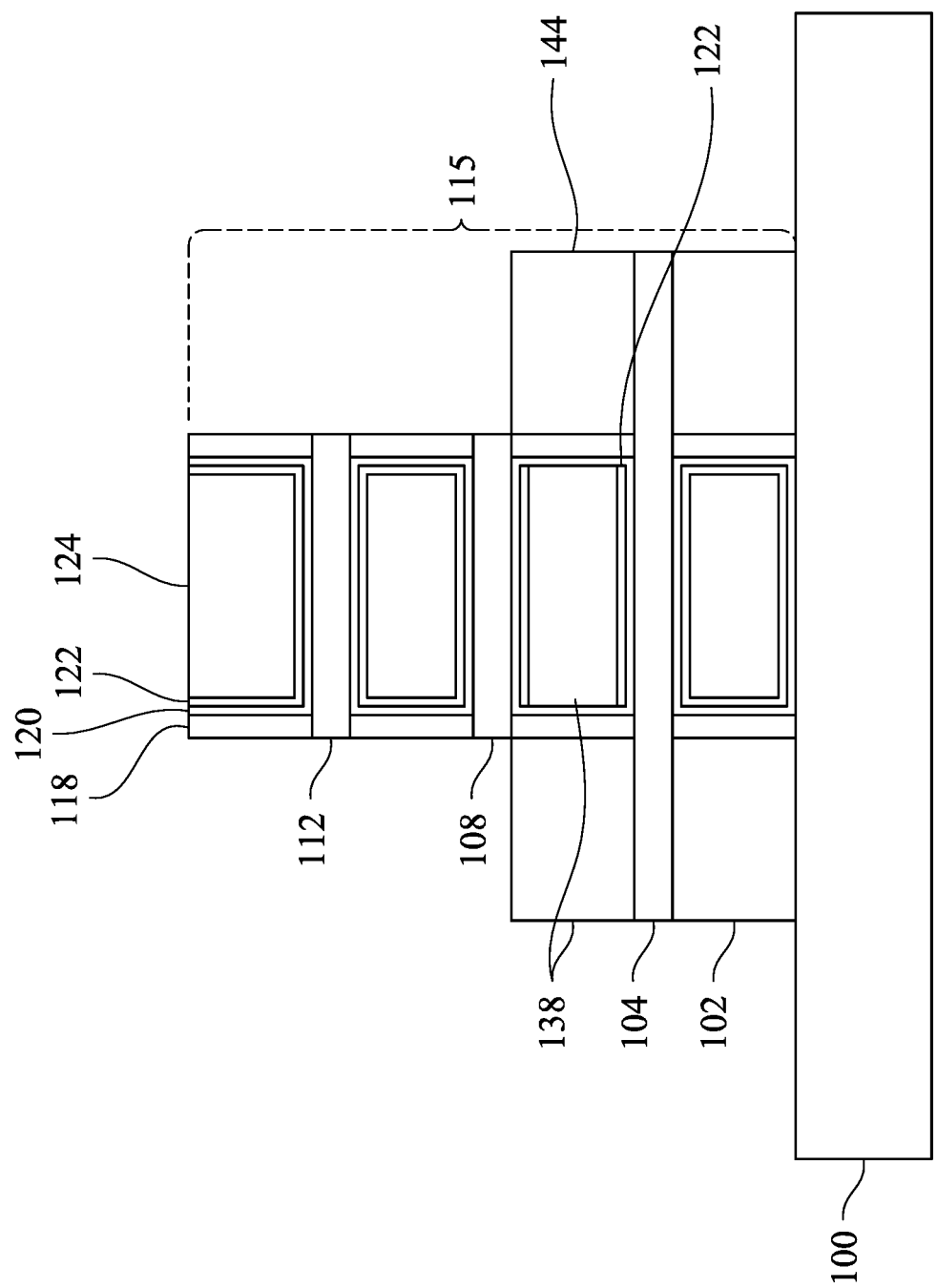
FIGS. 25A and 25B illustrate various views of a removal of the third buffer layer, the fourth buffer layer, and portions of the second channel layer and the third channel layer, in accordance with some embodiments.
Figure 25B:
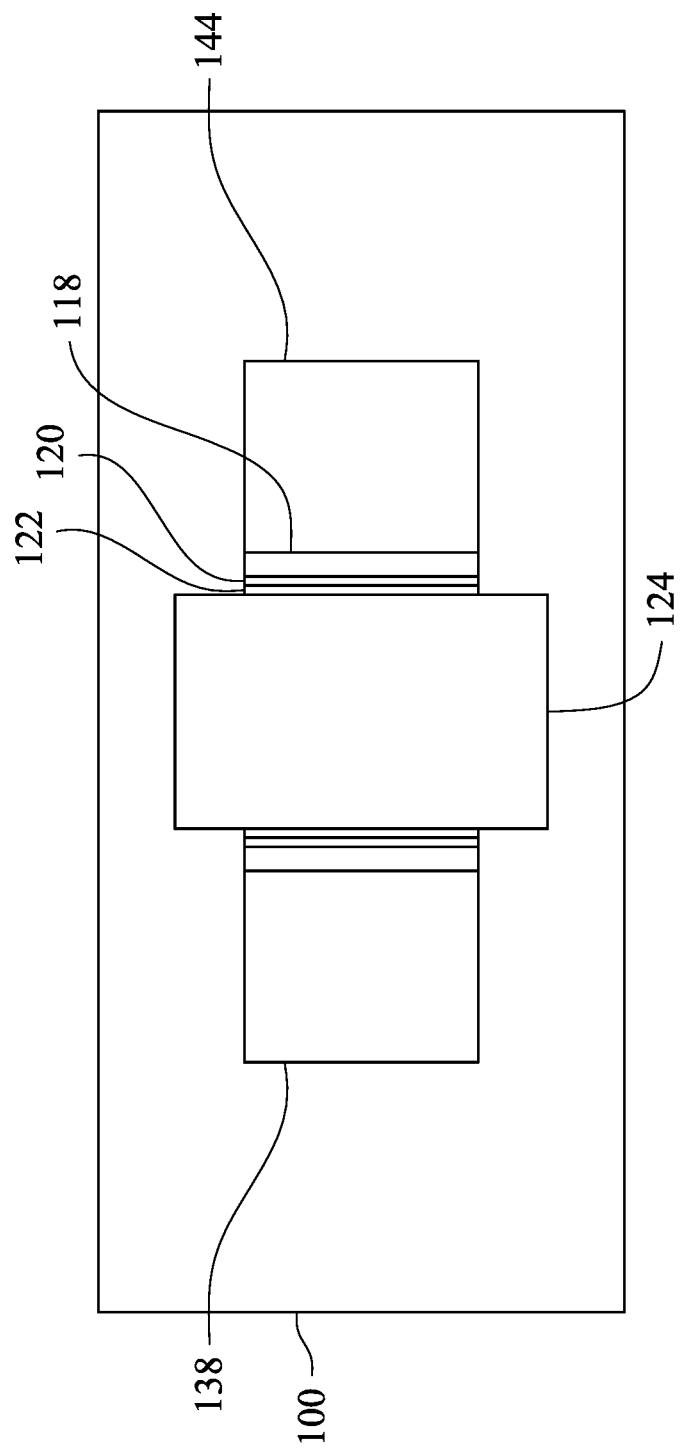

In FIGS. 25A and 25B, the third buffer layer 110, the fourth buffer layer 114, and portions of the second channel layer 108 and the third channel layer 112 are removed. The fourth buffer layer 114, the third buffer layer 110, and the portions of the second channel layer 108 and the third channel layer 112 may be removed by depositing a photoresist (not separately illustrated) over the substrate 100 and the fin structure 115, exposing the photoresist to a patterned energy source (e.g. a patterned light source), and developing the photoresist to expose the fourth buffer layer 114. The fourth buffer layer 114, the third buffer layer 110, and the portions of the second channel layer 108 and the third channel layer 112 are then etched using the photoresist by an acceptable etch process, such as an anisotropic etch process or an isotropic etch process. The etch process may be a wet etch process or a dry etch process. In some embodiments, the etch process may be a reactive ion etch (RIE), a neutral beam etch (NBE), combinations thereof, or the like. After the etch process is complete, the photoresist may be removed, such as by an acceptable ashing process. As illustrated in FIGS. 25A and 25B, the third buffer layer 110 and the fourth buffer layer 114 may be completely removed. FIGS. 25A and 25B further illustrate that portions of the second channel layer 108 and the third channel layer 112 disposed below the third buffer layer 110 and the fourth buffer layer 114 are removed.

Figure 26A:
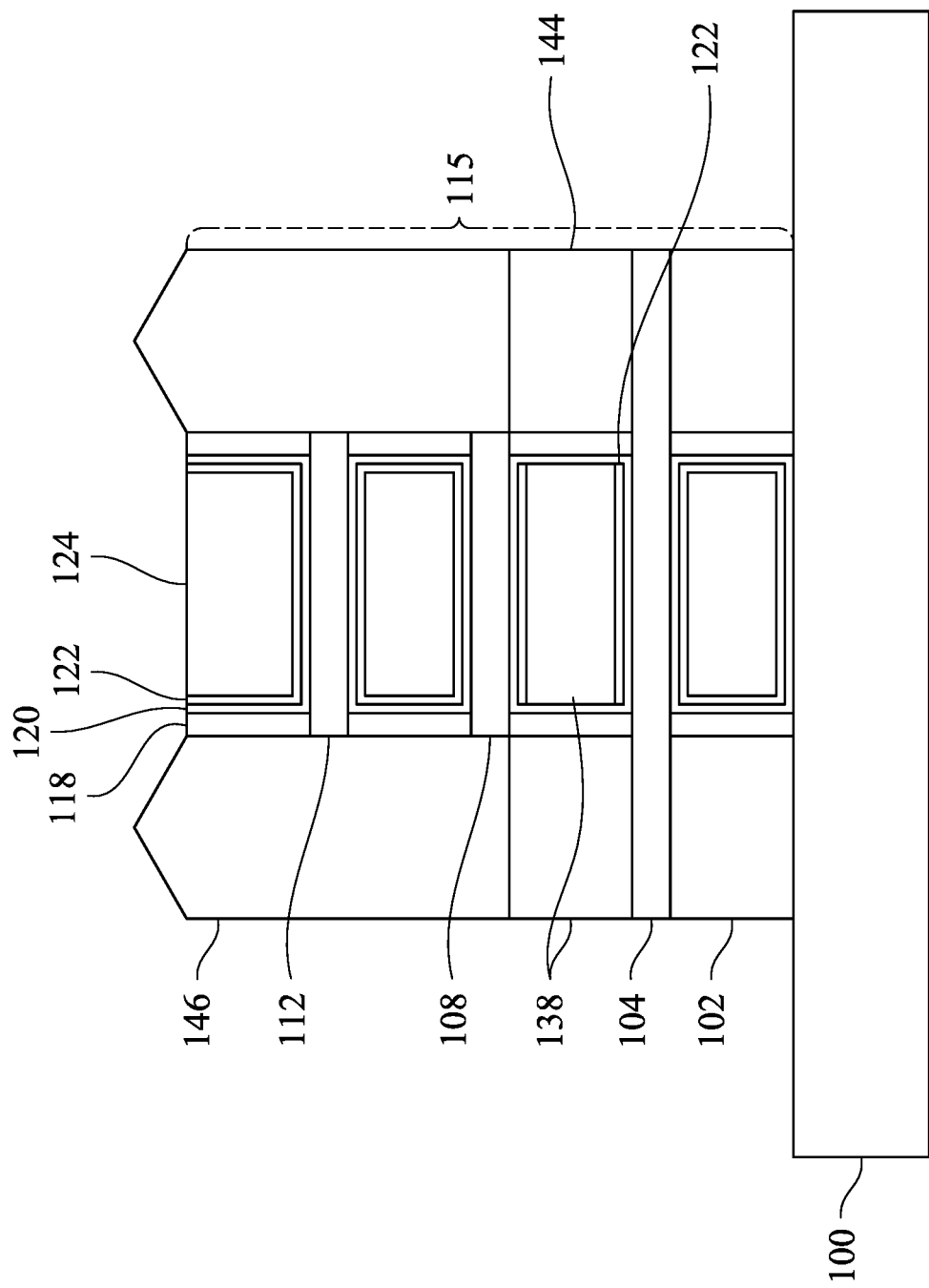
FIGS. 26A and 26B illustrate various views of a formation of a first source/drain, a second source/drain, a first regrown buffer layer, and a second regrown buffer layer, in accordance with some embodiments.
Figure 26B:
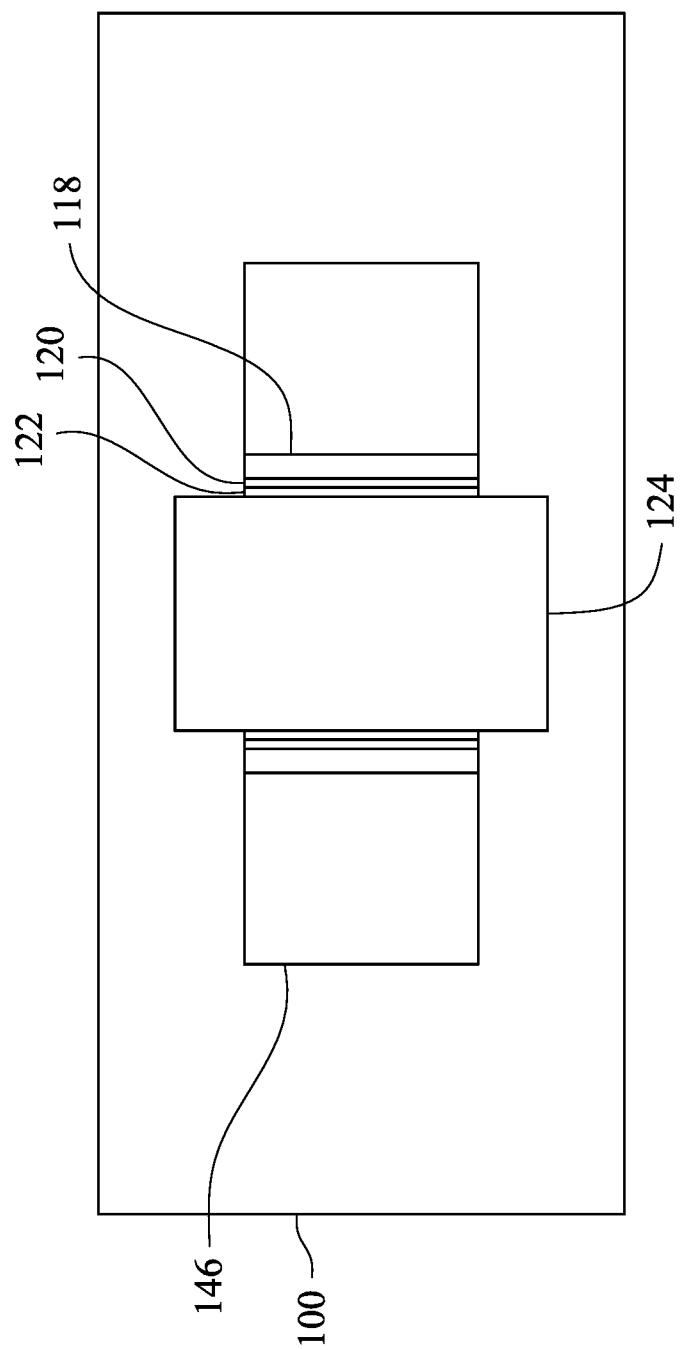

In FIGS. 26A and 26B, first source/drain regions 146 are formed over the first isolation layer 138 and the second isolation layer 144. The first source/drain regions 146 may be formed of a group IV material, such as Si, Ge, SiGe, SiGeSn, Sn or the like; a group III-group V compound material, such as GaAs, GaP, GaAsP, AlInAs, AlGaAs, GaInAs, InAs, GaInP, InP, InSb, GaInAsP or the like; Si:P, combinations thereof, or the like. In specific embodiments, first source/drain regions 146 may be formed of silicon germanium represented by the formula $Si_xGe_y$, wherein x is about 0.6 and y is about 0.4. The first source/drain regions 146 may be doped with dopant ions, such as boron (B) or gallium (Ga).

The first source/drain regions 146 may be grown over the first isolation layer 138 and the second isolation layer 144 by any suitable process, such as epitaxial growth, chemical vapor deposition (CVD), atomic layer deposition (ALD), combinations thereof, or the like. In at least one embodiment, the first source/drain regions 146 may be epitaxially grown from the second channel layer 108 and the third channel layer 112. The deposition processes used to form the first source/drain regions 146 may be followed by various etching steps to remove deposited material from outside of the fin structure 115 to provide selective growth. The substrate 100, the first buffer layer 102, and the first channel layer 104 may be protected by an epitaxial growth protection layer (not separately illustrated) during the deposition of the first source/drain regions 146 to prevent deposition on or etching of the substrate 100, the first buffer layer 102, and the first channel layer 104. The epitaxial growth protection layer may comprise silicon oxide, silicon nitride, or the like. The first source/drain regions 146 may be epitaxially grown horizontally and vertically from the second channel layer 108 and the third channel layer 112 and may include facets corresponding to crystalline planes of the second channel layer 108 and the third channel layer 112. Although only top surfaces of the first source/drain regions 146 are illustrated as being faceted in FIG. 26A, side surfaces of the first source/drain regions 146 may be faceted as well.

Figure 27:
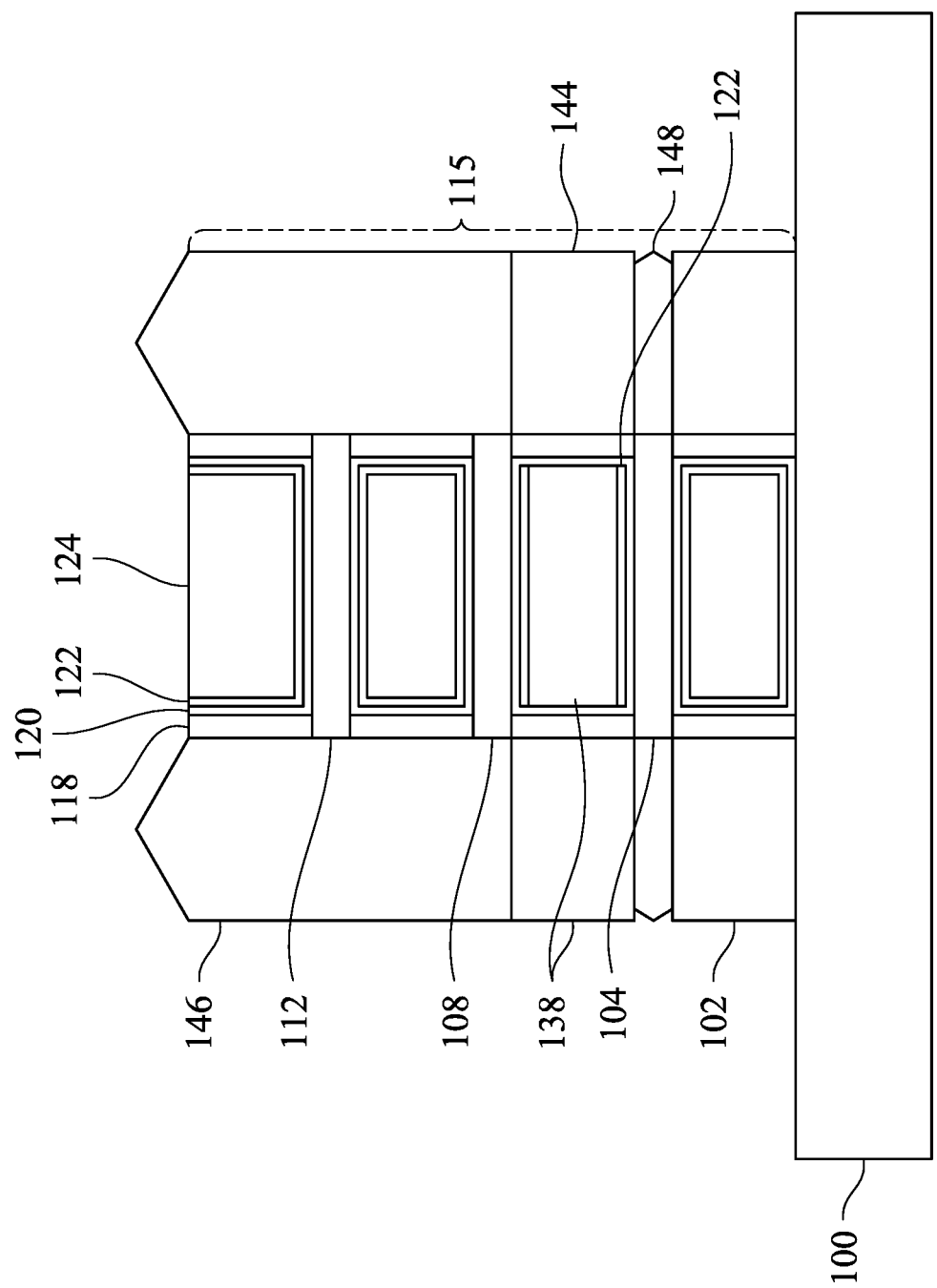
FIG. 27 illustrates a cross-sectional view of a formation of a third source/drain, in accordance with some embodiments.

In FIG. 27, portions of the first channel layer 104 are removed to form an opening (not separately illustrated) and second source/drain regions 148 are formed in the opening. The first channel layer 104 may be removed by depositing a photoresist (not separately illustrated) over the substrate 100 and the fin structure 115, exposing the photoresist to a patterned energy source (e.g. a patterned light source), and developing the photoresist to expose at least portions of the fin structure 115. The substrate 100 may be covered by the photoresist after the photoresist is developed. The first channel layer 104 is then etched using the photoresist by an acceptable etch process, such as an isotropic etch process or an anisotropic etch process. The etch process may be a wet etch process using a solution including potassium hydroxide (KOH), tetramethylammonium hydroxide (TMAH), or the like; an RIE process using a plasma generated from a gas including sulfur hexafluoride ($SF_6$) or the like; or the like. After the etch process is complete, the photoresist may be removed, such as by an acceptable ashing process. As illustrated in FIG. 27, portions of the first channel layer 104 in the gate stack may remain after the etch process and portions of the first channel layer 104 disposed outside of the gate stack may be removed.

The second source/drain regions 148 are then formed in the opening left by removing the portions of the first channel layer 104. The second source/drain regions 148 may be formed of a group IV material, such as Si, Ge, SiGe, SiGeSn, Sn or the like; a group III-group V compound material, such as GaAs, GaP, GaAsP, AlInAs, AlGaAs, GaInAs, InAs, GaInP, InP, InSb, GaInAsP or the like; Si:P, combinations thereof, or the like. In specific embodiments, the second source/drain regions 148 may be formed of Si:P. The second source/drain regions 148 may be grown by any suitable process, such as chemical vapor deposition (CVD), atomic layer deposition (ALD), epitaxial growth, combinations thereof, or the like. The processes used to form the second source/drain regions 148 may be selective such that the second source/drain regions 148 are formed on the first channel layer, without being formed on the substrate 100 or the first source/drain regions 146. In some embodiments, the substrate 100 and the first source/drain regions may be covered by a second epitaxial growth protection layer (not separately illustrated) similar to the epitaxial growth layer while the second source/drain regions 148 are formed. The second source/drain regions 148 may have thicknesses equal to the thickness of the first channel layer 104. The second source/drain regions 148 may be epitaxially grown horizontally and vertically from the first channel layer 104 and may include facets corresponding to crystalline planes of the first channel layer 104.

The steps illustrated in FIGS. 25A-27 are optional and may be omitted in some embodiments. The first source/drain regions 146 and the second source/drain regions 148 may act as stressors for the first channel layer 104, the second channel layer 108, and the third channel layer 112. As such, removing the portions of the first channel layer 104, the second channel layer 108, and the third channel layer 112 as well as the third buffer layer 110 and the fourth buffer layer 114 and forming the first source/drain regions 146 and the second source/drain regions 148 may improve the mobility for the first channel layer 104, the second channel layer 108, and the third channel layer 112 and also reduce the parasitic resistance between the source and drain in each of the source/drain layers (e.g., the first channel layer 104 in combination with the second source/drain regions 148, the second channel layer 108 and the third channel layer 112 in combination with the first source/drain regions 146).

Figure 28A:
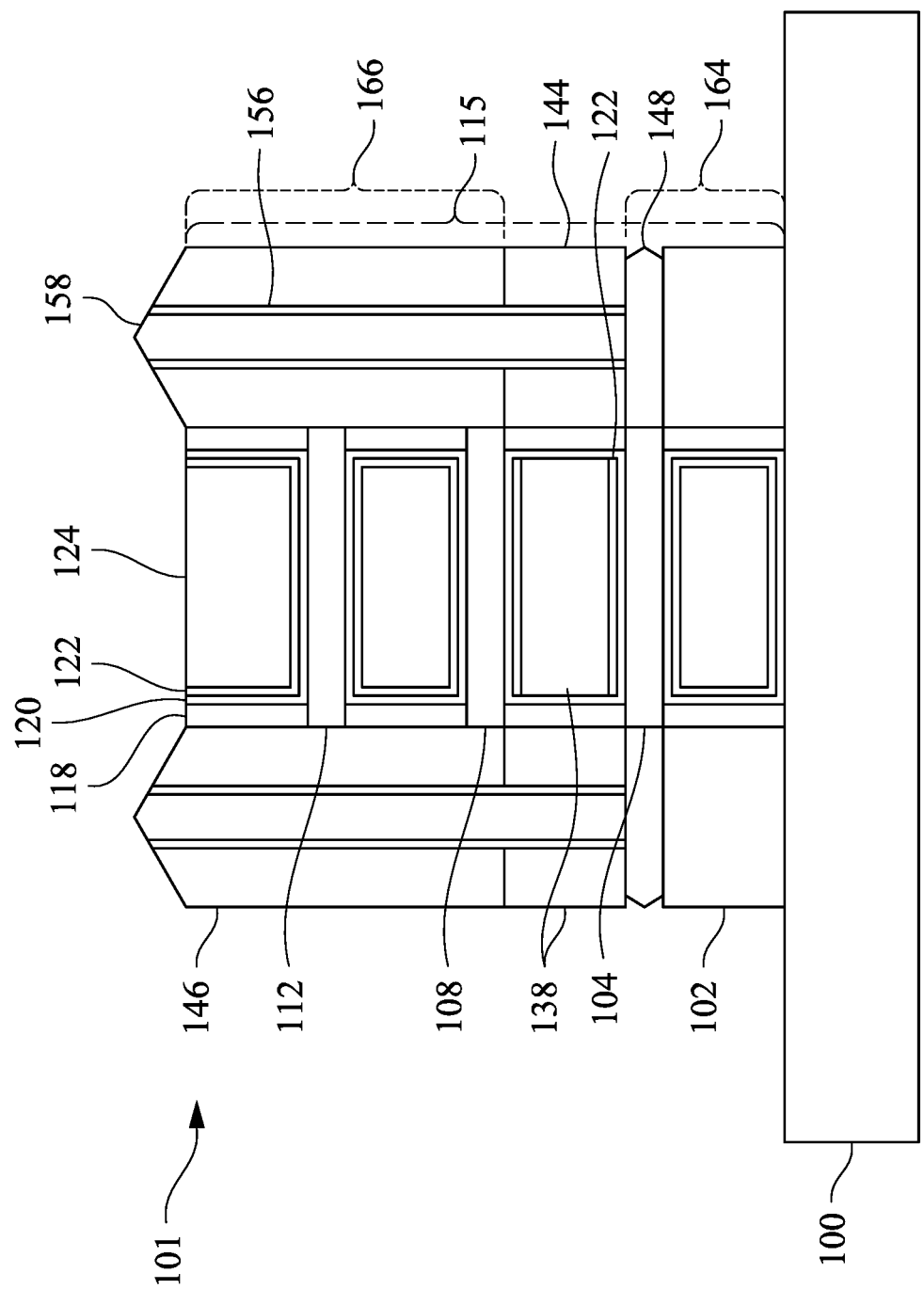
FIGS. 28A-28C illustrate various views of a formation of source/drain contacts and a gate contact, in accordance with some embodiments.
Figure 28B:
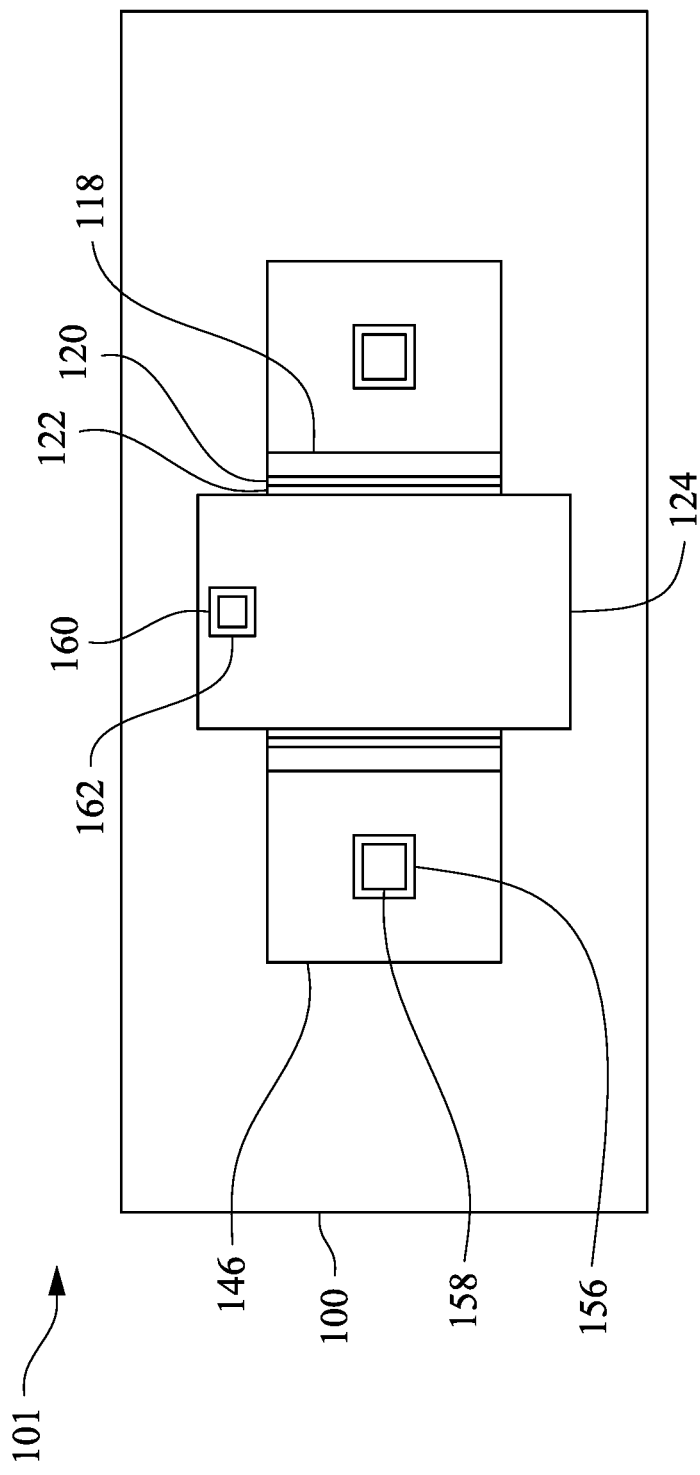
Figure 28C:
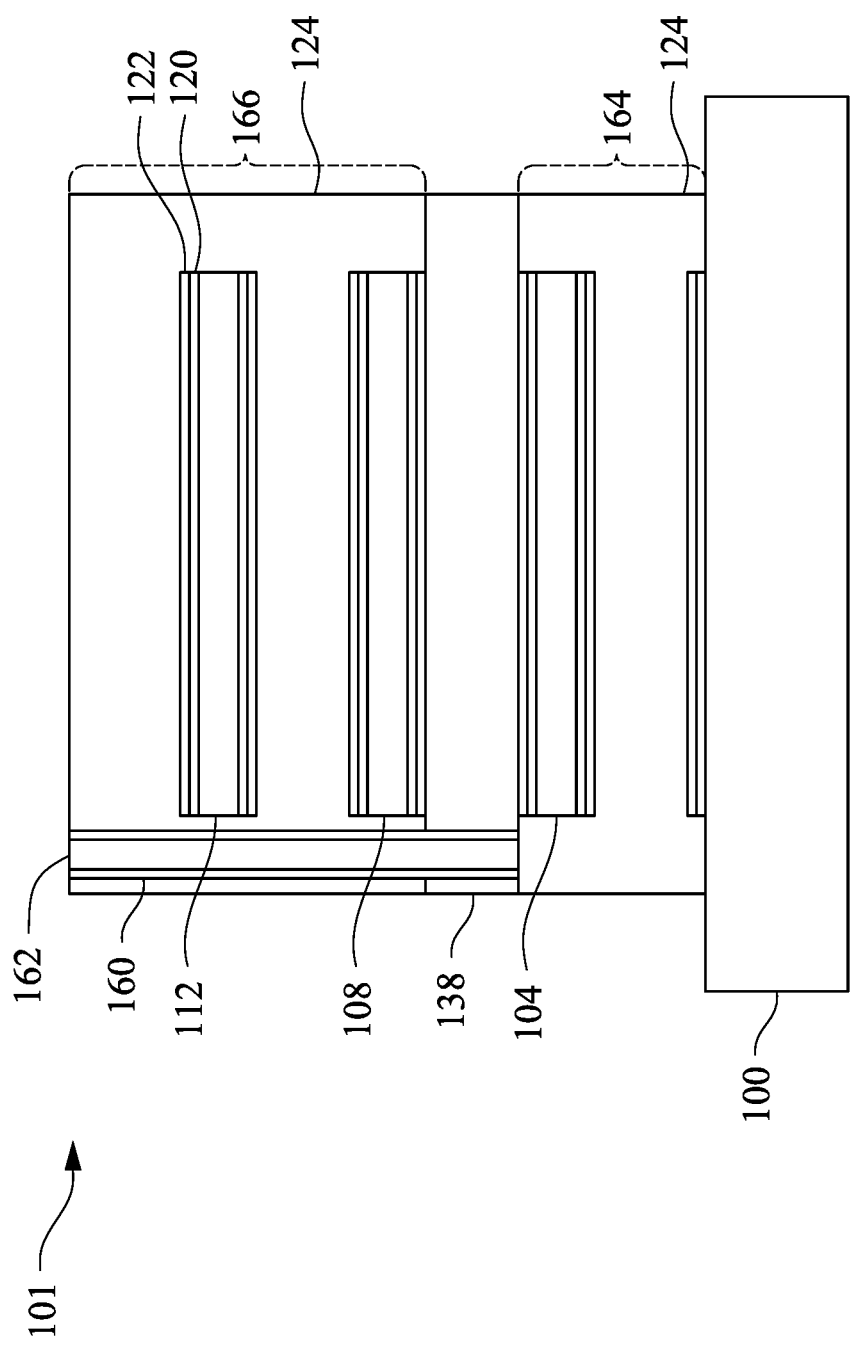

In FIGS. 28A-28C, source/drain isolation layers 156, source/drain contacts 158, a gate isolation layer 160, and a gate contact metal 162 are formed. The source/drain isolation layers 156 and the source/drain contacts 158 may be formed by forming openings (not separately illustrated) extending through the first source/drain regions 146, the first isolation layer 138, and the second isolation layer 144 to expose top surfaces of the second source/drain regions 148. The openings may be formed by depositing a photoresist (not separately illustrated) over the fin structure 115 and the substrate 100, exposing the photoresist to a patterned energy source (e.g. a patterned light source), and developing the photoresist to expose portions of the first source/drain regions 146. Portions of the first source/drain regions 146, the first isolation layer 138, and the second isolation layer 144 may then be etched using the photoresist by an acceptable etch process, such as an anisotropic etch process (e.g., a reactive ion etch (RIE), a neutral beam etch (NBE), combinations thereof, or the like). The second source/drain regions 148 may act as an etch stop layer for the etch process used to form the opening. After the etch process is complete, the photoresist may be removed, such as by an acceptable ashing process.

The source/drain isolation layers 156 are formed by conformally depositing an isolation layer in the opening and anisotropically etching the isolation layer such that uppermost surfaces of the second source/drain regions 154 are exposed. In some embodiments, the source/drain isolation layers 156 may be deposited by CVD, ALD, or the like. The source/drain isolation layers 156 may be formed of a material such as silicon dioxide ($SiO_2$), silicon nitride, porous silicon nitride ($Si_3N_4$), silicon oxynitride, silicon carbon nitride, multiple layers or combinations thereof, or the like.

The source/drain contacts 158 are then formed to fill the openings. The source/drain contacts 158 may be formed by conformally depositing one or more layers and anisotropically etching the one or more layers. In an embodiment, the source/drain contacts 158 may be deposited by a conformal deposition process such as physical vapor deposition (PVD), sputtering, CVD, ALD, or the like. The source/drain contacts 158 may be formed of cobalt (Co), tungsten (W), aluminum (Al), copper (Cu), combinations or alloys thereof, or the like. In some embodiments, a wrap-around contact may be used in place of the source/drain contacts 158.

The gate isolation layer 160 and the gate contact metal 162 may be formed by forming openings (not separately illustrated) extending through the second portion of the metal pad 124 and the first isolation layer 138 to expose top surfaces of the first portion of the metal pad 124. The openings may be formed by depositing a photoresist (not separately illustrated) over the fin structure 115 and the substrate 100, exposing the photoresist to a patterned energy source (e.g. a patterned light source), and developing the photoresist to expose portions of the second portion of the metal pad 124. Portions of the second portion of the metal pad 124 and the first isolation layer 138 may then be etched using the photoresist by an acceptable etch process, such as an anisotropic etch process (e.g., a reactive ion etch (RIE), a neutral beam etch (NBE), combinations thereof, or the like). After the etch process is complete, the photoresist may be removed, such as by an acceptable ashing process.

The gate isolation layer 160 is formed by conformally depositing an isolation layer in the opening and anisotropically etching the isolation layer such that an uppermost surface of the first portion of the metal pad 124 is exposed. In some embodiments, the gate isolation layer 160 may be deposited by CVD, ALD, or the like. The gate isolation layer 160 may be formed of a material such as silicon dioxide ($SiO_2$), silicon nitride, porous silicon nitride ($Si_3N_4$), silicon oxynitride, silicon carbon nitride, multiple layers or combinations thereof, or the like.

The gate contact metal 162 is then formed to fill the openings. The gate contact metal 162 may be formed by conformally depositing one or more layers and anisotropically etching the one or more layers. In an embodiment, the gate contact metal 162 may be deposited by a conformal deposition process such as physical vapor deposition (PVD), sputtering, CVD, ALD, or the like. The gate contact metal 162 may be formed of cobalt (Co), tungsten (W), aluminum (Al), copper (Cu), combinations or alloys thereof, or the like. In some embodiments, a wrap-around contact may be used in place of the gate contact metal 162.

As illustrated in FIGS. 28A and 28C, the stacked MOSFET structure 101 formed according to the above-described embodiments may include a first MOSFET 164 (including the first portion of the metal pad 124, the first channel layer 104, and the second source/drain regions 148) and a second MOSFET 166 (including the second portion of the metal pad 124, the second channel layer 108, the third channel layer 112, and the first source/drain regions 146), which are isolated from one another by the first isolation layer 138 and the second isolation layer 144. The first isolation layer 138 and the second isolation layer 144 separating the first MOSFET 164 from the second MOSFET 166 enables the first MOSFET 164 and the second MOSFET 166 to be vertically independent and the first isolation layer 138 and the second isolation layer 144 separating the first portion of the metal pad 124 and the second portion of the metal pad 124 enables independent gate operation. The first MOSFET 164 may include one channel (e.g., the first channel layer 104) and the second MOSFET 166 may include multiple channels (e.g., the second channel layer 108 and the third channel layer 112. In various other embodiments, the stacked MOSFET structure 101 may include any number of channels. Moreover, in various embodiments, the stacked MOSFET structure 101 may include any number of isolation layers and the isolation layers may be arbitrarily defined at any given layer of the stacked MOSFET structure 101.

In addition, the stacked MOSFET structure 101 according to the above-described embodiments may include multiple transistors or devices formed within the same footprint. Further, the distance of interconnects formed between transistors or devices in the stacked MOSFET structure 101 may be minimized. The embodiments described above allow for device-level stacking of transistors in the stacked MOSFET structure 101.

In accordance with an embodiment, a method includes depositing a first buffer layer over a substrate; depositing a first channel layer over the first buffer layer; depositing a second buffer layer over the first channel layer; depositing a second channel layer over the second buffer layer; depositing a third buffer layer over the second channel layer; etching the first buffer layer, the first channel layer, the second buffer layer, the second channel layer, and the third buffer layer to form a fin structure; etching the first buffer layer, the second buffer layer, and the third buffer layer to form a first plurality of openings; forming a first gate stack in the first opening disposed in the first buffer layer, a second gate stack in the first opening disposed in the second buffer layer, and a third gate stack in the first opening disposed in the third buffer layer; and replacing the second buffer layer and a portion of the second gate stack with an isolation structure. In an embodiment, forming the first gate stack, the second gate stack, and the third gate stack includes depositing a gate spacer in each of the first openings; depositing a gate insulator on each of the gate spacers; depositing a gate electrode on each of the gate insulators; and depositing a metal pad on each of the gate electrodes, the metal pad filling remaining portions of the first openings. In an embodiment, the first gate stack includes portions of the gate spacer, the gate insulator, and the gate electrode disposed in the first buffer layer and a first portion of the metal pad, the second gate stack includes portions of the gate spacer, the gate insulator, and the gate electrode disposed in the second buffer layer and a second portion of the metal pad, and the third gate stack includes portions of the gate spacer, the gate insulator, and the gate electrode disposed in the third buffer layer and a third portion of the metal pad. In an embodiment, replacing the second buffer layer and the portion of the second gate stack includes etching a first portion of the second buffer layer disposed on a first side of the second gate stack to form a second opening; etching a portion of the gate electrode of the second gate stack and the second portion of the metal pad to enlarge the second opening; depositing a first isolation material in the second opening; etching a second portion of the second buffer layer disposed on a second side of the second gate stack opposite the first side to form a third opening; and depositing a second isolation material in the third opening, the isolation structure including the first isolation material and the second isolation material. In an embodiment, the gate spacer, the gate insulator, the gate electrode, and the metal pad are deposited by atomic layer deposition (ALD). In an embodiment, the method further includes etching at least a portion of the first channel layer to form a fourth opening; and epitaxially growing first source/drain regions in the fourth opening, the first source/drain regions being disposed on opposite sides of the first channel layer. In an embodiment, the method further includes etching at least a portion of the third buffer layer and at least a portion of the second channel layer to form a fifth opening; and depositing second source/drain regions on the isolation structure in the fifth opening, the second source/drain regions being disposed on opposite sides of the second channel layer and the third gate stack.

In accordance with another embodiment, a semiconductor device includes a first MOSFET over a substrate, the first MOSFET including a first gate stack; a first buffer layer, the first buffer layer being disposed on opposite sides of the first gate stack; and a first channel layer over the first gate stack and the first buffer layer; a residual gate stack over the first channel layer, the residual gate stack including a first insulator over the first channel layer; a first conductive material on an upper surface and a lower surface of the first insulator;

and first spacers on opposite sidewalls of the first insulator; an isolation structure over the first channel layer, the isolation structure including a first dielectric extending between sidewalls of the first insulator, the first dielectric extending between an upper surface of the first conductive material and a lower surface of the first conductive material; a second dielectric material on a first sidewall of the first spacers, the second dielectric material being disposed on the first channel layer; and a third dielectric material on a second sidewall of the first spacers opposite the first sidewall of the first spacers, the third dielectric material being disposed on the first channel layer; and a second MOSFET over the isolation structure and the residual gate stack, the second MOSFET including a second channel layer; and a second gate stack disposed over the second channel layer. In an embodiment, the second MOSFET further includes a third channel layer over the second gate stack and the second buffer layer; a third gate stack disposed over the third channel layer; and a third buffer layer disposed over the third channel layer, the third buffer layer being disposed on opposite sides of the third gate stack. In an embodiment, the first gate stack includes a first gate spacer, a first gate insulator on the first gate spacer, a first gate electrode on the first gate insulator, and a first metal pad on the first gate electrode; the first gate spacer, the first gate insulator, the first gate electrode, and the first metal pad being concentric; the second gate stack includes a second gate spacer, a second gate insulator on the second gate spacer, a second gate electrode on the second gate insulator, and a first portion of a second metal pad on the second gate electrode; the second gate spacer, the second gate insulator, the second gate electrode, and the first portion of the second metal pad being concentric; and the third gate stack includes a third gate spacer, a third gate insulator on the third gate spacer, a third gate electrode on the third gate insulator, and a second portion of the second metal pad on the third gate electrode; the third gate spacer, the third gate insulator, the third gate electrode, and the second portion of the second metal pad being concentric. In an embodiment, the first metal pad is isolated from the second metal pad by the isolation structure. In an embodiment, the semiconductor device further includes a first gate contact, the first gate contact extending through the second metal pad and the isolation structure, the first gate contact being coupled to the first metal pad, the first gate contact being isolated from the second metal pad. In an embodiment, the semiconductor device further includes first source/drain regions, the first source/drain regions being disposed on opposite sides of the first channel layer, the first source/drain regions extending between the first buffer layer and the isolation structure; and second source/drain regions, the second source/drain regions being disposed on opposite sides of the second channel layer. In an embodiment, the semiconductor device further includes a first source/drain contact, the first source/drain contact extending through one of the second source/drain regions and the isolation structure, the first source/drain contact being coupled to one of the first source/drain regions, the first source/drain contact being isolated from the one of the second source/drain regions.

In accordance with yet another embodiment, a method includes forming a fin structure over a substrate, forming the fin structure including forming a first buffer layer over the substrate; forming a first channel layer over the first buffer layer; forming a second buffer layer over the first channel layer; forming a second channel layer over the second buffer layer; forming a third buffer layer over the second channel layer; and etching the third buffer layer, the second channel layer, the second buffer layer, the first channel layer, and the first buffer layer to form the fin structure; forming a mask structure over the substrate, the mask structure surrounding the fin structure, forming the mask structure including forming a first mask over the substrate; forming a second mask over the first mask; and forming a third mask over the second mask; etching a portion of the second mask to form a first opening exposing a sidewall of the second buffer layer; and etching a portion of the second buffer layer to form a second opening in the second buffer layer, the portion of the second buffer layer being etched through the first opening, the first mask and the third mask protecting the first buffer layer and the third buffer layer, respectively, while etching the portion of the second buffer layer. In an embodiment, the method further includes etching the first buffer layer, the second buffer layer, and the third buffer layer to form a plurality of third openings; depositing a gate spacer in each of the third openings; depositing a gate insulator on each of the gate spacers; depositing a gate electrode on each of the gate insulators; and depositing a metal pad on the gate electrodes, a first gate stack including the gate spacer, the gate insulator, and the gate electrode disposed in the first buffer layer and a first portion of the metal pad, a second gate stack including the gate spacer, the gate insulator, and the gate electrode disposed in the second buffer layer and a second portion of the metal pad, and a third gate stack including the gate spacer, the gate insulator, and the gate electrode disposed in the third buffer layer and a third portion of the metal pad. In an embodiment, the method further includes forming a fourth gate stack in the second buffer layer, the fourth gate stack including a second gate spacer, a second gate insulator on the second gate spacer, a second gate electrode on the second gate insulator, and a second metal pad on the second gate electrode; and etching the second gate electrode and the second metal pad to form an enlarged second opening, the second gate electrode and the second metal pad being etched through the first opening. In an embodiment, the method further includes depositing a first isolation material in the first opening and the enlarged second opening. In an embodiment, the method further includes after depositing the first isolation material, etching a remaining portion of the second mask to form a fourth opening exposing a sidewall of the second buffer layer; and etching a remaining portion of the second buffer layer to form a fifth opening, the remaining portion of the second buffer layer being etched through the fourth opening, the first mask and the third mask protecting the first buffer layer and the third buffer layer, respectively, while etching the remaining portion of the second buffer layer. In an embodiment, the method further includes depositing a second isolation material in the fifth opening and the fourth opening, an isolation structure including the first isolation material and the second isolation material, a first MOSFET including the first channel layer, a second MOSFET including the second channel layer, and the first MOSFET being isolated from the second MOSFET by the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a first buffer layer over a substrate;
   depositing a first channel layer over the first buffer layer;
   depositing a second buffer layer over the first channel layer;
   depositing a second channel layer over the second buffer layer;
   depositing a third buffer layer over the second channel layer;
   etching the first buffer layer, the first channel layer, the second buffer layer, the second channel layer, and the third buffer layer to form a fin structure;
   etching the first buffer layer, the second buffer layer, and the third buffer layer to form a first plurality of openings;
   forming a first gate stack in the first opening disposed in the first buffer layer, a second gate stack in the first opening disposed in the second buffer layer, and a third gate stack in the first opening disposed in the third buffer layer; and
   replacing the second buffer layer and a portion of the second gate stack with an isolation structure.

2. The method of claim 1, wherein forming the first gate stack, the second gate stack, and the third gate stack comprises:
   depositing a gate spacer in each of the first openings;
   depositing a gate insulator on each of the gate spacers;
   depositing a gate electrode on each of the gate insulators; and
   depositing a metal pad on each of the gate electrodes, the metal pad filling remaining portions of the first openings.

3. The method of claim 2, wherein the first gate stack comprises portions of the gate spacer, the gate insulator, and the gate electrode disposed in the first buffer layer and a first portion of the metal pad, wherein the second gate stack comprises portions of the gate spacer, the gate insulator, and the gate electrode disposed in the second buffer layer and a second portion of the metal pad, and wherein the third gate stack comprises portions of the gate spacer, the gate insulator, and the gate electrode disposed in the third buffer layer and a third portion of the metal pad.

4. The method of claim 2, wherein replacing the second buffer layer and the portion of the second gate stack comprises:
   etching a first portion of the second buffer layer disposed on a first side of the second gate stack to form a second opening;
   etching a portion of the gate electrode of the second gate stack and the second portion of the metal pad to enlarge the second opening;
   depositing a first isolation material in the second opening;
   etching a second portion of the second buffer layer disposed on a second side of the second gate stack opposite the first side to form a third opening; and
   depositing a second isolation material in the third opening, wherein the isolation structure comprises the first isolation material and the second isolation material.

5. The method of claim 2, wherein the gate spacer, the gate insulator, the gate electrode, and the metal pad are deposited by atomic layer deposition (ALD).

6. The method of claim 1, further comprising:
   etching at least a portion of the first channel layer to form a fourth opening; and
   epitaxially growing first source/drain regions in the fourth opening, the first source/drain regions being disposed on opposite sides of the first channel layer.

7. The method of claim 1, further comprising:
   etching at least a portion of the third buffer layer and at least a portion of the second channel layer to form a fifth opening; and
   depositing second source/drain regions on the isolation structure in the fifth opening, the second source/drain regions being disposed on opposite sides of the second channel layer and the third gate stack.

8. A method comprising:
   forming a fin structure over a substrate, wherein forming the fin structure comprises:
      forming a first buffer layer over the substrate;
      forming a first channel layer over the first buffer layer;
      forming a second buffer layer over the first channel layer;
      forming a second channel layer over the second buffer layer;
      forming a third buffer layer over the second channel layer; and
      etching the third buffer layer, the second channel layer, the second buffer layer, the first channel layer, and the first buffer layer to form the fin structure;
   forming a mask structure over the substrate, the mask structure surrounding the fin structure, wherein forming the mask structure comprises:
      forming a first mask over the substrate;
      forming a second mask over the first mask; and
      forming a third mask over the second mask;
   etching a portion of the second mask to form a first opening exposing a sidewall of the second buffer layer; and
   etching a portion of the second buffer layer to form a second opening in the second buffer layer, wherein the portion of the second buffer layer is etched through the first opening, wherein the first mask and the third mask protect the first buffer layer and the third buffer layer, respectively, while etching the portion of the second buffer layer.

9. The method of claim 8, further comprising:
   etching the first buffer layer, the second buffer layer, and the third buffer layer to form a plurality of third openings;
   depositing a gate spacer in each of the third openings;
   depositing a gate insulator on each of the gate spacers;
   depositing a gate electrode on each of the gate insulators; and
   depositing a metal pad on the gate electrodes, wherein a first gate stack comprises the gate spacer, the gate insulator, and the gate electrode disposed in the first buffer layer and a first portion of the metal pad, wherein a second gate stack comprises the gate spacer, the gate insulator, and the gate electrode disposed in the second buffer layer and a second portion of the metal pad, and wherein a third gate stack comprises the gate spacer, the gate insulator, and the gate electrode disposed in the third buffer layer and a third portion of the metal pad.

10. The method of claim 8, further comprising:
    forming a fourth gate stack in the second buffer layer, the fourth gate stack comprising a second gate spacer, a second gate insulator on the second gate spacer, a second gate electrode on the second gate insulator, and a second metal pad on the second gate electrode; and etching the second gate electrode and the second metal pad to form an enlarged second opening, wherein the second gate electrode and the second metal pad are etched through the first opening.

11. The method of claim 10, further comprising depositing a first isolation material in the first opening and the enlarged second opening.

12. The method of claim 11, further comprising:
after depositing the first isolation material, etching a remaining portion of the second mask to form a fourth opening exposing a sidewall of the second buffer layer; and etching a remaining portion of the second buffer layer to form a fifth opening, wherein the remaining portion of the second buffer layer is etched through the fourth opening, wherein the first mask and the third mask protect the first buffer layer and the third buffer layer, respectively, while etching the remaining portion of the second buffer layer.

13. The method of claim 12, further comprising depositing a second isolation material in the fifth opening and the fourth opening, wherein an isolation structure comprises the first isolation material and the second isolation material, wherein a first MOSFET comprises the first channel layer, wherein a second MOSFET comprises the second channel layer, and wherein the first MOSFET is isolated from the second MOSFET by the isolation structure.

14. A method comprising:
depositing a first buffer layer over a semiconductor substrate;
depositing a first channel layer over the first buffer layer;
depositing a second buffer layer over the first channel layer;
depositing a second channel layer over the second buffer layer;
depositing a third buffer layer over the second channel layer;
replacing a portion of the first buffer layer with a first gate stack, a portion of the second buffer layer with a dummy gate stack, and a portion of the third buffer layer with a second gate stack;
replacing the second buffer layer on a first side of the dummy gate stack with a first isolation layer; and
replacing a portion of the dummy gate stack and the second buffer layer on a second side of the dummy gate stack with a second isolation layer, wherein the portion of the dummy gate stack comprises a metal pad and a portion of a gate electrode.

15. The method of claim 14, further comprising:
depositing a third channel layer over the third buffer layer;
depositing a fourth buffer layer over the third channel layer; and
replacing a portion of the fourth buffer layer with a third gate stack.

16. The method of claim 14, wherein replacing the portion of the first buffer layer with the first gate stack, the portion of the second buffer layer with the dummy gate stack, and the portion of the third buffer layer with the second gate stack comprises:
etching the first buffer layer, the second buffer layer, and the third buffer layer to form a first opening, a second opening, and a third opening respectively;
depositing gate spacers in the first opening, the second opening, and the third opening;
depositing gate insulators over the gate spacers;
depositing gate electrodes over the gate insulators; and
depositing metal pads filling the first opening, the second opening, and the third opening.

17. The method of claim 16, further comprising etching the metal pads to form a first metal pad and a second metal pad disconnected from the first metal pad, the first gate stack comprising the first metal pad, and the second gate stack comprising the second metal pad.

18. The method of claim 17, wherein the second isolation layer is deposited between and the first metal pad and the second metal pad, and wherein the second isolation layer electrically isolates the first metal pad from the second metal pad.

19. The method of claim 18, further comprising:
forming a fourth opening extending through the second metal pad and the second isolation layer to expose the first metal pad; and
forming a first gate contact in the fourth opening, the first gate contact being electrically coupled to the first metal pad and electrically isolated from the second metal pad.

20. The method of claim 14, further comprising replacing portions of the first channel layer with first source/drain regions, the first source/drain regions comprising a semiconductor material different from a semiconductor material of remaining portions of the first channel layer.

* * * * *